(12) United States Patent
Jennings et al.

(10) Patent No.: US 12,343,653 B2
(45) Date of Patent: Jul. 1, 2025

(54) THREE-DIMENSIONAL MAGNETIC BLOCK SYSTEM AND METHOD

(71) Applicants: Pamela L. Jennings, Washington, DC (US); Alan Bengtson, Atlanta, GA (US); Elias Bachaalany, Halat (LB); Imad Maalouf, El Metn (LB)

(72) Inventors: Pamela L. Jennings, Washington, DC (US); Alan Bengtson, Atlanta, GA (US); Elias Bachaalany, Halat (LB); Imad Maalouf, El Metn (LB)

( * ) Notice: Subject to any disclaimer, the term of this patent is extended or adjusted under 35 U.S.C. 154(b) by 203 days.

(21) Appl. No.: 18/105,868

(22) Filed: Feb. 5, 2023

(65) Prior Publication Data

US 2024/0261696 A1    Aug. 8, 2024

(51) Int. Cl.
*A63H 33/06*   (2006.01)
*G01R 33/00*   (2006.01)

(52) U.S. Cl.
CPC ......... *A63H 33/06* (2013.01); *G01R 33/0005* (2013.01); *A63H 2200/00* (2013.01)

(58) Field of Classification Search
CPC ......................... A63H 33/04–14; A63H 33/046
See application file for complete search history.

(56) References Cited

U.S. PATENT DOCUMENTS

| | | | |
|---|---|---|---|
| 2,570,625 A | 10/1951 | Zimmerman et al. | |
| 2,795,893 A | 6/1957 | Vayo | |
| 3,184,882 A | 5/1965 | Vega | |
| 4,238,905 A * | 12/1980 | MacGraw, II | A63H 33/046 446/92 |
| 5,349,129 A * | 9/1994 | Wisniewski | G10H 1/32 84/718 |
| 5,823,782 A * | 10/1998 | Marcus | G09B 7/04 434/335 |
| 5,991,693 A | 11/1999 | Zalewski | |
| 6,062,937 A * | 5/2000 | Kikuchi | A63H 33/042 446/92 |
| 6,443,796 B1 * | 9/2002 | Shackelford | A63H 33/086 273/237 |
| 6,679,780 B1 | 1/2004 | Shih | |
| 7,636,794 B2 | 12/2009 | Ramos et al. | |

(Continued)

OTHER PUBLICATIONS

Jennings. P. L., & Antonio, C. M. D. (2010). Construct; VizM: A Framework for Rendering Tangible constructions.

(Continued)

*Primary Examiner* — Eugene L Kim
*Assistant Examiner* — Matthew B Stanczak

(57) ABSTRACT

Disclosed are methods and systems of blocks with magnets, magnetically-attractive non-magnetic elements, and magnetic detectors. The methods and systems facilitate user attachment and detachment of the blocks to each other and detection of which face of which block is attached to which face of which other block, and in what orientation. The blocks can be comprised of multiple regular convex polyhedra, such as tetrahedrons, cubes, octahedra, dodecahedra, or icosahedra. The faces of the blocks could be equilateral triangles, squares, or regular pentagons. The methods and systems can further comprise a selection pen and system software configured to render the blocks and their attachment to each other on a display.

20 Claims, 29 Drawing Sheets

(56) References Cited

U.S. PATENT DOCUMENTS

| | | | | |
|---|---|---|---|---|
| 7,846,002 | B1* | 12/2010 | Mikesell | A63H 33/042 446/92 |
| 7,963,818 | B2* | 6/2011 | Fullerton | A63H 33/046 446/93 |
| 8,187,006 | B2* | 5/2012 | Rudisill | H01R 11/30 362/249.06 |
| 9,014,616 | B2 | 4/2015 | Roots et al. | |
| 9,108,114 | B2* | 8/2015 | Goh | G06F 3/002 |
| 9,472,112 | B2 | 10/2016 | Schweikardt et al. | |
| 9,713,777 | B2 | 7/2017 | Peterson | |
| 9,914,066 | B2 | 3/2018 | Cletheroe et al. | |
| 10,047,940 | B2* | 8/2018 | Grunzweig | F21S 2/00 |
| 10,195,538 | B2* | 2/2019 | Madsen | A63F 3/04 |
| 10,293,268 | B2* | 5/2019 | Hirata | A63F 13/25 |
| 10,304,353 | B1* | 5/2019 | Lozano | G06F 8/34 |
| 10,890,897 | B2* | 1/2021 | Denayer | A63H 33/042 |
| 11,007,450 | B2 | 5/2021 | Rothschild | |
| 11,030,912 | B2* | 6/2021 | Al-Khalifa | A63F 9/1204 |
| 11,103,801 | B2 | 8/2021 | Vincentelli | |
| 11,213,747 | B2* | 1/2022 | Mangharam | G06T 19/20 |
| 11,253,790 | B2* | 2/2022 | Watanabe | A63F 13/20 |
| 11,498,014 | B1* | 11/2022 | Aalund | A63H 33/26 |
| 11,541,322 | B1* | 1/2023 | Aalund | G09B 1/325 |
| 11,772,003 | B2* | 10/2023 | Kokhan | A63H 5/00 446/91 |
| 11,919,162 | B2* | 3/2024 | He | B25J 9/08 |
| 11,920,749 | B2* | 3/2024 | Poon (Pan) | F21V 23/06 |
| 12,142,963 | B2* | 11/2024 | Tsui | H02J 9/062 |
| 2002/0160340 | A1* | 10/2002 | Marcus | G09B 7/04 434/156 |
| 2002/0196250 | A1* | 12/2002 | Anderson | A63H 33/042 345/420 |
| 2003/0148700 | A1* | 8/2003 | Arlinsky | G09B 1/40 446/91 |
| 2004/0063078 | A1* | 4/2004 | Marcus | G09B 7/00 434/167 |
| 2009/0197658 | A1* | 8/2009 | Polchin | A63F 13/245 463/9 |
| 2009/0273560 | A1 | 11/2009 | Kalanithi et al. | |
| 2010/0001923 | A1* | 1/2010 | Zilber | A63F 3/00643 345/1.1 |
| 2012/0122059 | A1* | 5/2012 | Schweikardt | G09B 23/00 434/118 |
| 2012/0258436 | A1 | 10/2012 | Lee | |
| 2013/0109267 | A1* | 5/2013 | Schweikardt | A63H 33/046 446/85 |
| 2013/0163234 | A1* | 6/2013 | Hsien | F21V 21/005 362/249.02 |
| 2013/0302763 | A1 | 11/2013 | Edwards et al. | |
| 2014/0213140 | A1* | 7/2014 | Goh | A63H 3/28 446/175 |
| 2014/0342834 | A1* | 11/2014 | Tappeiner | A63F 13/00 463/42 |
| 2014/0349544 | A1* | 11/2014 | Chien | A63H 33/042 446/91 |
| 2015/0065007 | A1* | 3/2015 | Klepper | A63H 33/046 446/92 |
| 2016/0339351 | A1* | 11/2016 | Akishbekov | A63H 33/086 |
| 2017/0023219 | A1* | 1/2017 | Grunzweig | A63H 33/046 |
| 2017/0128853 | A1* | 5/2017 | Kokhan | A63H 33/042 |
| 2017/0136380 | A1* | 5/2017 | Creedican | A63H 33/06 |
| 2017/0173486 | A1* | 6/2017 | Rothschild | G06V 10/75 |
| 2017/0252664 | A1* | 9/2017 | Cletheroe | A63H 33/046 |
| 2018/0065058 | A1* | 3/2018 | LaCrosse | A63F 13/80 |
| 2018/0211550 | A1* | 7/2018 | Bellamy | G09B 19/00 |
| 2018/0229142 | A1* | 8/2018 | Brandwijk | A63H 33/103 |
| 2018/0290068 | A1* | 10/2018 | Moody | A63H 33/042 |
| 2018/0353871 | A1* | 12/2018 | Oschuetz | B25J 9/08 |
| 2019/0299113 | A1* | 10/2019 | Lee | A63H 33/086 |
| 2019/0378424 | A1* | 12/2019 | Chen | A63F 13/215 |
| 2020/0206646 | A1* | 7/2020 | Zeng | A63H 33/08 |
| 2020/0376402 | A1* | 12/2020 | Wellejus | G06F 13/20 |
| 2022/0023767 | A1* | 1/2022 | Gaba | A63H 30/02 |
| 2022/0047961 | A1* | 2/2022 | Yin | A63H 30/04 |
| 2022/0247218 | A1* | 8/2022 | Knights | A63H 33/086 |
| 2022/0318177 | A1* | 10/2022 | Yi | G06F 15/173 |
| 2024/0261696 | A1* | 8/2024 | Jennings | A63H 33/046 |

OTHER PUBLICATIONS

Jennings, P. L. (2009). A Theoretical Construct of Serious Play and the Design of a Tangible Social Interface. In Shared Encounters (pp. 153-172). Springer, London.

Pamela Jennings and Paul Cunningham. (2008). Interactivity: constructed narratives. In CHI '08 Extended Abstracts on Human Factors in Computing Systems (CHI EA '08). Association for Computing Machinery, New York, NY, USA. 2287-2290.

Pamela Jennings. (2005). Tangible social interfaces: critical theory, boundary objects and interdisciplinary design methods. In Proceedings of the 5th conference on Creativity & Cognition (C&C '05). Association for Computing Machinery, New York, NY, USA, 176-186.

Pamela Jennings (2004) Reflections on interdisciplinary team development for the design of a platform for computer supported collaborative play, Digital Creativity, 15:4, 209-222.

Merrill. D., Kalanithi, J., & Maes, P. (2007). Siftables: towards sensor network user interfaces. In Proceedings of the 1st international conference on Tangible and embedded interaction (pp. 75-78).

Schweikardt, E., & Gross, M. D. (2006), roBlocks: a robotic construction kit for mathematics and science education. In Proceedings of the 8th international conference on Multimodal interfaces (pp. 72-75).

Watanabe, R., Itoh, Y., Asai, M., Kitamura, Y., Kishino, F., & Kikuchi, H. (2004). The soul of ActiveCube: implementing a flexible, multimodal, three-dimensional spatial tangible interface. Computers in Entertainment (CIE), 2(4), 15-15.

Newton-Dunn, H., Nakano, H., & Gibson, J. (2003). Block jam: a tangible interface for interactive music. Journal of New Music Research, 32(4), 383-393.

Anderson, D., Frankel, J. L., Marks, J., Agarwala, A., Beardsley, P., Hodgins, J., . . . & Yedidia, J. S. (2000). Tangible interaction+graphical interpretation: a new approach to 3D modeling. In Proceedings of the 27th annual conference on Computer graphics and interactive techniques (pp. 393-402).

Gorbet, M. G., & Orth, M. (1997). Triangles: Design of a physical/digital construction kit. In Proceedings of the 2nd conference on Designing interactive systems: processes, practices, methods, and techniques (pp. 125-128).

Frazer, J. (1995). An Evolutionary Architecture. London: Architectural Association Publications.

* cited by examiner

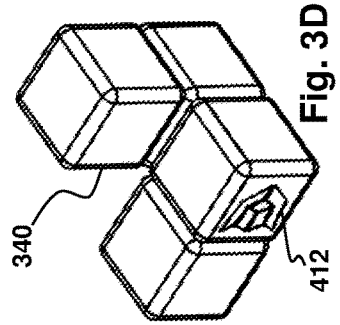
Fig. 3D
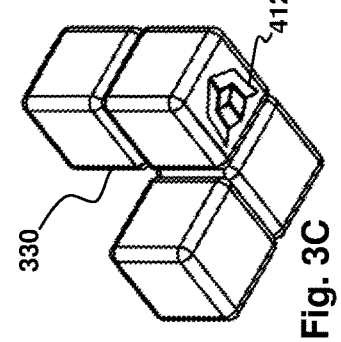
Fig. 3C
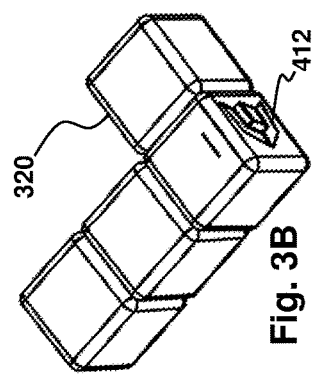
Fig. 3B
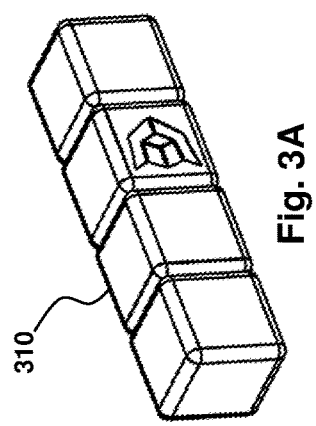
Fig. 3A
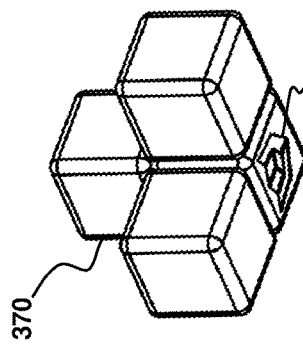
Fig. 3H
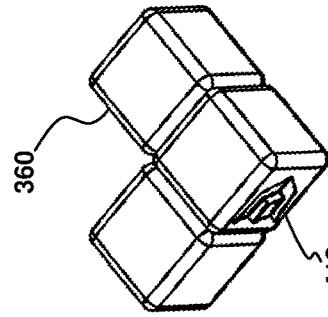
Fig. 3G
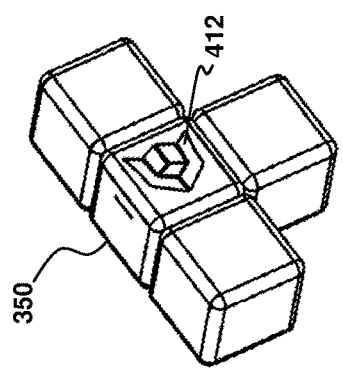
Fig. 3E · Fig. 3F
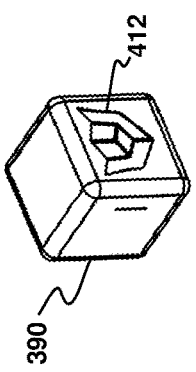
Fig. 3I

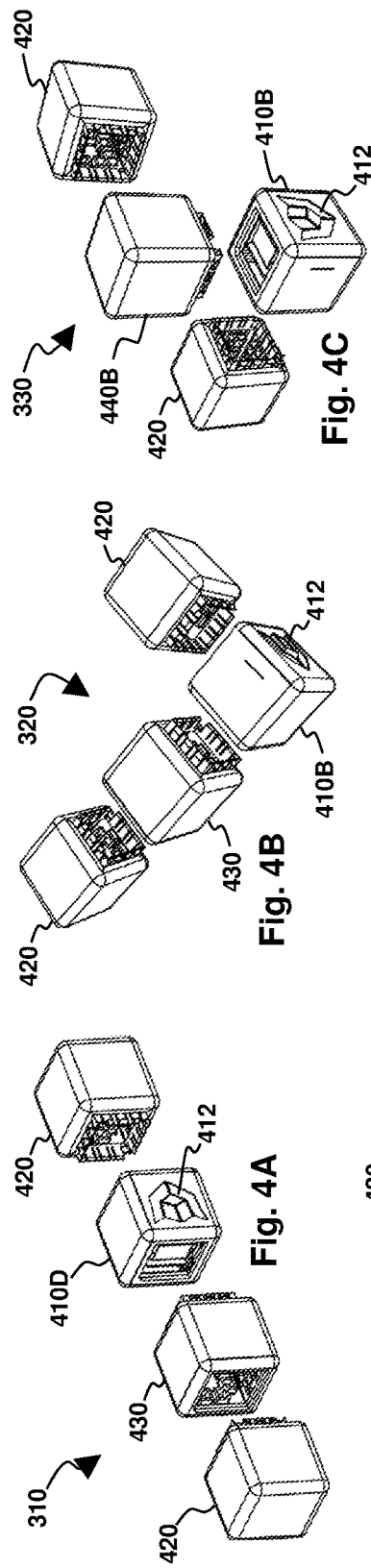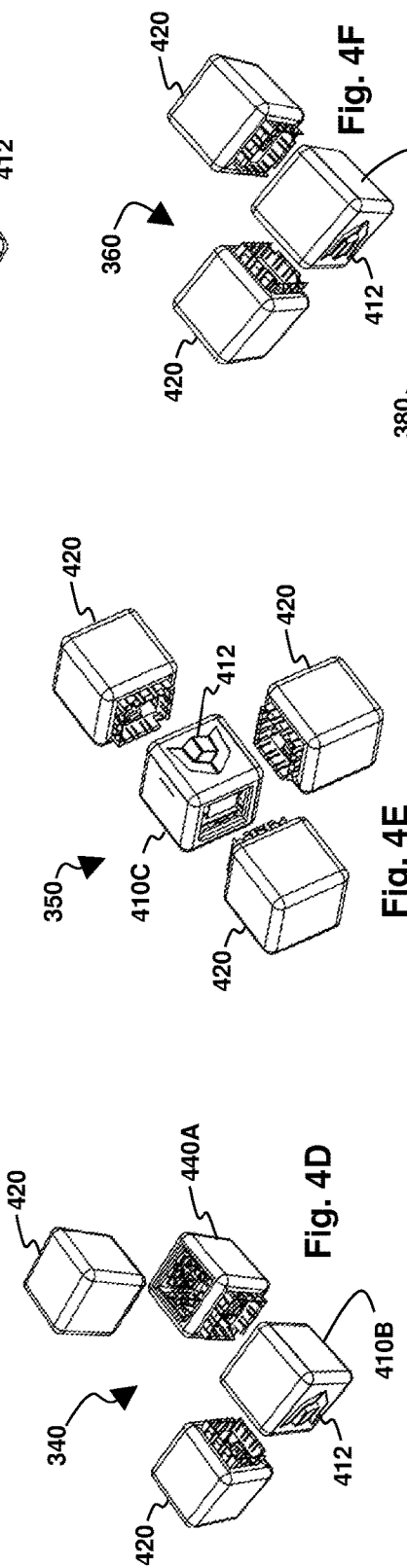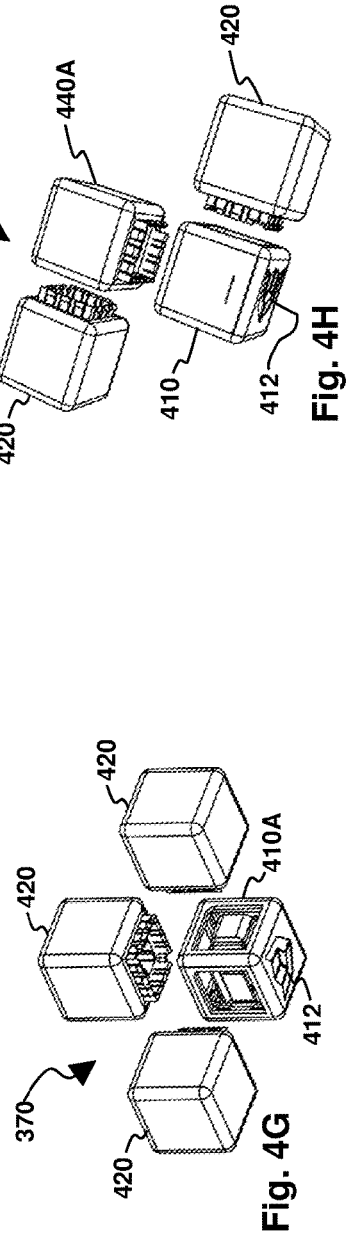

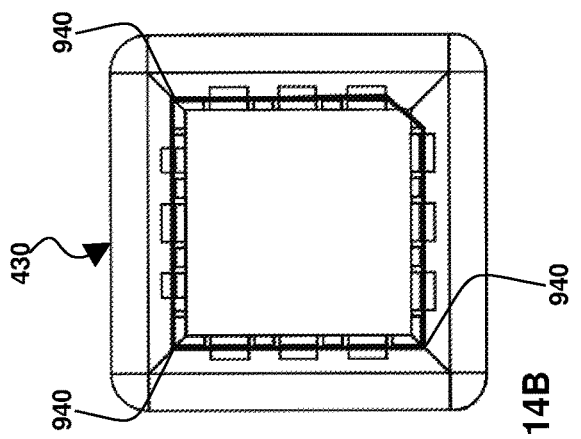
Fig. 14B
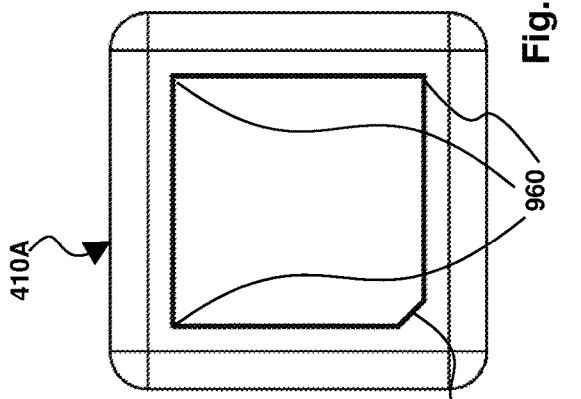
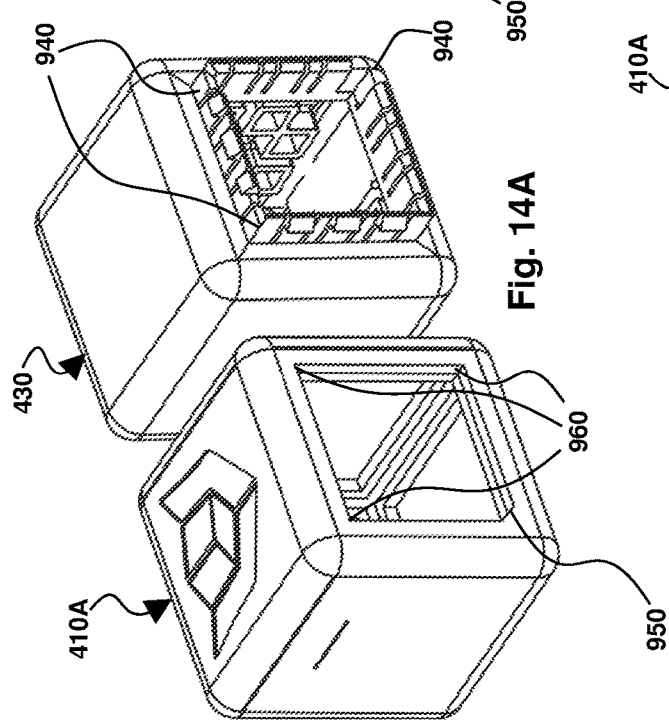
Fig. 14A
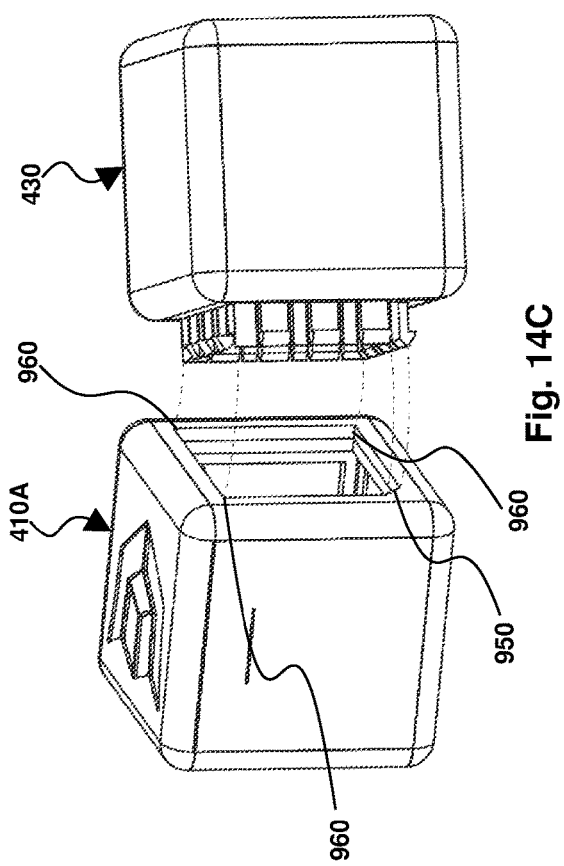
Fig. 14C

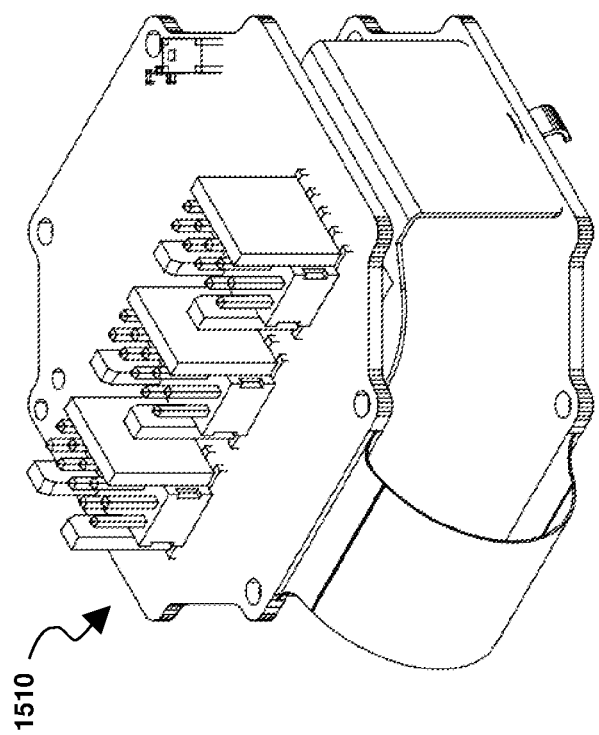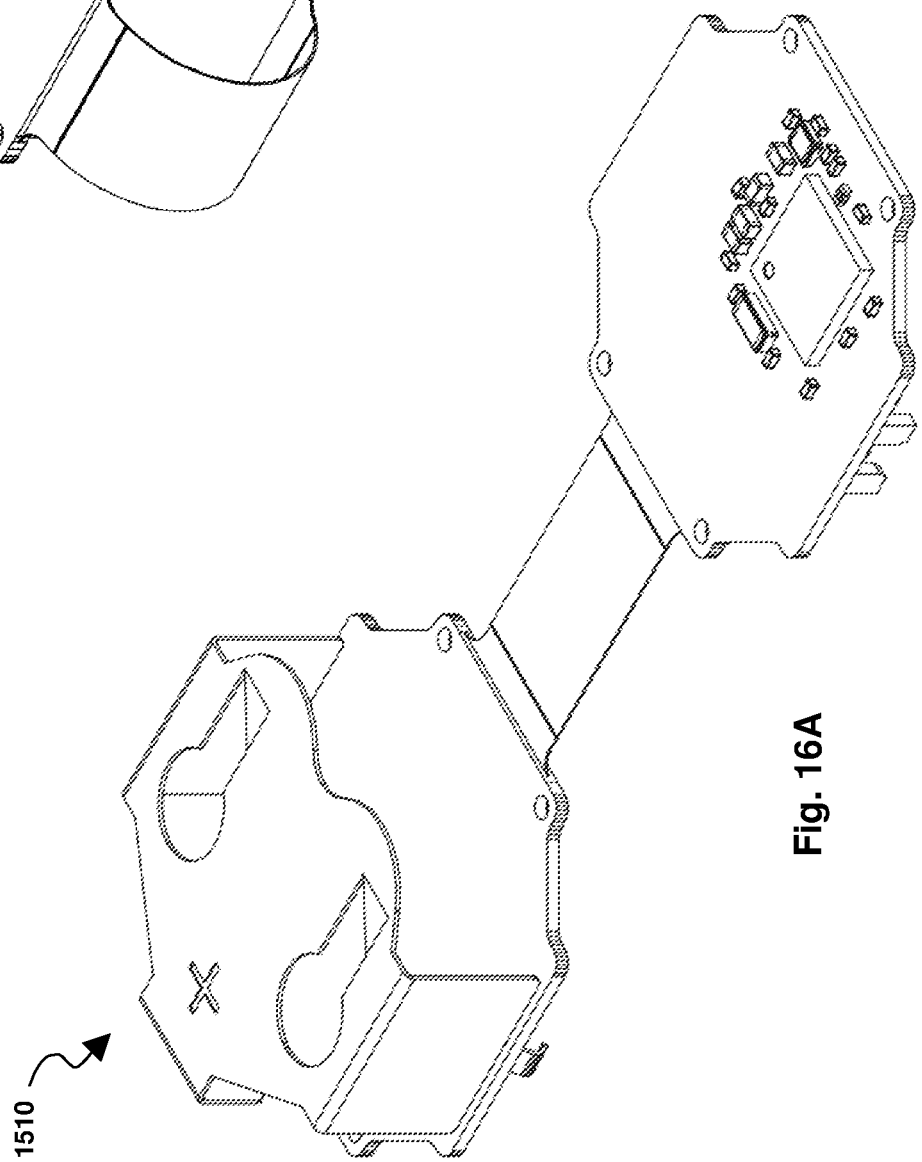
Fig. 16B
Fig. 16A

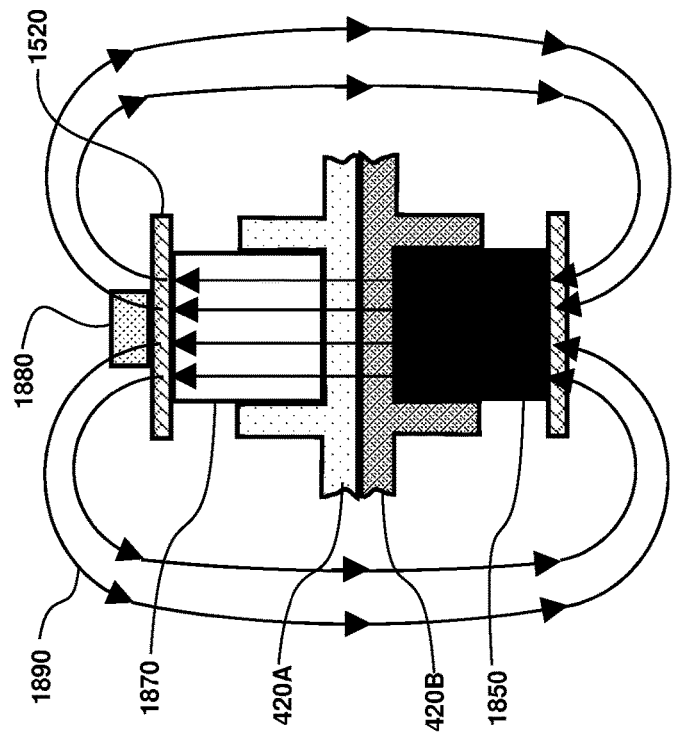
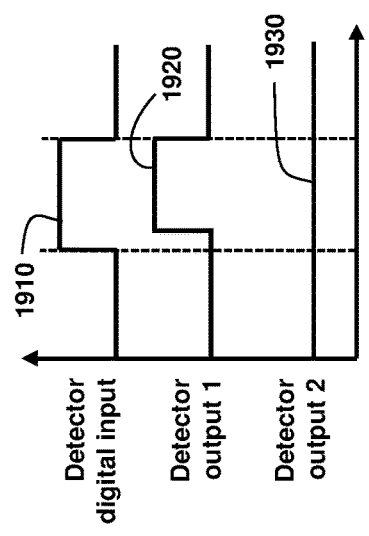
Fig. 19A
Fig. 19C
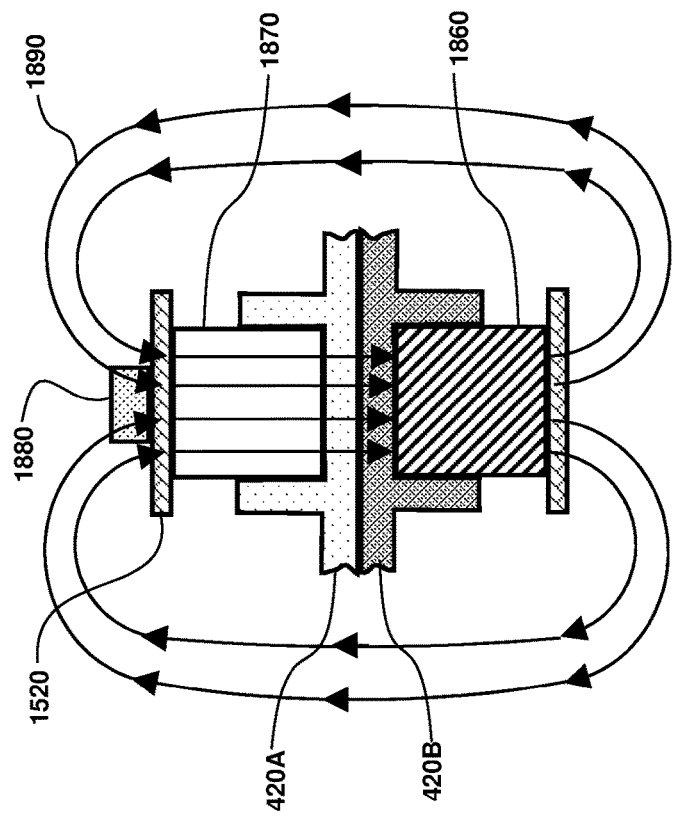
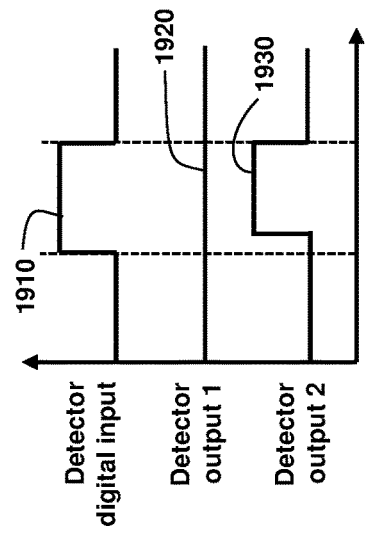
Fig. 19B
Fig. 19D

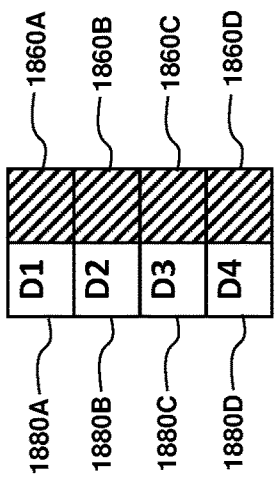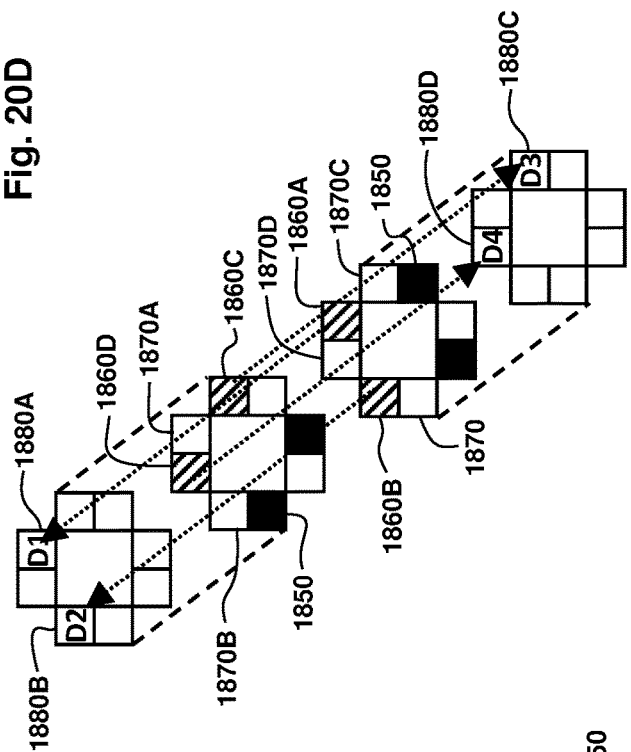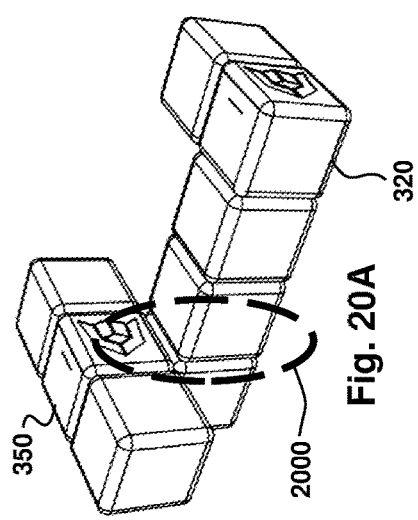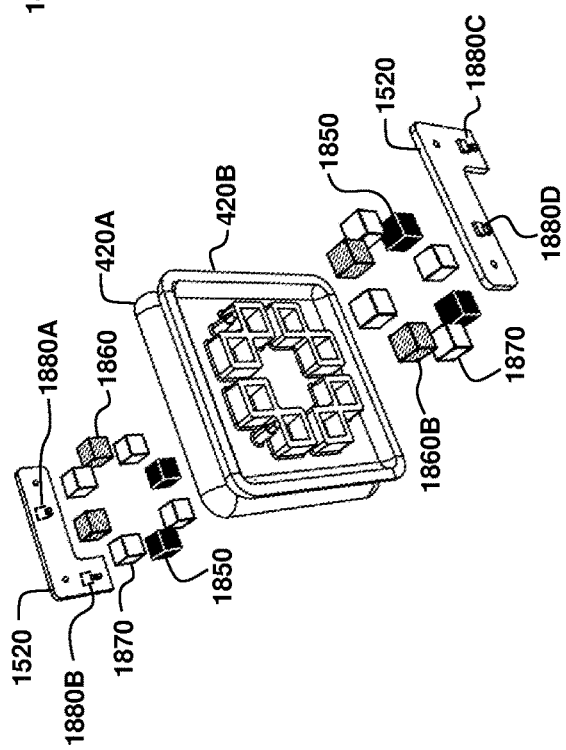
Fig. 20A
Fig. 20B
Fig. 20C
Fig. 20D

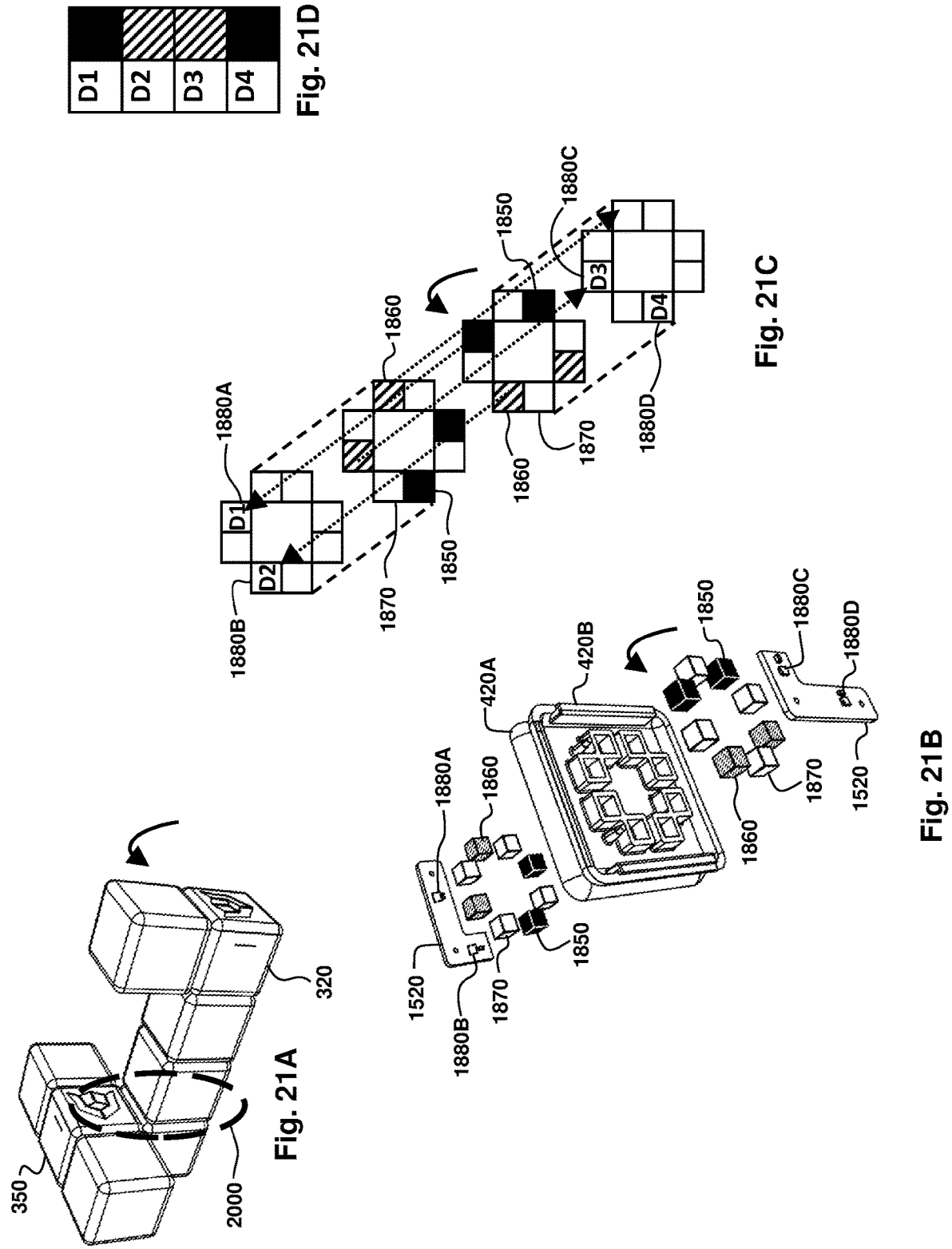

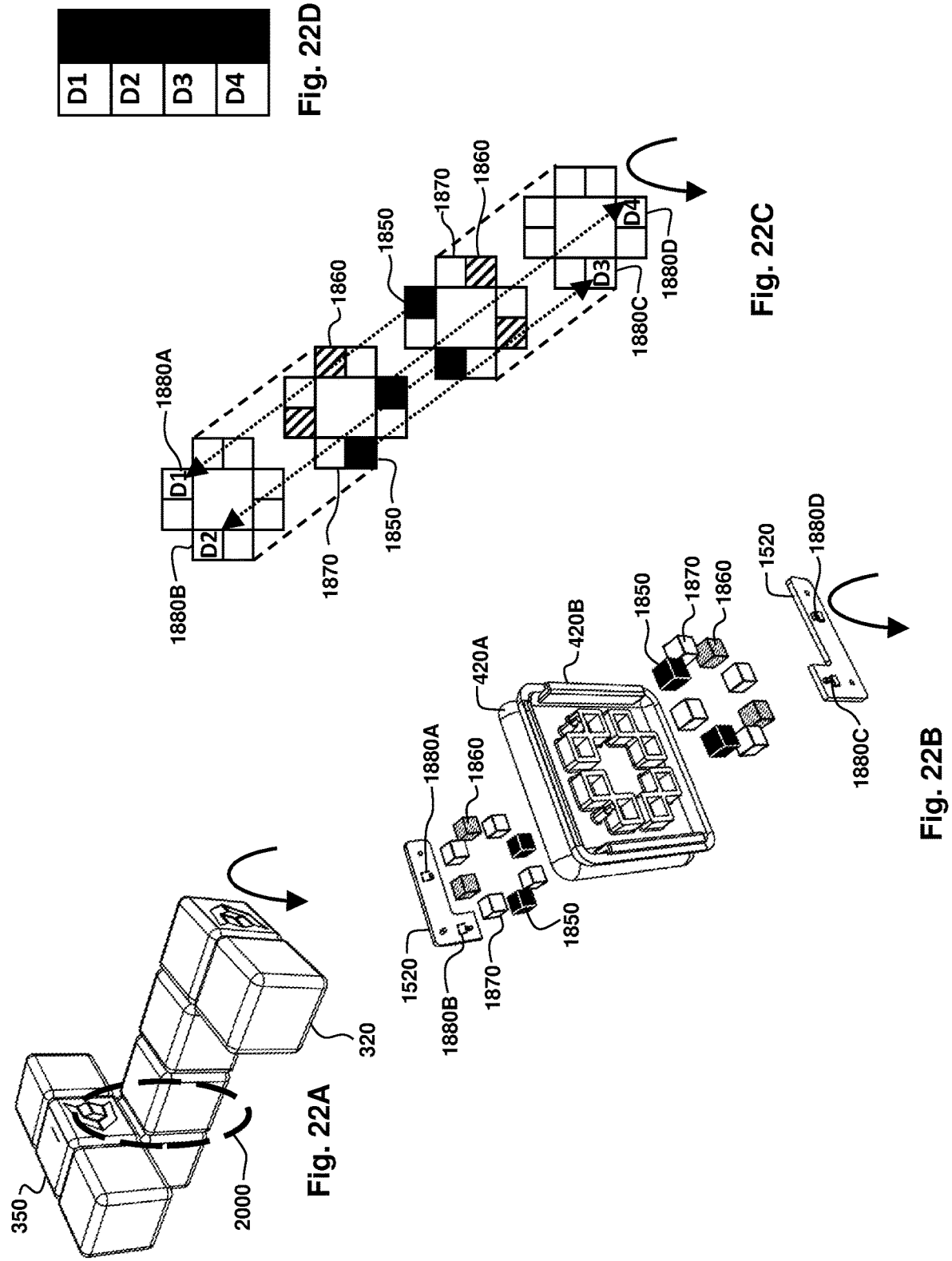

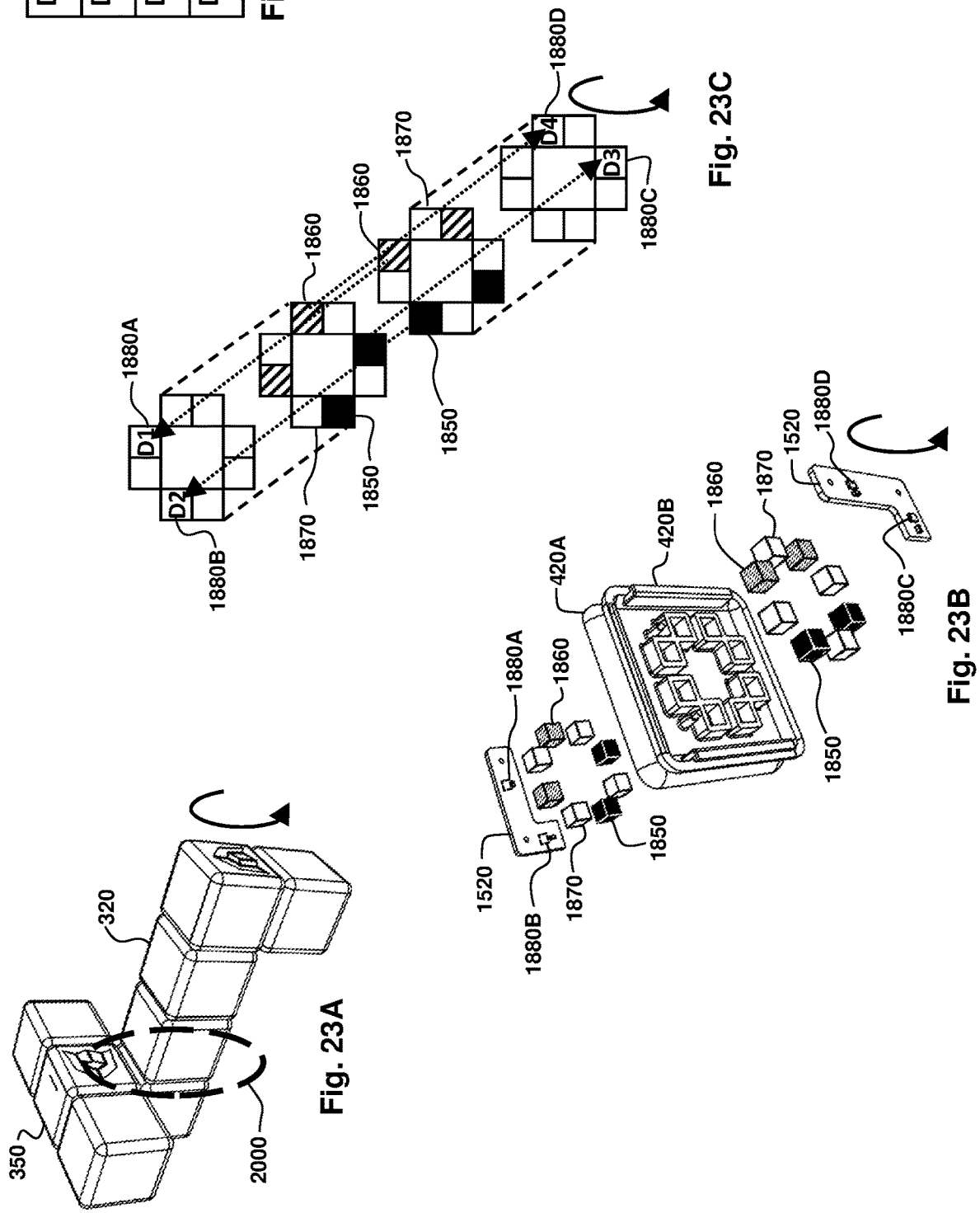

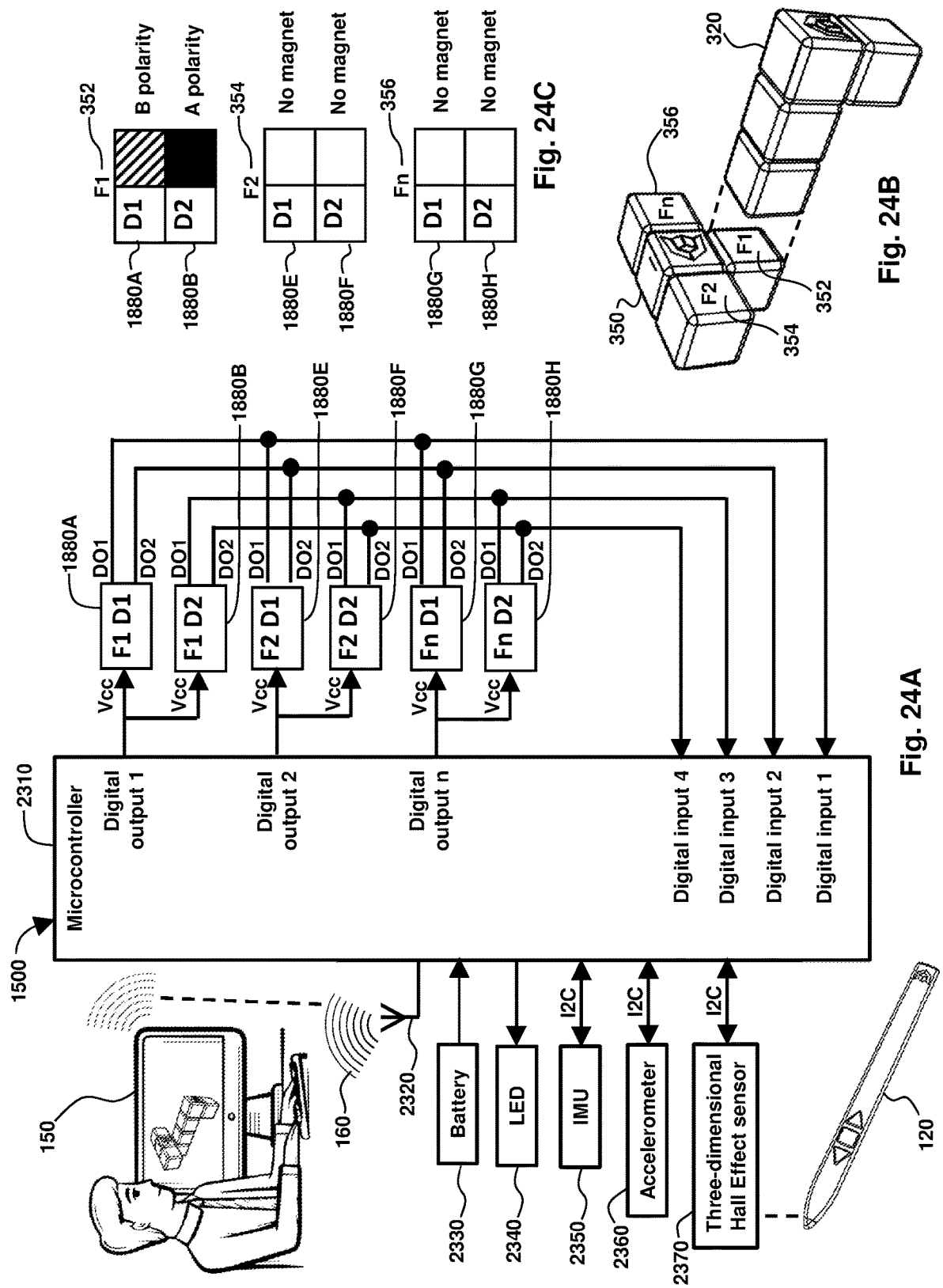

THREE-DIMENSIONAL MAGNETIC BLOCK SYSTEM AND METHOD

FIELD OF INVENTION

The present invention relates to electronic toys, educational learning/training devices, and/or gaming devices comprising magnetically-attractive polyhedra and/or polyomino volumetric shapes that can be assembled and manipulated by human users. Each block can comprise electronics for determining information about a block and its neighbors, and for communicating with other blocks and external devices.

BACKGROUND

Twenty-first century work is increasingly dependent on computational competency. The National Science Board reviewed how science, technology, engineering, and mathematics (STEM) kindergarten through twelfth grade education is the foundation for entry into postsecondary STEM majors and STEM-related occupations. The STEM workforce that relies on math skills extends beyond careers in software development, engineering, data science, and finance. It also includes careers in services, healthcare, applied arts, food production, communications, and more. Nearly all modern careers require a minimum ability to evaluate, analyze, compute, and solve real-world problems using math.

Students struggle to transfer STEM skills they learn in the classroom to scenarios that do not mimic the original problem. The Organization of Economic Co-operation, and Development Programme for International Student Assessment (OECD PISA) in math revealed that only 73% of U.S. students, aged 15, scored above the baseline. That baseline score demonstrates students' ability to use basic math concepts to solve real world problems. The U.S. Institute of Education Sciences (IES) National Assessment of Educational Progress (NAEP) evaluates U.S. 4th, 8th, and 12th grade proficiency in subjects including math. In 2022, the average fourth-grade math score decreased by five points and was lower than all years since 2005. The average eighth-grade math score decreased by 8 points compared to 2019 and was lower than all previous scores since 2003. Whereas the fourth-grade score decrease was greater for lower performing students, the eighth-grade math score averaged an eight-point decrease across all students whether they were higher, middle, or low performing.

Addressing this national test score decline requires a range of approaches to learning that connect real-world experiences and problem solving with mathematical and other academic skills learned in K-16 education and in workforce training. These approaches to learning integrate systems thinking, spatial thinking, and computational thinking. Leveraging learner's creative curiosity to understand complex subjects that enable them to solve new problems is achieved in a learning framework that includes building, sense-making, and synthesis. Learners explore physical properties of models they build from a variety of smart connectable construction components. Learners engage the academic skills they are learning to make sense of and understand the structural and computational properties in their models. Learners synthesize and integrate ideas and newly garnered insights into more reflective, efficient, complex, and aesthetic explorations. And they transfer that new knowledge to understand the workings of other structural objects in their environment.

Game-based learning is a structured form of play used for teaching, learning, and assessment. Game-based learning is used in a variety of learning environments and learning opportunities from formal and informal environments to work force development and other cognitive skills development. Game-based learning combines motivational playful elements designed for growth in cognitive skills and learning by recognizing skills, achievements, and learning opportunities. The game-based learning market, by game type, is segmented into augmented reality (AR) and virtual reality (VR) games; artificial intelligence (AI) based games; location-based games; assessment and evaluation games; training, knowledge, and skill-based games; language learning games, and other game types including role-based games and childhood learning games. One of the factors that has influenced growth in the computer game-based learning sector is the increased access to broadband, Wi-Fi, and a myriad of computing devices from desktops to mobile phones. Electronically connected toys, also known as intelligent toys and smart devices, have become ubiquitous for learning across all age groups. The major factors driving the connected toys market include widespread and easy availability of connected platforms, the increasing adoption of STEM toys, and the pace by which children are acquiring computational skills at an early age.

To address this need, it is desired to create a game-based learning platform that combines smart construction devices, wireless sensor networks, augmented reality, computational model analysis, and skills learning curriculum. Such a platform could support the build, sense-making, and synthesis learning framework using smart construction devices and augmented reality overlays that explore, teach, and encourage learners to connect abstract STEM concepts to their creative constructions made with smart construction devices.

BRIEF DESCRIPTION OF THE DRAWINGS

This disclosure is described in conjunction with the appended figures in which:

FIG. 3A, FIG. 3B, FIG. 3C, FIG. 3D, FIG. 3E, FIG. 3F, FIG. 3G, FIG. 3H, and FIG. 3I show examples of nine electronic blocks made from cubes, and more specifically an I-block, L-block, R-block, S-block, T-block, V-block, Y-block, Z-block, and Hub-block;

FIG. 4A, FIG. 4B, FIG. 4C, FIG. 4D, FIG. 4E, FIG. 4F, FIG. 4G, and FIG. 4H show exploded views of the I, L, R, S, T, V, Y, and Z blocks of FIG. 3A to FIG. 3H;

FIG. 14A, FIG. 14B, and FIG. 14C provide three views an orientation feature that can be used to allow the assembly of the faces of two cubes in only one orientation;

FIG. 16A shows an example of hub cube electronics in flat form;

FIG. 16B shows an example of the hub cube the electronics in folded form;

FIG. 19A and FIG. 19B are section views of the steel cubes, magnets, and detectors;

FIG. 19C and FIG. 19D are input-output signal diagrams for the configurations of FIG. 19A and FIG. 19B;

FIG. 20A, FIG. 21A, FIG. 22A, and FIG. 23A show a face of an L-block attached to a face of a T-block with L-block in four different 90-degree rotations;

FIG. 20B, FIG. 21B, FIG. 22B, and FIG. 23B show the magnets, steel cubes, and detectors on attached faces of the blocks of FIG. 20A, FIG. 21A, FIG. 22A, and FIG. 23A;

FIG. 20C, FIG. 21C, FIG. 22C, and FIG. 23C show how the detectors of FIG. 20B, FIG. 21B, FIG. 22B and FIG. 23C detect magnetic flux transmitted through the steel cubes;

FIG. 20D, FIG. 21D, FIG. 22D and FIG. 23D schematically illustrate the detector readings diagramed in FIG. 20C, FIG. 21C, FIG. 22C, and FIG. 23C;

FIG. 24A diagrams the electronics in a block and its external interfaces;

FIG. 24B shows an exploded view of a T-block attached to an L-block;

FIG. 24C shows magnetic detector readings for the assembly of FIG. 24B;

Figure 1:
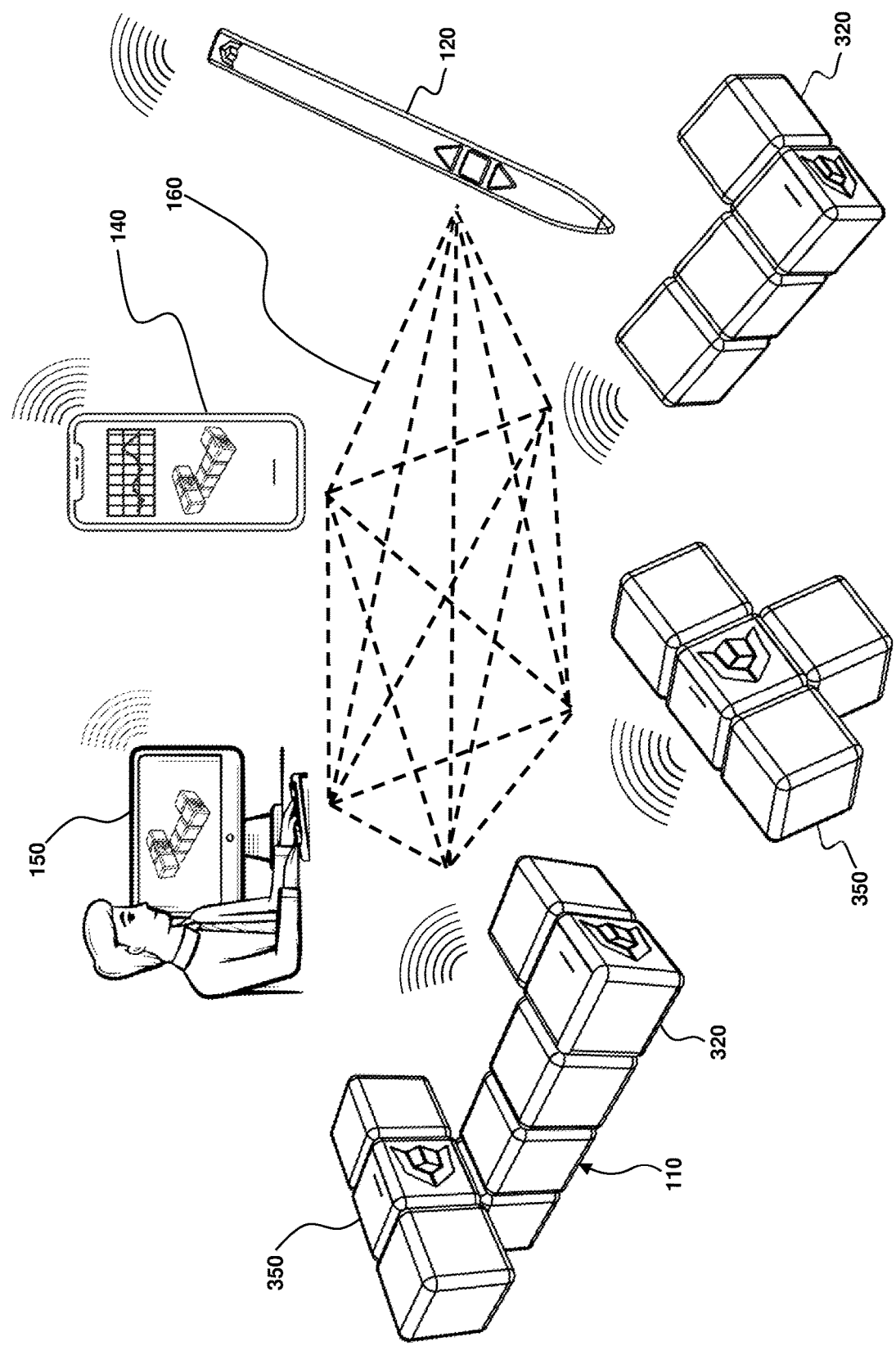
FIG. 1 shows a system comprising electronic blocks made from cubes.

It should be understood that the drawings are not necessarily to scale. In certain instances, details that are not necessary for an understanding of the invention or that render other details difficult to perceive may have been omitted. It should be understood that the invention is not necessarily limited to the particular embodiments illustrated herein.

DETAILED DESCRIPTION

The ensuing description provides preferred exemplary embodiment(s) only, and is not intended to limit the scope, applicability, or configuration of the disclosure. Rather, the ensuing description of the preferred exemplary embodiment(s) provides those skilled in the art with an enabling description for implementing a preferred exemplary embodiment. It should be understood that changes could be made in the function and arrangement of elements without departing from the spirit and scope as set forth in the appended claims.

Specific details are given in the following description to provide a thorough understanding of the embodiments. However, it will be understood by one of ordinary skill in the art that the embodiments may be practiced without these specific details. For example, those skilled in the art will know that different geometry, configurations, circuitry, transducers, materials, processes, configurations, and components may be substituted.

1. Definitions

In embodiments of the invention and claims, a block is defined as a three-dimensional shape comprised of one or more polyhedra. For examples, a block could be formed from one or more cubes, it could be formed from one or more rectangular prisms, it could be formed from one or more pyramids, or it could be formed from any other polyhedron or combination of polyhedra. Thus, blocks can be made from cubes, but they can also be made from other polyhedra, such as tetrahedra.

In embodiments of the invention and claims, a polyhedron is a three-dimensional shape comprising flat polygonal faces, straight edges, and pointed vertices. Examples of polyhedrons include pyramids, prisms, and dodecahedrons. A convex regular polyhedron is a three-dimensional shape having no indentations in which all faces have an identical regular shape. There are five convex regular polyhedra: a triangular pyramid (also called a tetrahedron) that has four equilateral triangular faces, a cube (six square faces), an octahedron (eight equilateral triangular faces), a dodecahedron (twelve regular pentagonal faces), and an icosahedron (twenty equilateral triangular faces).

In embodiments of the invention and claims, a cube is defined as a symmetrical three-dimensional shape comprising six square faces that are at right angles to each other.

In embodiments of the invention and claims, a polyomino is a planar geometric shape formed by joining one or more equally-sized squares edge-to-edge. A three-dimensional polyomino is a three-dimensional structure formed by joining one or more equally-sized cubes face-to-face.

In embodiments of the invention and claims, a selection pen is a hand holdable device configured for communication with other elements of the system.

In embodiments of the invention and claims, an educational learning system is any K-16 (kindergarten through undergraduate) or workforce training system.

2. Overview of One Embodiment

In one embodiment, the present invention is a system or method comprising a plurality of three-dimensional magnetic blocks with magnets. Each block comprises one or more convex regular polyhedra. The polyhedron or polyhedra that comprise each block are fixedly attached to each other. All polyhedra in all blocks are of equal size and shape. Each block can be detachably attached to other blocks through magnetic attraction between one or more magnets on one face of one block with one or more magnetically-attractive non-magnetic elements on one face of another block in a configuration that will be further detailed in this document. The configuration of the magnets and magnetically-attractive non-magnetic elements on detachably attached faces of two blocks also facilitates the alignment of the detachably attached faces into a limited number of orientations equal to the number of sides of the faces of the polyhedra. Magnetic detectors located proximate to the interior of the magnetically-attractive non-magnetic elements can be used to determine (a) whether another block is magnetically attached to a particular face of a block and, if so, (b) in which specific orientation. Each of the blocks can comprise a processor responsive to the magnetic detectors used for detecting attachment and orientation of the detachably-attached face of another block. Each of the blocks can further comprise:

(a) A device or devices, such as an accelerometer, magnetometer, gyroscope or combination of one or more accelerometers, gyroscopes, and/or a magnetometer to collect rotation and movement information;

(b) A device or devices for wireless communication of information about the attachment and orientation of the detachably-attached faces to outside devices; and/or (c) A light-emitting diode (LED) or other visual, haptic, and/or audio signaling device for providing status feedback.

In one embodiment, the convex regular polyhedra used to make the blocks are made by folding substantially-planar shapes comprising a set of square-shaped elements into a cubic shape. The square-shaped faces could be snapped together when folded into a cube. The cubes could then be snapped together to form the blocks (which would be polyominos in this case). There could be orientation features on the cubes that prevent the cubes from being misassembled into the wrong blocks (polyominos).

One example of an external device to which the blocks and assemblies of blocks can communicate or respond is a selection pen for detecting specific polyominos. A selection pen can comprise a selection pen magnet that could be detected by analog magnetic field detectors in one or more blocks, to determine relative proximity of the selection pen magnet to these analog magnetic field detectors. A selection pen could also comprise electronics for determining rotation, haptic and visual feedback, as well as push buttons to initiate a selection process. A selection pen could communicate its status information externally. This external communication could be wireless communication.

Information about the properties of the geometric objects and selection pen can be wirelessly transmitted and visually and/or numerically presented on an external device through a platform as a service (PAAS) computer software system to support educational, training, gaming, or entertainment activities. The PAAS software could operate on any computing device, such as a mobile computing device (cellphone, tablet, etc.) or a system computer. More specifically, the PAAS system can manage learning modules delivery, learning module management, individual and group assessment, and account management. The PAAS system can also manage the computational model analysis that responds to computer-generated and/or user-generated queries about the three-dimensional model with computationally calculated responses.

The system can be implemented on a two-dimensional or three-dimensional (3D) display and/or as an extended reality (augmented reality or virtual reality) PAAS that analyzes the 3D model replication of the construction assembly to support application specific lessons and user interactions. Embodiments of the invention can integrate networking and display features of the Internet-of-Things (IoT), augmented reality (AR), and computational model analysis. The physical electronic blocks can be wireless sensor network nodes that are connectable using non-repelling electro-magnetic connectors. The shapes of the electronic blocks can support a variety of construction assemblies. Construction assemblies can be rendered as three-dimensional (3D) models in interactive applications. The interactive applications can be responsive to the movement and connection of individual and assembled blocks and updates a 3D model accordingly. Individual blocks can be selected with the physical selection pen for user interface and user experience software application responses.

3. Detailed Description of Embodiments

Referring now to illustrations of the embodiments, FIG. 1 shows a system comprising electronic blocks. In the embodiment shown, the blocks are polyominos made from cubes. Referring to FIG. 1, the specific blocks illustrated are an L-Block, shown at 320, a T-block shown at 350. These, and other blocks that can be used in embodiments of the invention will be further described with reference to FIG. 3A to FIG. 22D.

In FIG. 1, the L-block and T-block have been detachably attached together into the block assembly shown at 110. This assembly 110 can be described as being a combination of two polyominos that are detachably attached to each other by having one face of a first polyomino (a T-block in this case) detachably attached to one face of a second polyomino (an L-block in this case). Detachable attachment can comprise the use of magnets and magnetically-attractive non-magnetic elements, as will be further described in this document.

As will be described in greater detail later in this document, each of these blocks comprise electronics configured for communicating wirelessly to each other and to other devices, such as a selection pen, shown at 120, a mobile computing device shown at 140, and a computer shown at 150. This wireless communication is shown by dotted lines at 160. The selection pen 120 is configured to be held and manipulated in the hand of a user. One end of the selection pen 120 has a substantially pointed geometry to resemble the end of a pointer and define an orientation for the selection pen 120. As will be further detailed later in this document, the selection pen 120 can comprise a selection pen magnet, an inertial measurement unit (IMU) sensor, one or more modal buttons, and one or more actuators.

FIG. 1 also shows a mobile computing device 140 and a system computer 150. The mobile computing device 140 could be any type or size of mobile computing device such as cell phone, or an electronic tablet. The system computer 150 could be any computer including, but not limited to a laptop computer, desktop computer, workstation, or virtualized processor operating in a data center. The mobile computing device 140 or a system computer 150, or/both, can be used to access a computing application. The mobile computing device 140 or computer 150 can comprise a camera, an operating system, and accompanying software management and presentation components to support a computer application that can support augmented reality, virtual reality, and/or other display applications.

Further referring to FIG. 1, the wireless communication between parts of the system shown as a web of dotted lines at 160 can be any wireless communication system and/or method capable of being understood by anyone skilled in the art. Examples of such communications systems can include Bluetooth, WiFi, Zigbee, Ant, Thread, and cellular phone protocols.

Figure 2:
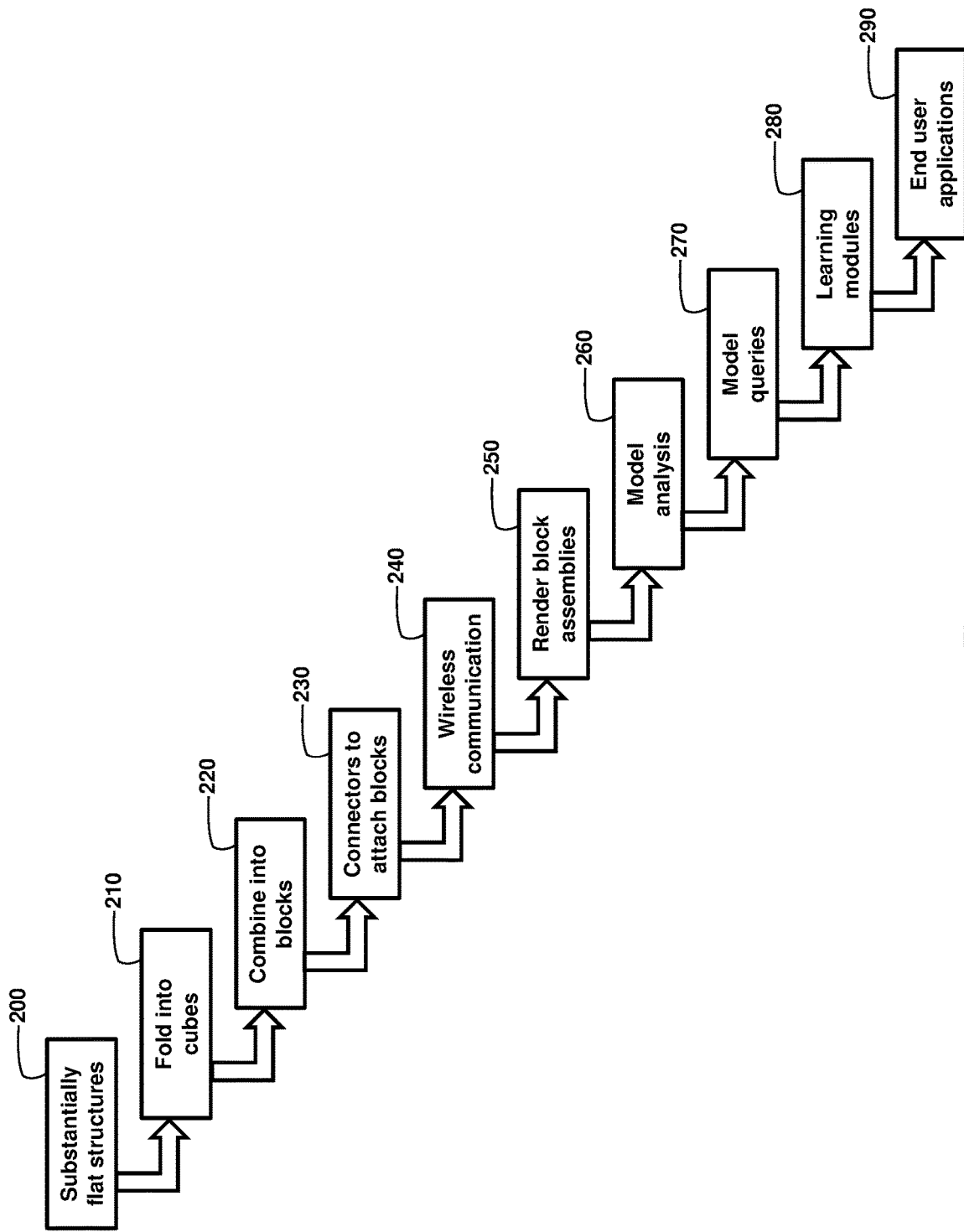
FIG. 2 shows the structural and functional layers of the system of FIG. 1.

FIG. 2, shows the structural and functional layers of the system of FIG. 1 in a waterfall diagram format. Referring to FIG. 2, the cubes used in one embodiment are constructed from substantially flat structures 200 that are folded into cubes 210, that can then be combined into blocks 220 (polyominos in one embodiment), as will be further described with reference to FIG. 3A to FIG. 14C. The cubes will typically be pre-assembled into blocks and these blocks normally would be configured not to be disassembled by a user. The blocks comprise connectors 230 (typically magnetic) that allow the blocks to be detachably attached to one another by a user to create assemblies, such as the assembly of a T-block and an L-block that was shown at 110 in FIG. 1 and the assemblies shown in FIG. 20A, FIG. 21A, FIG. 22A, FIG. 23A, and FIG. 24B. Electronics within the blocks provide wireless communication between blocks 240 and with external devices such as the selection pen 120, mobile computing device 130, and computer 140, shown in FIG. 1. Note that a magnet in a selection pen can also interact with a three-dimensional Hall Effect sensor, as will be described with reference to FIG. 24A. The configuration and orientation of the assemblies can then be rendered, as shown at 250 in FIG. 2 and visibly shown on the screen of the computer 140 and mobile computing device 130 in FIG. 1. These models of block assemblies can be analyzed, as shown at 260. These assemblies can be queried, as shown at 270. Exercises can be developed as part of learning modules, as shown at 280, and these can be packaged into end user applications, as shown at 290. The system software for performing this rendering 250, analysis 260, querying 27, learning modules 280, and end user applications will be further described with reference to FIG. 27.

FIG. 3A shows an example of an I-block 310 when assembled, and FIG. 4A shows an exploded view of this I-block 310. In this example, the I-block comprises a D-type hub cube housing 410D, a through cube housing 430, and two end cube housings 420. These different types of housings and how they physically attach to each other will be further detailed later in this document with reference to FIG. 5 to FIG. 14D. Note that the D-type hub cube housing 410D further comprises one face that has an orientation symbol, shown at 412. This orientation symbol 412 defines the configuration and orientation of the entire I-block. Note also that the D-type hub cube housing 410D has two faces with apertures for attachment to other cubes in a block. One face with an aperture for attachment to other cubes in a block is on the side that the orientation symbol 412 is pointing to (bottom), and the other face with an attachment aperture is on the side of the hub cube opposite this first face with an aperture (top). The unfolded version of the D-type hub cube housing is illustrated at 410D in FIG. 7D.

FIG. 3B shows an example of an L-block 320 when assembled, and FIG. 4B shows an exploded view of this L-block 320. In this example, the L-block comprises a B-type hub cube housing 410B, a through cube housing 430, and two end cube housings 420. These different types of housings and how they physically attach to each other will be further detailed later in this document with reference to FIG. 5 to FIG. 14D. Note that the B-type hub cube housing 410B further comprises one face that has an orientation symbol, shown at 412. This orientation symbol 412 defines the configuration and orientation of the entire L-block. Note also that the B-type hub cube housing 410B has two faces with apertures for attachment to other cubes in a block. If the B-type hub cube housing 410B were oriented with the orientation symbol 412 on the front face and pointing down, one open face with an aperture for attachment would be is on the top and the other face with an aperture would be in the rear. The unfolded version of the B-type hub cube housing is illustrated at 410B in FIG. 7B.

FIG. 3C shows an example of an R-block 330 when assembled, and FIG. 4C shows an exploded view of this R-block 330. In this example, the R-block comprises a B-type hub cube housing 410B, a B-type corner cube housing 440B, and two end cube housings 420. These different types of housings and how they physically attach to each other will be further detailed later in this document with reference to FIG. 5 to FIG. 14D. The B-type hub cube housing 410B for the R-block has two faces for attachment to other cubes in the R-block and these faces with apertures are similarly located relative to the orientation symbol 412 as was described for the L-block.

FIG. 3D shows an example of an S-block 340 when assembled, and FIG. 4D shows an exploded view of this S-block 340. In this example, the S-block comprises a B-type hub cube housing 410B, an A-type corner cube housing 440A, and two end cube housings 420. These different types of housings and how they physically attach to each other will be further detailed later in this document with reference to FIG. 5 to FIG. 14D. The difference between the A-type corner cube housing 440A (for the S-block) and the B-type corner cube housing 440B (for the R-block) will be explained with reference to FIG. 13A and FIG. 13B. The B-type hub cube housing 410B for the S-block has two faces with apertures for attachment to other cubes in the S-block and these faces with apertures are similarly located relative to the orientation symbol 412 as was described for the L-block and R-block.

FIG. 3E shows an example of a T-block 350 when assembled, and FIG. 4E shows an exploded view of this T-block 350. In this example, the T-block comprises a C-type hub cube housing 410C and three end cube housings 420. These different types of housings and how they physically attach to each other will be further detailed later in this document with reference to FIG. 5 to FIG. 14D. Note that the C-type hub cube housing 410C further comprises one face that has an orientation symbol, shown at 412. This orientation symbol 412 defines the configuration and orientation of the entire T-block. Note also that the C-type hub cube housing 410C has three faces with apertures for attachment to other cubes in the T-block. If the C-type hub cube housing 410C were oriented with the orientation symbol 412 on the front face and pointing down, one face with an aperture would be is on the top, one face with an aperture would be on the bottom, and the third face with an aperture would be on the right side. The unfolded version of this hub cube housing is illustrated at 410C in FIG. 7C.

FIG. 3F shows an example of a V-block 360 when assembled, and FIG. 4F shows an exploded view of this V-block 360. In this example, the V-block comprises a B-type hub cube housing 410B and two end cube housings 420. These different types of housings and how they physically attach to each other will be further detailed later in this document with reference to FIG. 5 to FIG. 14D. The B-type hub cube housing 410B for the V-block has two faces with apertures for attachment to other cubes in the V-block and these faces for attachment are similarly located relative to the orientation symbol 412 as was described for the L-block, the R-block, and the S-block.

FIG. 3G shows an example of a Y-block 370 when assembled, and FIG. 4G shows an exploded view of this Y-block 370. In this example, the Y-block comprises an A-type hub cube housing 410A and three end cube housings 420. These types of housings and how they physically attach to each other will be further detailed later in this document with reference to FIG. 5 to FIG. 14D. Note that the A-type hub cube housing 410A further comprises one face that has an orientation symbol, shown at 412. This orientation symbol 412 defines the configuration and orientation of the entire Y-block. The A-type hub cube housing 410A has three faces with apertures for attachment to other cubes in the Y-block. If the A-type hub cube housing 410A were oriented with the orientation symbol 412 on the front face and pointing down, one face for attachment would be is on the top, one face for attachment would be on the right side, and the third face for attachment would be on the rear. The unfolded version of this hub cube housing is illustrated at 410A in FIG. 5, FIG. 6, and FIG. 7A.

FIG. 3H shows an example of a Z-block when assembled, and FIG. 4H shows an exploded view of this Z-block. In this example, the Z-block comprises a B-type hub cube housing 410B, an A-type corner cube housing 440A, and two end cube housings 420. These different types of housings and how they physically attach to each other will be further detailed later in this document with reference to FIG. 5 to FIG. 14D. The B-type hub cube housing 410B for the Z-block has two faces with apertures for attachment to other cubes in the Z-block and these open faces are similarly located relative to the orientation symbol 412 as was described for the L-block, the R-block, the S-block, and the V-block.

FIG. 3I shows an example of a single block 390. In this example, the single block 390 comprises a hub cube housing with no open faces for permanent attachment to other blocks. It can have faces for detachable magnetic attachment to other blocks. This single block has an orientation symbol 412.

The following table summarizes the information that has been described with reference to FIG. 3A to FIG. 4H regarding the cubes in each block, open attachment faces on the hub block, and version of the corner cube being used.

| | Hub cube open faces and type | | | | Through cube | Corner cube | End cubes |
|---|---|---|---|---|---|---|---|
| | Top | Bottom | Right | Rear | FIG. | | | |
| I-block | Yes | Yes | No | No | 7D | 1 | 0 | 2 |
| L-block | Yes | No | No | Yes | 7B | 1 | 0 | 2 |
| R-block | Yes | No | No | Yes | 7B | 0 | Type B | 2 |
| S-block | Yes | No | No | Yes | 7B | 0 | Type A | 2 |
| T-block | Yes | Yes | Yes | No | 7C | 0 | 0 | 3 |
| V-block | Yes | No | No | Yes | 7B | 0 | 0 | 2 |
| Y-block | Yes | No | Yes | Yes | 7A | 0 | 0 | 3 |
| Z-block | Yes | No | No | Yes | 7B | 0 | Type A | 2 |
| Single | No | No | No | No | None | None | None | None |

Figure 5:
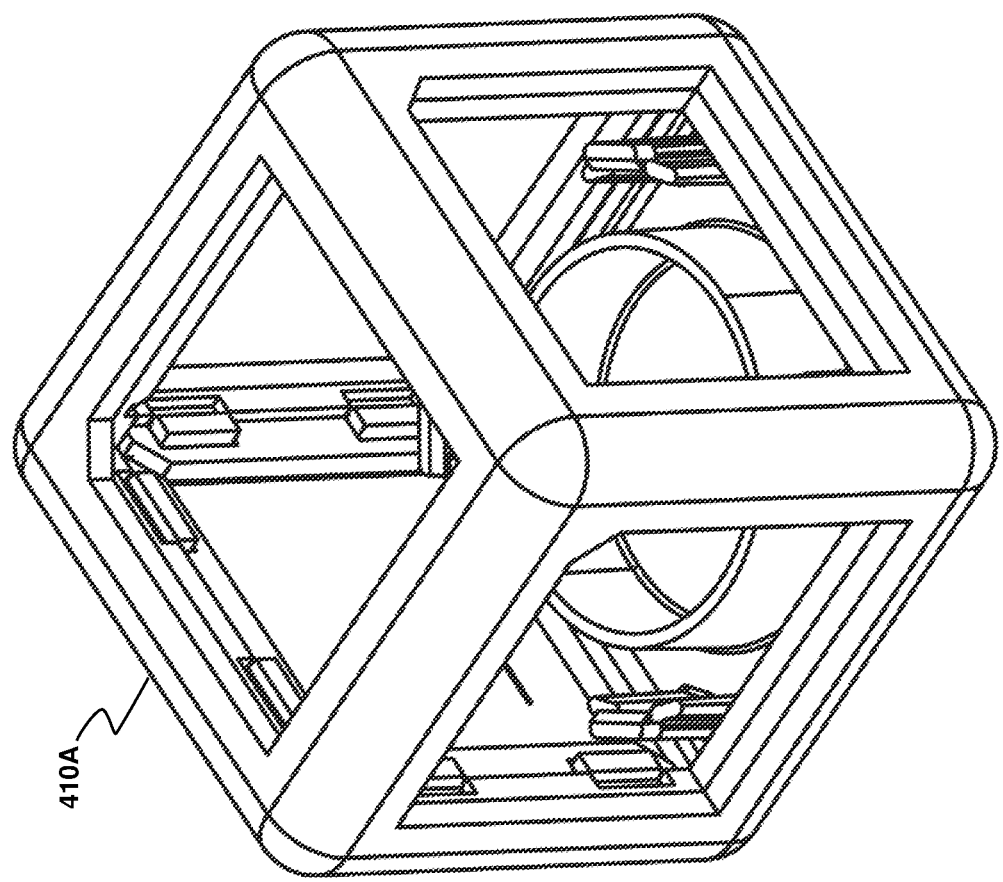
FIG. 5 is a perspective view of a folded frame of a hub cube with three open faces.
Figure 6:
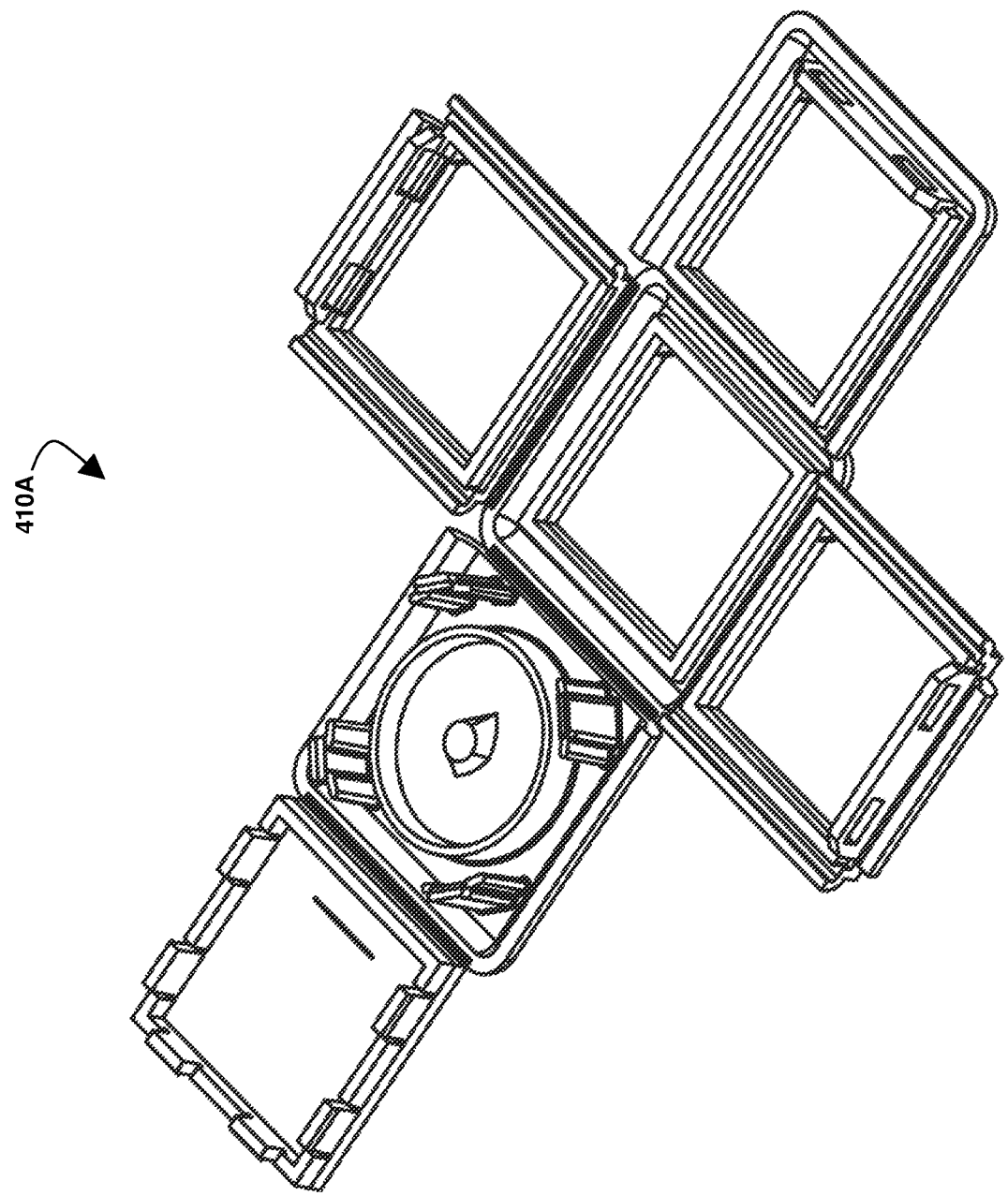
FIG. 6 shows a perspective top view the unfolded frame of the hub cube of FIG. 5.
Figure 7A:
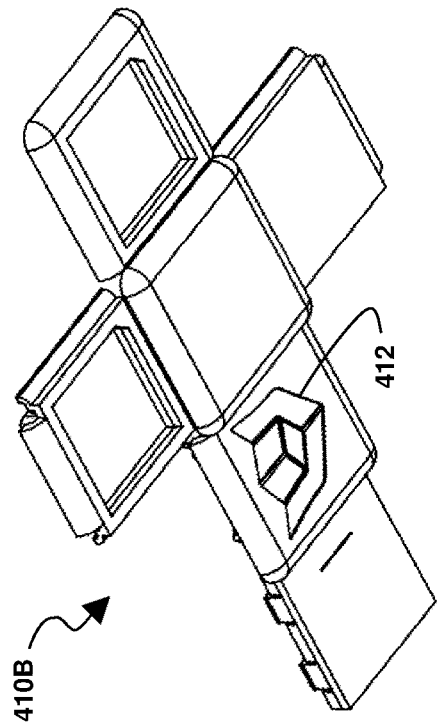
FIG. 7A shows a perspective bottom view of the unfolded frame of FIG. 6.

FIG. 5 shows an example of the A-type hub cube housing 410A in a folded configuration. FIG. 6 shows a top perspective view of the A-type hub cube housing in an unfolded configuration 410A. FIG. 7A shows a bottom perspective view of the A-type hub cube housing 410A in an unfolded configuration. The A-type hub cube housing 410A, shown in FIG. 5, FIG. 6, and FIG. 7A has the configuration of faces with apertures for attachment to other cubes needed to make the Y-block shown at 370 in FIG. 3G and FIG. 4G. Referring to FIG. 7A it can be seen that, if the A-type hub cube housing 410A was folded and the orientation symbol was oriented on the front face pointing down, the A-type hub cube housing 410A would have its three faces with apertures for attachment to other cubes on the top, right side, and rear.

Figure 7B:
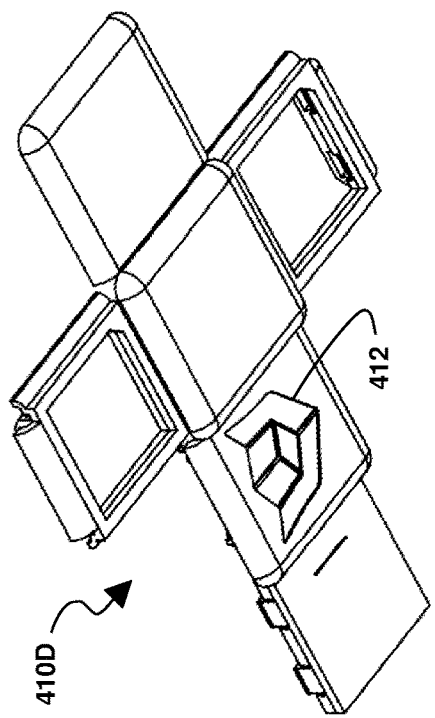
FIG. 7B shows a perspective bottom view of an unfolded frame for a hub cube with two open faces for making the L-block, R-block, S-block, and Z-block.

FIG. 7B shows an example of a B-type hub cube housing 410B in an unfolded configuration. If the B-type hub cube housing 410B was folded and the orientation symbol was oriented on the front face pointing down, its faces with apertures for attachment to other cubes in the block would be on the top and rear. The B-type hub cube housing 410B is used to make the L-block shown at 320 in FIG. 3B and FIG. 4B, the R-block shown at 330 in FIG. 3C and FIG. 4C, the S-block shown at 340 in FIG. 3D and FIG. 4D, the V-block shown at 360 in FIG. 3F and FIG. 4F, and the Z-block shown at 380 in FIG. 3H and FIG. 4H.

Figure 7C:
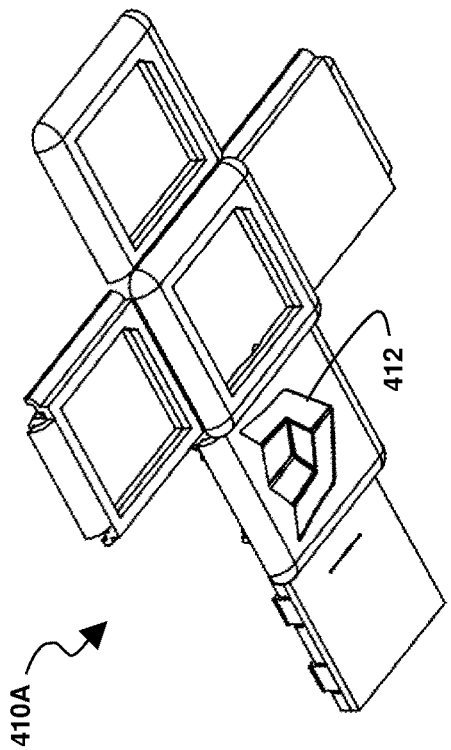
FIG. 7C shows a perspective bottom view of an unfolded frame for a hub cube with three open faces in a row for making the T-block.

FIG. 7C shows an example of a C-type hub cube housing 410C in an unfolded configuration. If the C-type hub cube housing 410C was folded and the orientation symbol was oriented on the front face pointing down its faces with apertures for attachment to other cubes in the block would be on the top, bottom, and right side. The C-type hub cube housing 410C is used to make the T-block shown at 350 in FIG. 3E and FIG. 4E.

Figure 7D:
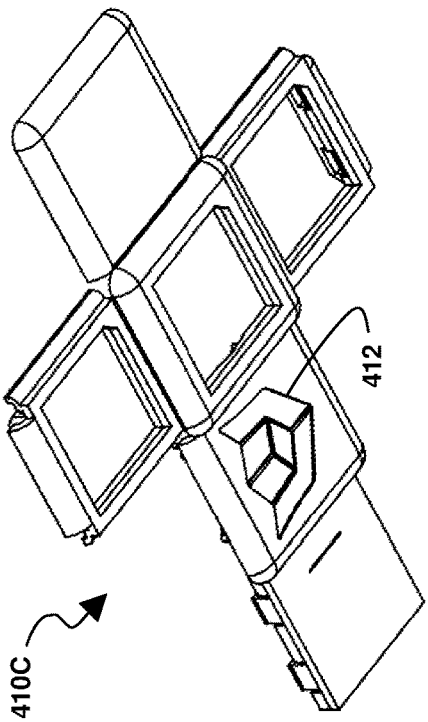
FIG. 7D shows a perspective bottom view of an unfolded frame for a hub cube with two open faces on opposite sides of the cube for making the I-block.

FIG. 7D is an example of a D-type hub cube housing 410D in an unfolded configuration. If the D-type hub cube housing 410D was folded and the orientation symbol was oriented on the front face pointing down its faces with apertures for attachment to other cubes in the block would be on the top and bottom. The D-type hub cube housing 410D is used to make the I-block shown at 310 in FIG. 3A and FIG. 4A.

Figure 8:
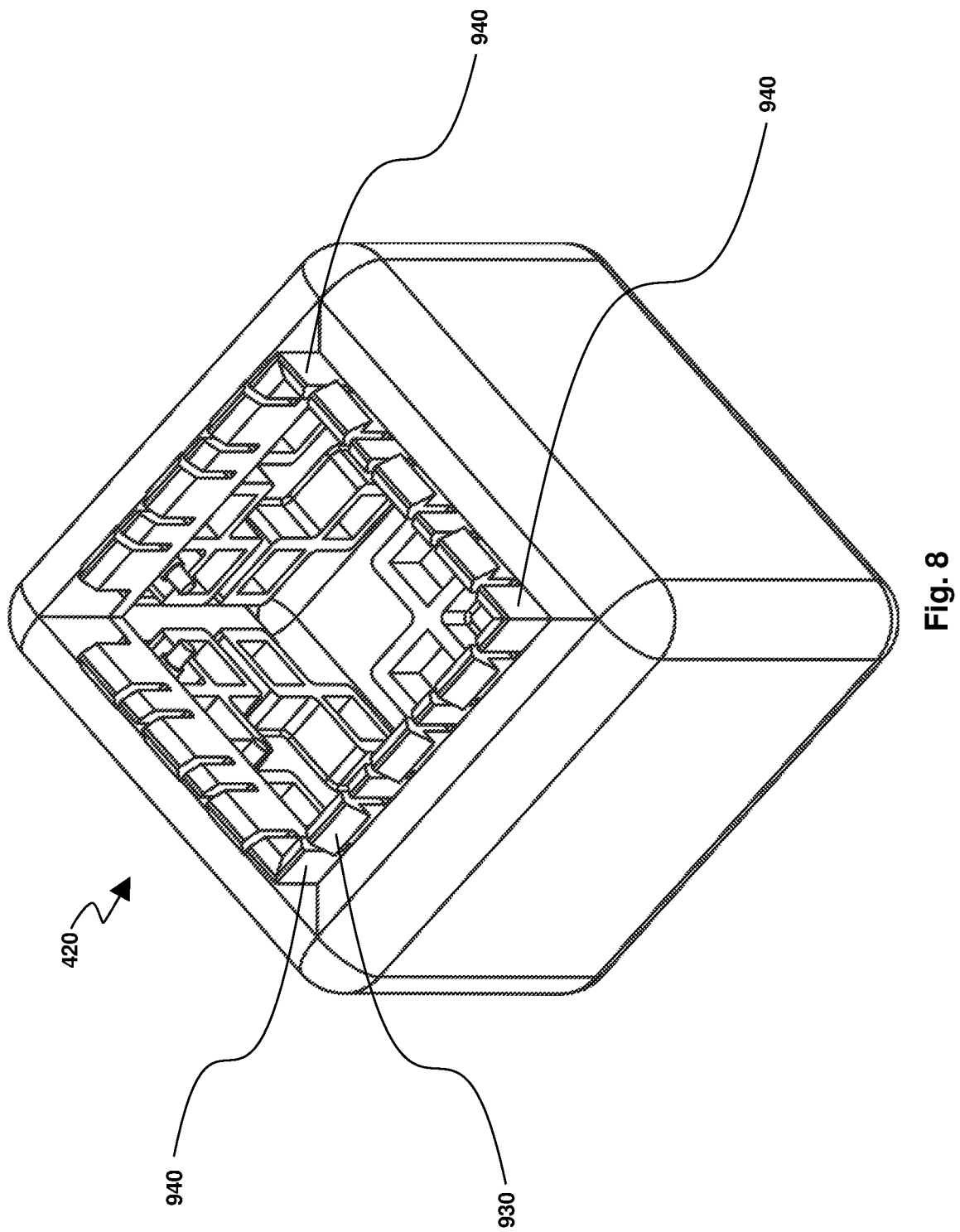
FIG. 8 shows a perspective view of the folded frame for an end cube.
Figure 9:
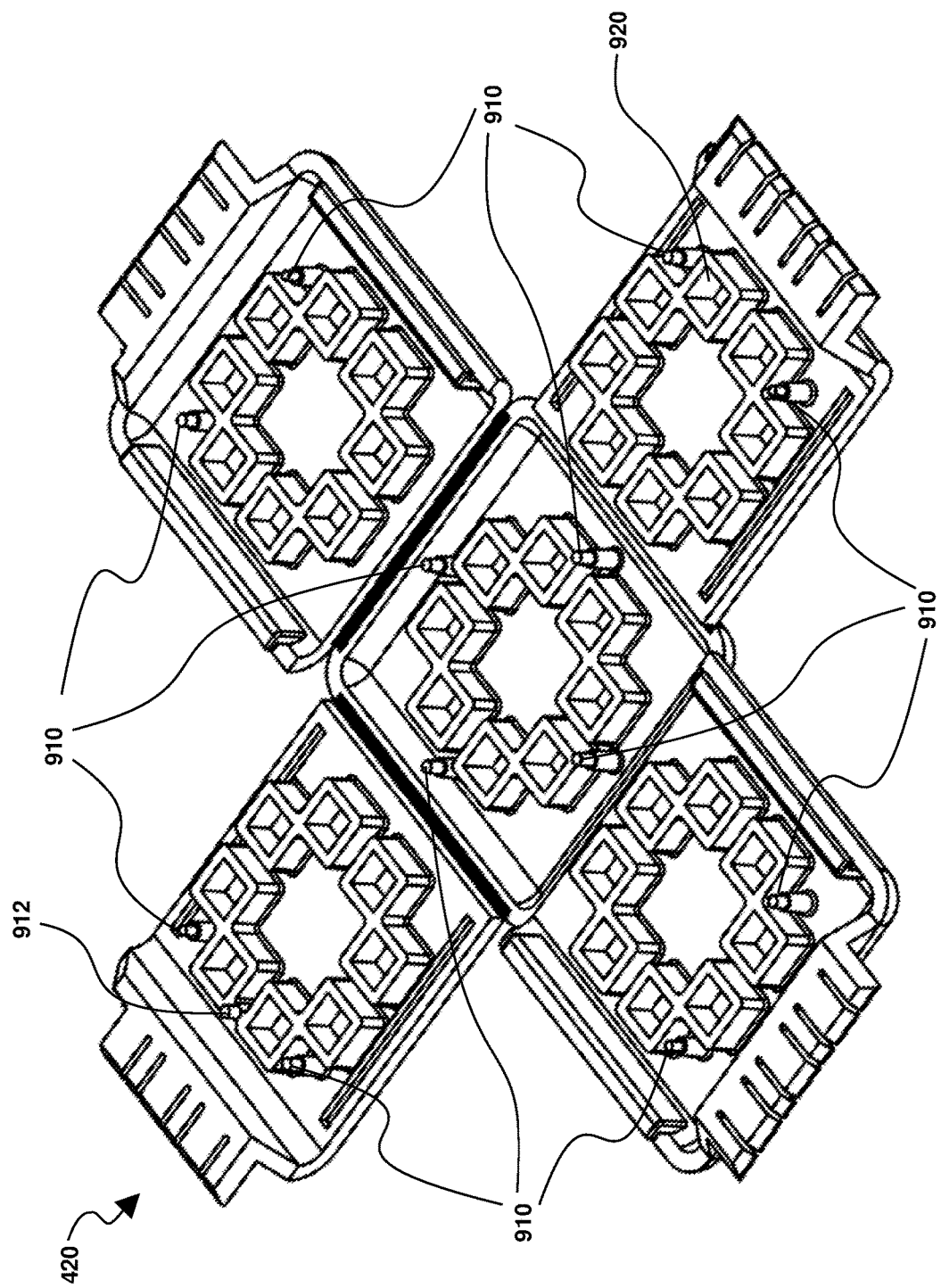
FIG. 9 shows a perspective top view of the unfolded frame of the end cube of FIG. 7.

FIG. 8 shows an example of an end cube housing 420 in a folded configuration and FIG. 9 shows a top perspective view of this same end cube housing 420 in an unfolded configuration. The embodiment of the end cube housing shown in these illustrations comprises one face for attachment to other cubes in a block and five faces for detachable attachment to other blocks. The five faces for detachable attachment to other blocks comprise circuit board attachment pins, shown at 910, and a circuit board orientation pin shown at 912. These pins 910 and 912 are configured to attach a peripheral cube flexible circuit board assembly (such as the circuit board assemblies shown at 1520 in FIG. 15) to the end cube housing. Typically, this attachment will be made by placing the flexible circuit board assembly over the pins using holes in the flexible circuit board assembly and then heat-staking these pins to permanently secure the flexible circuit board assembly, but such assembly of these components can be done using any assembly method capable of being understood by anyone skilled in the art. The one extra pin 912 is configured to match one extra hole in the printed circuit board assembly so that a flexible printed circuit board placed over the pins 910 and 912 can only fit in one way into the interior of the folded end cube housing 420, thereby preventing miss-assembly of the flexible printed circuit board into the end cube housing 420. The face for detachable attachment to other blocks that is opposite to the face for attachment to other cubes in the block comprises four circuit board attachment pins 910. The four other closed faces each comprise two pins circuit board attachment pins 910. One of these four other closed faces comprises the extra pin used for circuit board orientation 912.

FIG. 9 also shows that each of the five faces, for detachable attachment to faces of the other blocks, comprises eight sockets, an example of which is indicated at 920. These sockets 920 are located on the interior surface of the cube, when the cube is in its folded configuration. In the embodiment shown in FIG. 9, the sockets are square shaped. These sockets could be any other shape capable of being understood by anyone skilled in the art. The sockets 920 are configured for holding magnets and other elements, such as magnetically-attractive non-magnetic elements as will be described further in later sections of this document, starting with FIG. 18.

Further referring to FIG. 8 and FIG. 9, the face for attachment of the end cube housing to other cubes in a block comprises snaps. One example of such as snap can be seen at 930 in FIG. 8. These snaps 930 are configured for fixedly attaching the end cube housing 420 to other cubes by going into the aperture of one of the attachment faces of the other cube housing to form one of the blocks shown in FIG. 3A to FIG. 3H, and FIG. 4A to FIG. 4H. It should be noted that the face for attachment to another cube in a block comprises exactly three corner guides 940, with the fourth corner specifically not having a corner guide. These corner guides 940 serve as an orientation feature that, with other elements as will be further described later in this document, ensures that the end cube housing 420 can only be fixedly attached to the attachment face with an aperture of another cube in the block in one orientation.

Figure 10:
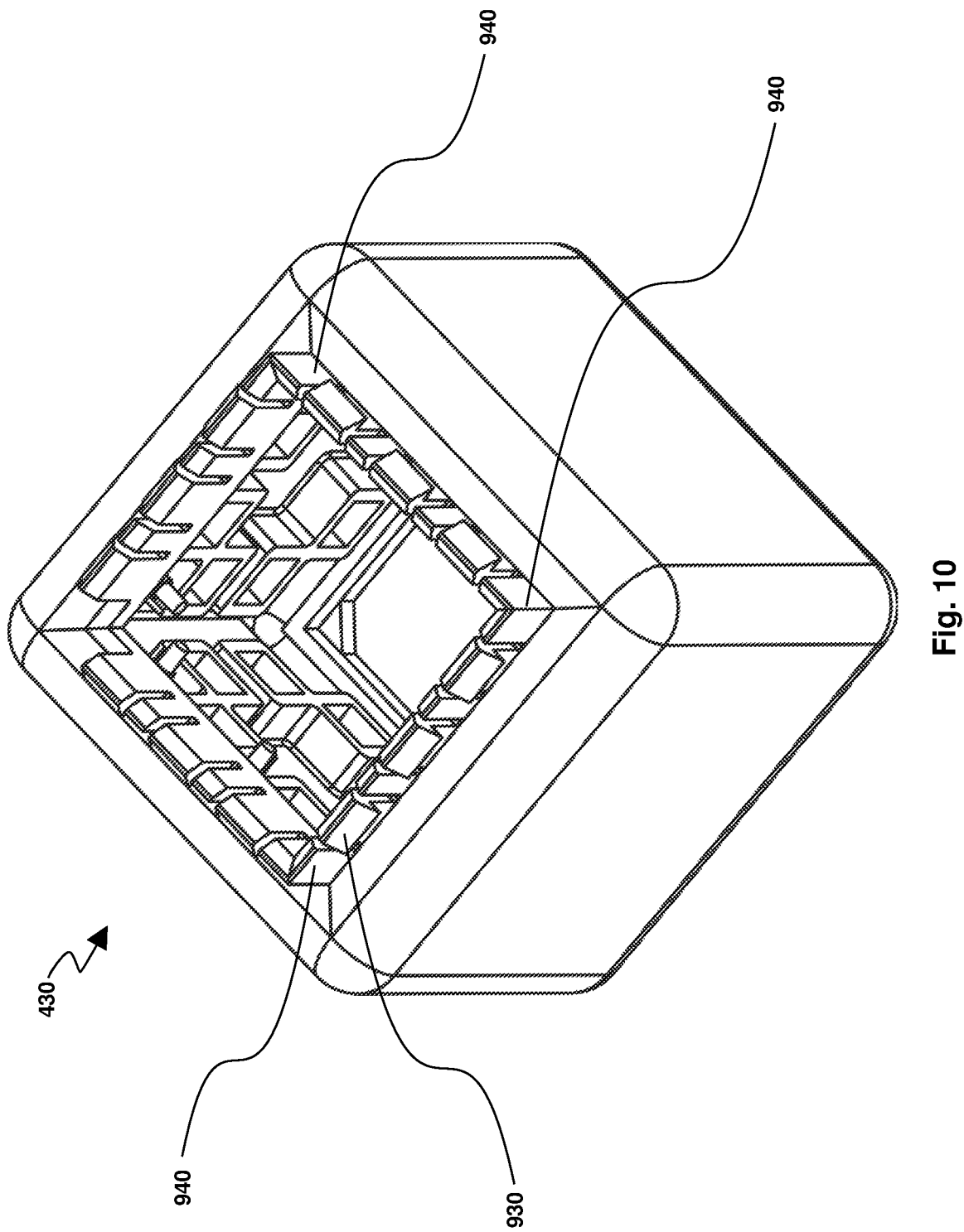
FIG. 10 is a perspective bottom view of the folded frame for a linear through cube.
Figure 11:
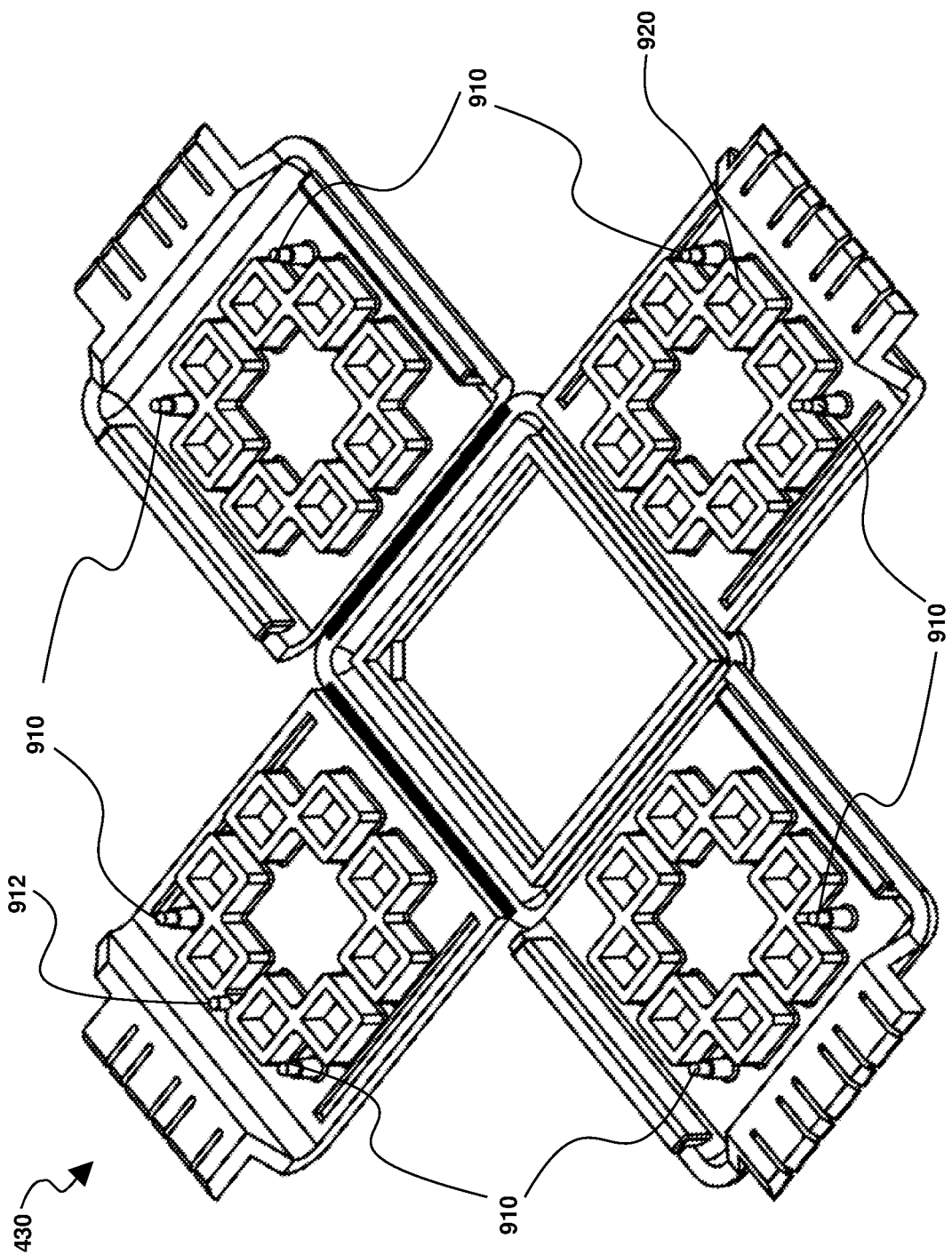
FIG. 11 shows a perspective top view of the unfolded frame of FIG. 9.

FIG. 10 shows an example of a linear through cube housing 430 in a folded configuration and FIG. 11 shows a top perspective view of this same linear through cube housing 430 in an unfolded configuration. The embodiment of the linear through cube housing shown in these illustrations comprises two faces for attachment to other cubes in a block and four faces for detachable attachment to other blocks. The four faces for detachable attachment to other blocks comprise circuit board attachment pins, shown at 910, and a circuit board orientation pin, shown at 912. Typically, this attachment will be made by placing the flexible circuit board assembly over the pins using holes in the flexible circuit board assembly and then heat-staking these pins to permanently secure the flexible circuit board assembly, but such assembly of these components can be done using any assembly method capable of being understood by anyone skilled in the art. The attachment and orientation 910 and 912 are configured so that a flexible printed circuit board placed over the pins 910 and 912 can only fit in one way into the interior of the folded end cube housing 420, thereby preventing miss-assembly of the flexible printed circuit board into the end cube housing 420. Each of the four faces for detachable attachment to other blocks comprises two attachment pins 910. The other three faces for detachable attachment to other blocks comprise two pins 910. One of these four other closed faces comprises the extra pin used for circuit board orientation 912. The interior surface of each of the four faces for detachable attachment to other blocks also comprises eight sockets, an example of which is indicated at 920. The sockets 920 are configured for holding magnets and magnetically-attractive non-magnetic elements as will be described further in later sections of this document, starting with FIG. 18.

Further referring to FIG. 10 and FIG. 11, one of the faces of the linear through cube housing 430 comprises an aperture, similar to the apertures of the hub cube housing, that is configured for receiving snaps from another cube in the block for attachment of this other cube to the linear through cube housing 430. The remaining face of the linear through cube housing 430 comprises snaps, an example of which can be seen at 930 in FIG. 10. These snaps 930 are configured for fixedly attaching the linear through cube housing 430 to other cubes by going into the aperture of one of the attachment faces of the other cube to form an I-block or an L-block as described previously. It should be noted that the face with the snaps for attachment to another cube in a block comprises exactly three corner guides 940, with the fourth corner specifically not having a corner guide. These corner guides 940 serve as an orientation feature that, with other elements as will be further described later in this document ensures that the linear through cube housing 430 can only be fixedly attached to the attachment face with an aperture of another cube in the block in one orientation.

Figure 12B:
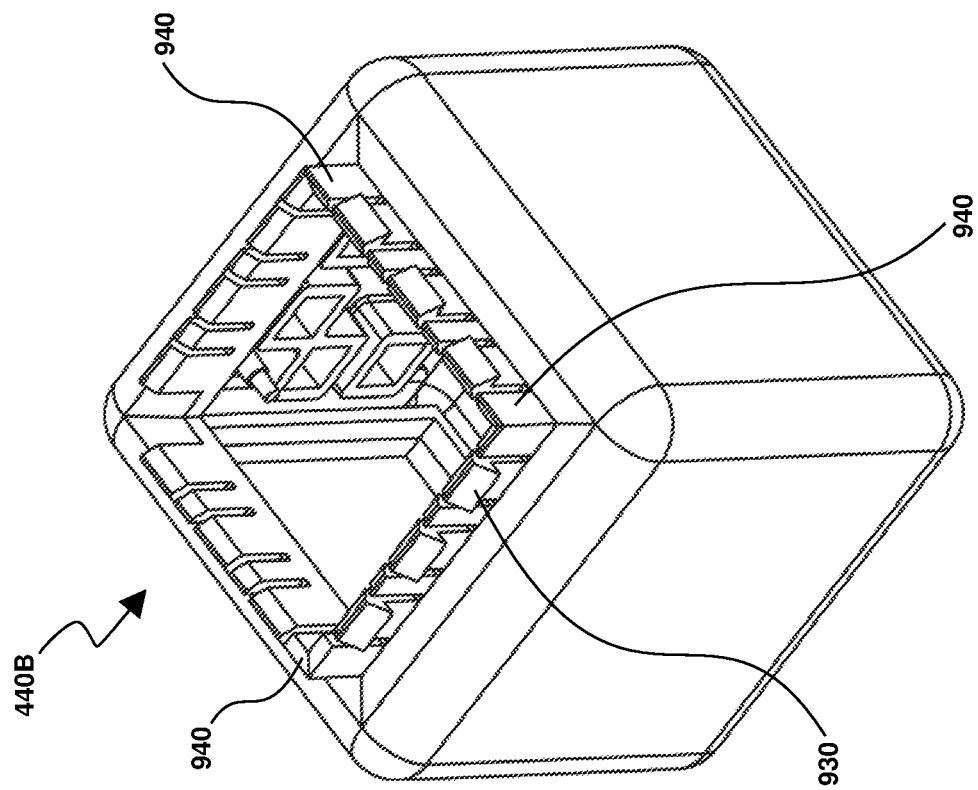
FIG. 12A and FIG. 12B show perspective top views of a folded frame of two variations (Variation A and Variation B) of a corner cube.
Figure 12A:
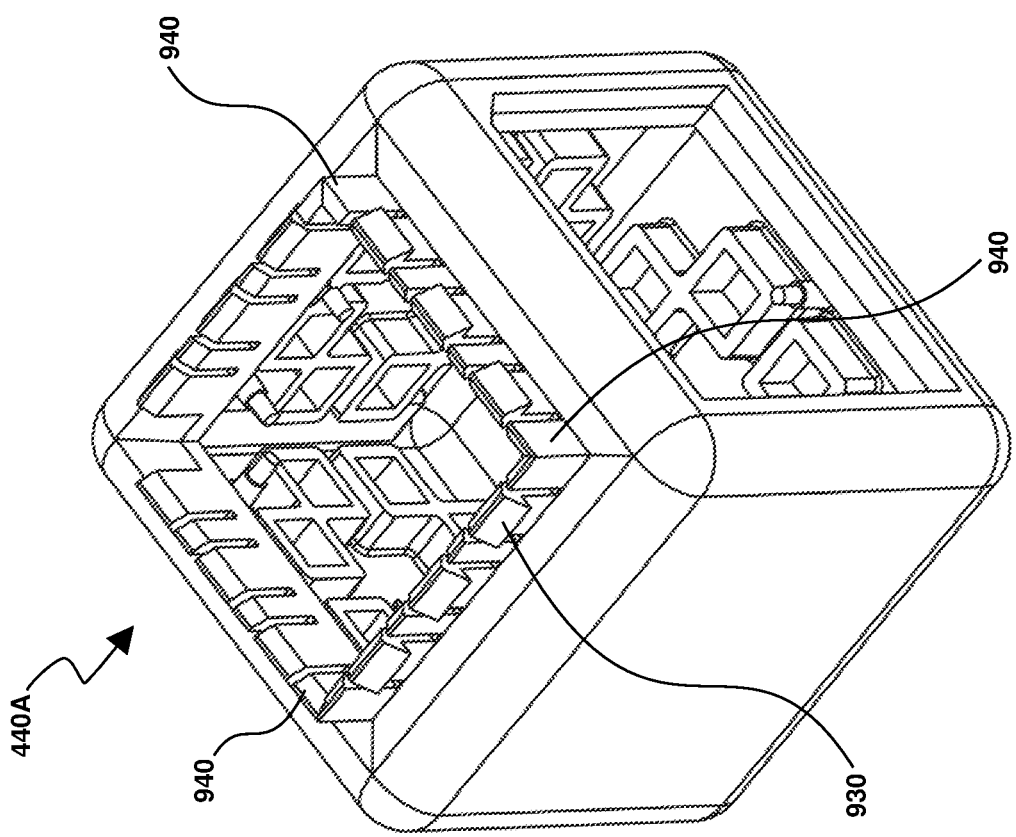
Figure 13B:
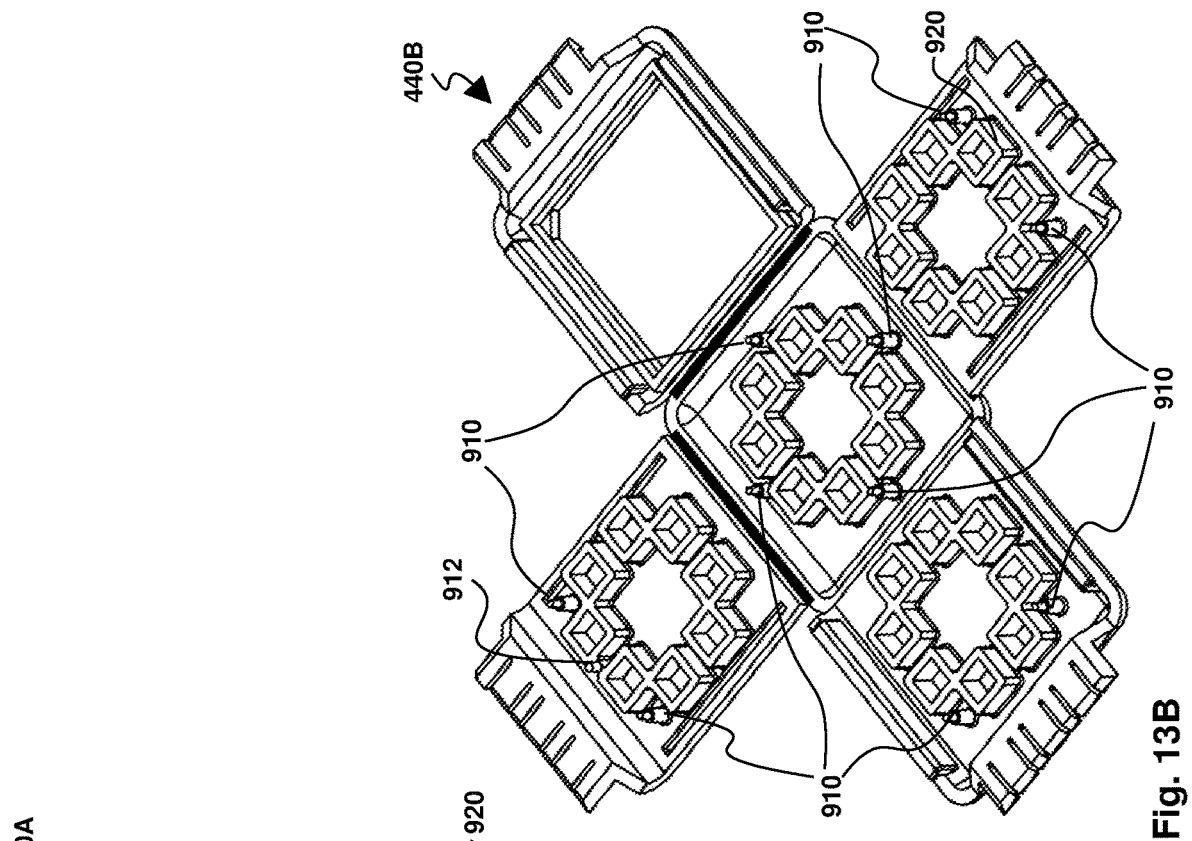
FIG. 13A and FIG. 13B show perspective bottom views of the unfolded frame of the two variations of the corner cubes of FIG. 12A and FIG. 12B.
Figure 13A:
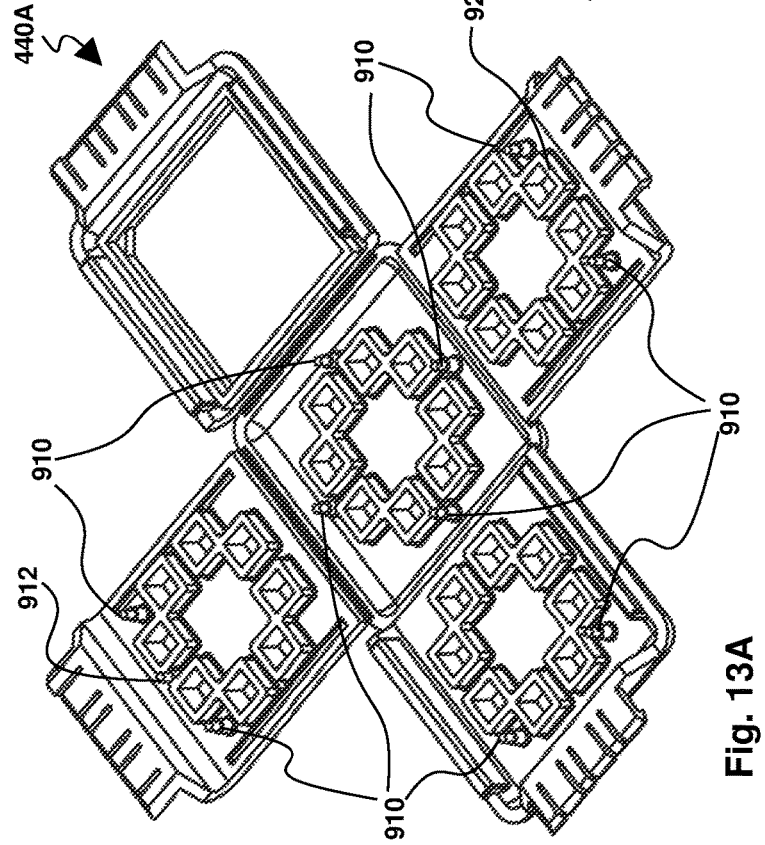

FIG. 12A shows an example of an A-type corner cube housing 440A in a folded configuration and FIG. 12B shows and example of a B-type corner cube housing 440A in a folded configuration. Similarly, FIG. 13A and FIG. 13B show top perspective views of two variations of this corner cube housing 440A and 440B in an unfolded configuration. These corner cube housings are similar to the linear through cube housing in having two faces for attachment to other cubes in a block and four faces for detachable attachment to other blocks. The four faces for detachable attachment to other blocks comprise circuit board attachment pins shown at 910 and an orientation pin, shown at 912. These pins 910 and 912 are configured so that a flexible printed circuit board placed over the pins 910 and 912 can only fit in one way into the interior of the folded end cube housing 420, thereby preventing miss-assembly of the flexible printed circuit board into the end cube housing 420. The face for detachable attachment to other blocks that is opposite to the face with the snaps for attachment to other cubes in the block (see 930 in FIG. 12A and FIG. 12B) comprises four of the circuit board attachment 910. The other three faces for detachable attachment to other blocks comprise two attachment pins 910. One of the faces for detachable attachment to other blocks comprises a circuit board orientation pin 912. These pins 910 and 912 function the same way as has been described previously in this document. The interior surface of each of the four faces for detachable attachment to other blocks also comprises eight sockets, an example of which is indicated at 920. The sockets 920 are configured for holding magnets and magnetically-attractive non-magnetic elements as will be described further in later sections of this document, starting with FIG. 18.

Further referring to FIG. 12A, FIG. 12B, FIG. 13A, and FIG. 13B one of the faces of the A-type and B-type corner cube housings comprises an aperture, similar to the apertures of the hub cube housing, that is configured for receiving snaps from another cube in the block for attachment of this other cube to the corner cube housing. The remaining open face of the A-type and B-type corner cube housings comprises snaps, an example of which can be seen at 930 in FIG. 12A and FIG. 12B. These snaps 930 are configured for fixedly attaching the A-type and B-type corner cube housings 440A and 440B to other cubes by going into the aperture of one of the attachment faces of the other cube to form an R-block, S-block, or Z-block as described previously. It should be noted that the face with the snaps for attachment to another cube in a block comprises exactly three corner guides 940, with the fourth corner specifically not having a corner guide. These corner guides 940 serve as an orientation feature that, with other elements as will be further described later in this document ensures that the A-type or B-type corner cube housing 440A or 440B can only be fixedly attached to the attachment face with an aperture of another cube in the block in one orientation. The difference between the A-type and the B-type corner cube housings, 440A or 440B, is the location of the face without the snaps for attachment to other cubes in the block, relative to the three corner guides, as can be seen by comparing FIG. 12A with FIG. 12B.

FIG. 14A, FIG. 14B, and FIG. 14C illustrate how an orientation feature can be used to ensure that cubes are always assembled in the correct orientation. More specifically, FIG. 14A shows a perspective view of an A-type hub cube housing 410A next to a linear through cube housing 430, FIG. 14B shows an end view of the A-type hub cube housing 410A next to the linear through cube housing 430, and FIG. 14C shows a perspective view of the A-type hub cube housing 410A and linear through cube housing 430 rotated and ready to snap together. As can be seen from these illustrations, the receptacle face of the A-type hub cube housing 410A has three sharp corners, shown at 960, and one filleted corner, shown at 950. The sharp corners 960 are configured to receive the corner guides 940 of the plug face of the linear through cube housing 430. The filleted corner 950 prevents these corner guides 940 from entering the receptacle face of the A-type hub cube housing 410A. Thus, the A-type hub cube housing 410A can only be attached to the linear through cube housing 430 in one prescribed orientation. This method of preventing miss-assembly or "mistake-proofing" can also be referred to by the Japanese term "poka-yoke."

Figure 15:
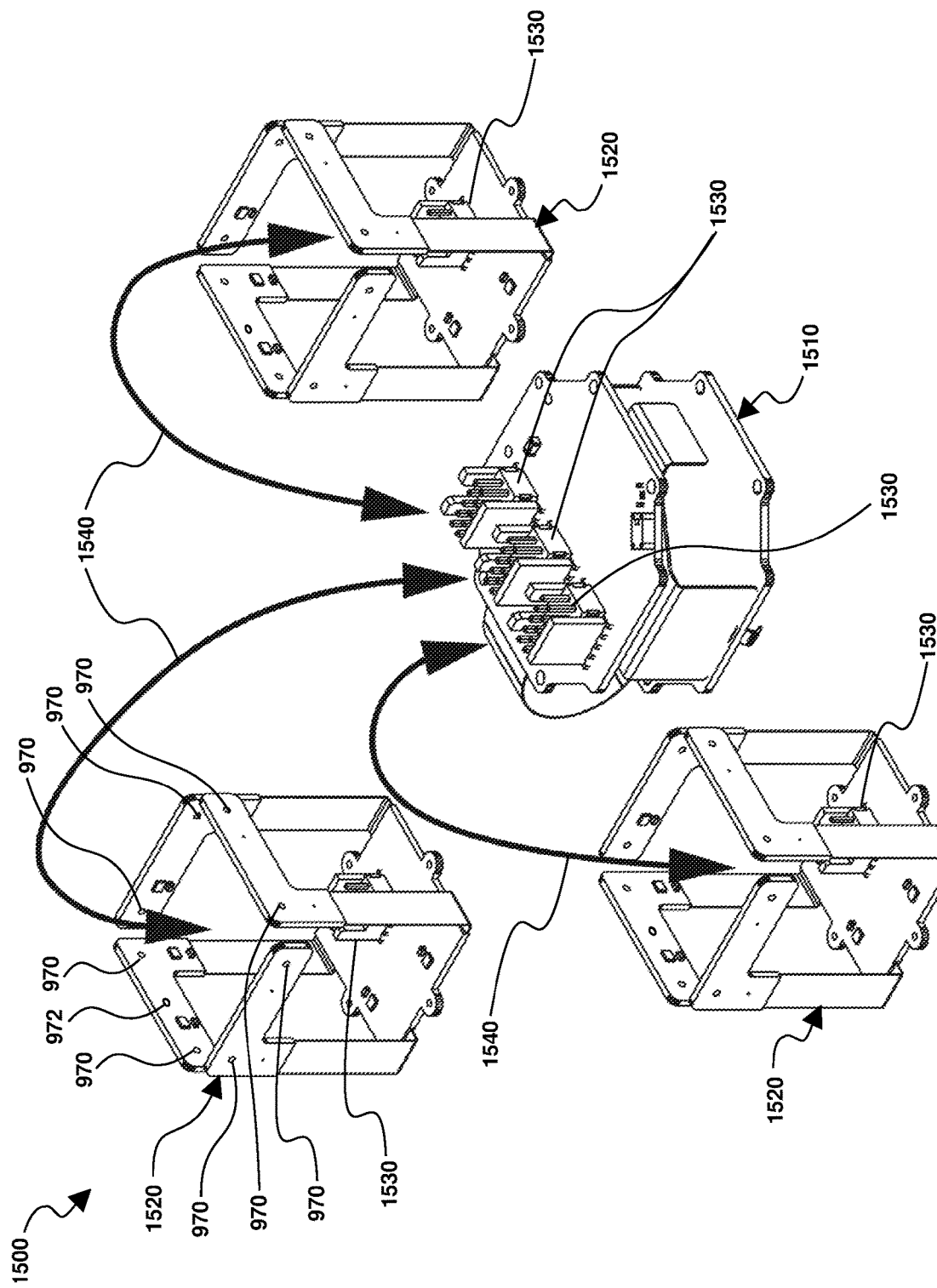
FIG. 15 shows an example of how the electronics in various cubes can be connected to create the electronics for a block.

FIG. 15 shows an example of an electronic system for a block at 1500. In particular, FIG. 15 shows how the electronics in various cubes can be connected to create the electronics for a block. Specifically shown are a hub cube flexible printed circuit board assembly 1510 in a folded configuration, and three end cube flexible printed circuit board assemblies, shown at 1520. The components and functions of these flexible printed circuit board assemblies (1510 and 1520) will be further described with reference to FIG. 24A. The end cube flexible printed circuit board assemblies 1520 are configured to fit into the end cube housing (shown at 420 in FIG. 8 and FIG. 9). It can be understood that circuit board assemblies similar to the end cube circuit board assembly can be made to fit the linear through cube housing (shown at 430 in FIG. 10 and FIG. 11), the A-type corner cube housing (shown at 440A in FIG. 12A and FIG. 13A), and the B-type corner cube housing (shown at 440B in FIG. 12B and FIG. 13B). The hub cube flexible printed circuit board assembly 1510 can be configured to connect to the end cube flexible printed circuit board assemblies 1520 using any wired or wireless interconnection system or method cable of being understood by anyone skilled in the art. In the embodiment shown in FIG. 15, the hub cube flexible printed circuit board assembly 1510 is configured to connect to the end cube flexible printed circuit board assemblies 1520 using electrical cable connectors, shown at 1530, and electrical ribbon cables, which are not shown directly, but are represented by the arrows shown at 1540.

Further referring to the end cube circuit assemblies 1520 in FIG. 15, it can be seen that there are two circuit board attachment holes 970 in each of the parts of these circuit assemblies that will mate with the two circuit board attachment pins 910 shown in FIG. 9, for the side walls of the end cube housing 420 in FIG. 9. There also one circuit board orientation hole 972 to orient the end cube circuit assemblies correctly in the end cube housings 420.

FIG. 16A shows the hub cube flexible printed circuit board assembly 1510 in a flat configuration. FIG. 16B shows the hub cube flexible printed circuit board assembly 1510 in a folded configuration. The electronics mounted on the hub cube flexible printed board assembly 1510 will be further described with reference to FIG. 23. The folded configuration of the hub cube flexible printed circuit board assembly 1510, shown in FIG. 16B is configured to fit inside:

The A-type hub cube housing, shown at 410A in FIG. 5, FIG. 6, and FIG. 7;
The B-type hub cube housing, shown at 410B in FIG. 7B;
The C-type hub cube housing, shown at 410C in FIG. 7C; and
The D-type hub cube housing, shown at 410D in FIG. 7D.

Figure 17B:
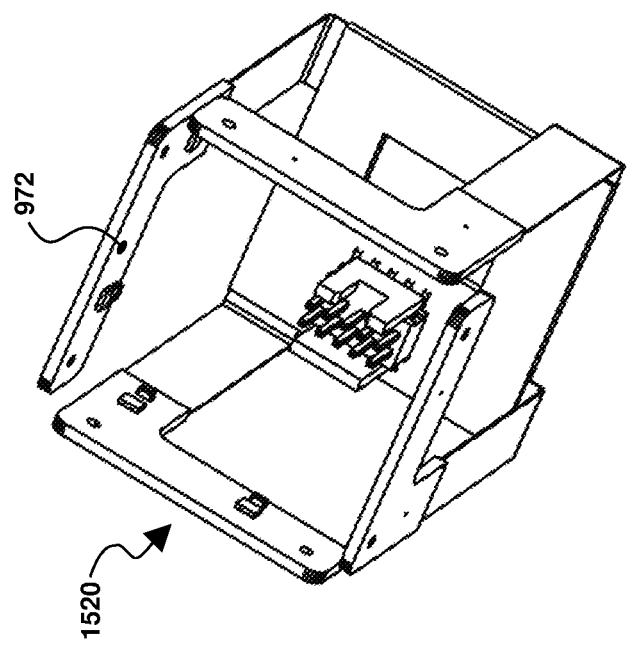
FIG. 17B is a view of the folded configuration of the electronics in FIG. 17A.
Figure 17A:
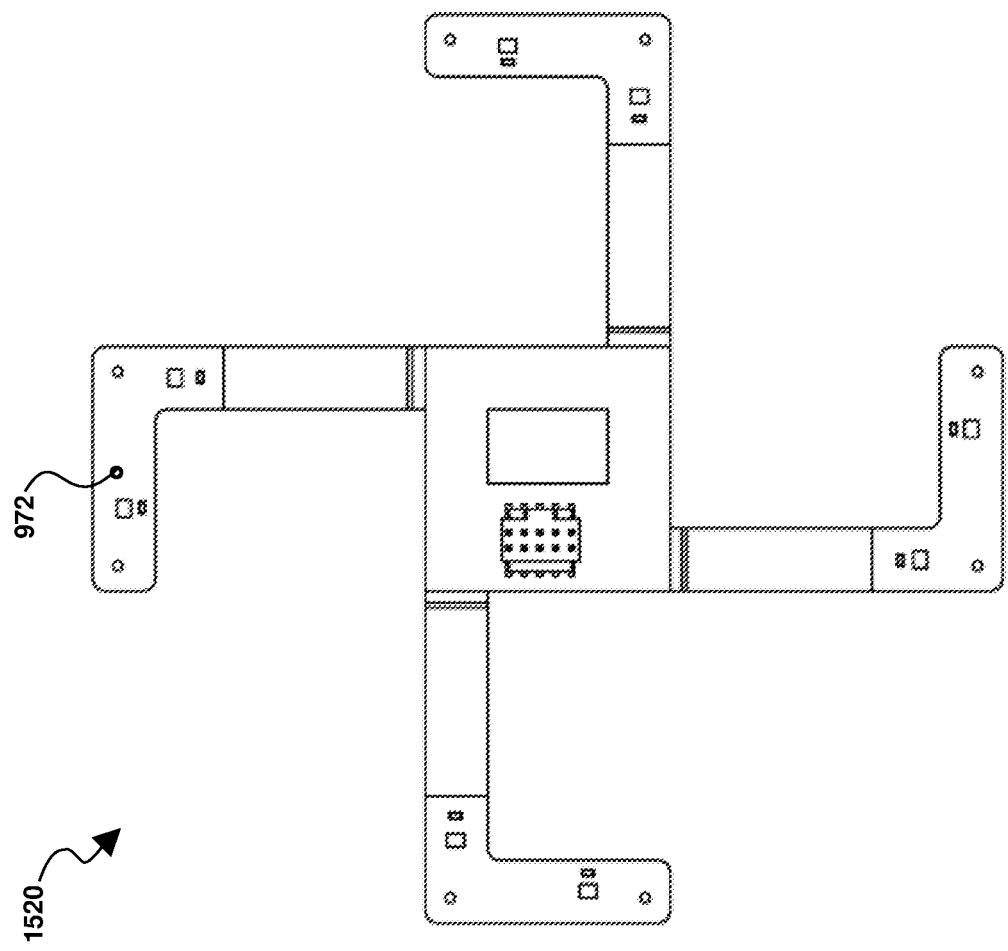
FIG. 17A is the electronics in an end cube, linear through cube, or corner cube.

FIG. 17A shows the end cube flexible printed circuit board assembly 1520 in an unfolded configuration. FIG. 17B shows the end cube flexible printed circuit board assembly 1520 in a folded configuration. As described previously, the end cube flexible circuit board assembly can be used for the end cube housing shown at 420 in FIG. 8 and FIG. 9. A similar flexible printed circuit board assembly would be used with the linear through cube housing (shown at 430 in FIG. 10 and FIG. 11) and either of the two variations of the corner cube housing (shown at 440A in FIG. 12A and FIG. 13A and at 440B in FIG. 12B and FIG. 13B). Also shown in FIG. 17A and FIG. 17B is the circuit board orientation hole 972 that is on only one leg of the end cube flexible printed circuit board assembly 1520.

Figure 18:
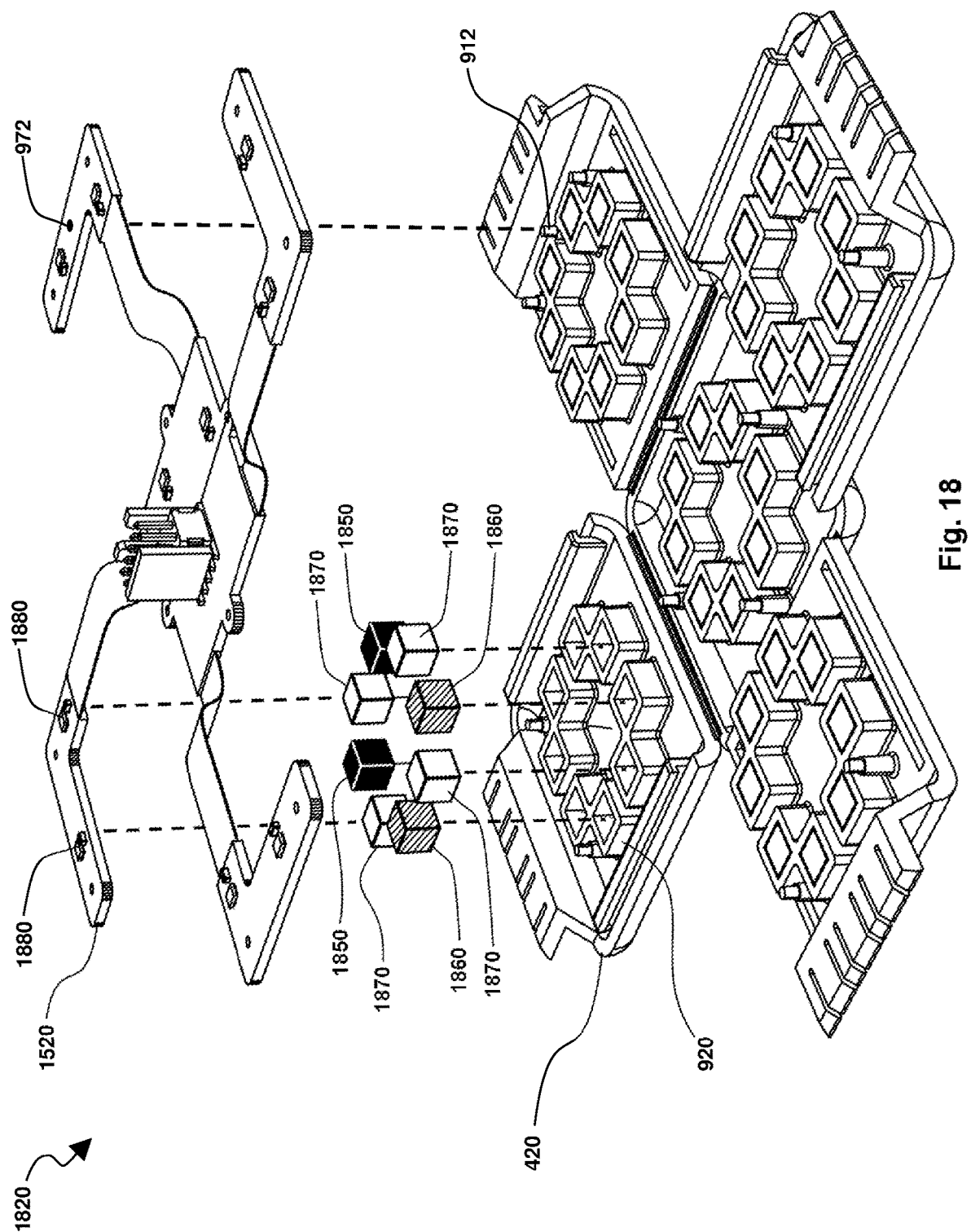
FIG. 18 is an exploded view of a flat end cube, steel cubes, magnets, and circuits.

FIG. 18 shows an exploded view of the components in an end cube assembly 1820 for one embodiment of the invention described herein. The end cube assembly 1820 comprises the previously shown end cube housing 420 and the previously shown end cube flexible printed circuit board assembly 1520. These components (1820 and 420) are shown in the flattened configuration, but it can be understood based on what has been shown and described in earlier parts of this document, how these components can be folded into an end cube assembly 1820, for attachment to other cubes in a block. This illustration shows how the circuit board orientation pin 912 fits into the circuit board orientation hole 972.

As shown in FIG. 18, the end cube assembly 1820 further comprises one or more magnets, which could be A-polarity magnets, shown as black small cubes at 1850 and/or B-polarity magnets, shown as shaded small cubes at 1860. These magnets (1850 and/or 1860) fit into the previously described sockets 920 on an interior surface of the end cube housing 420. There are also one or more magnetically-attractive non-magnetic elements, shown as unshaded small cubes at 1870, that fit into these same square-shaped sockets 920. It can be seen that the A-polarity magnets 1850, B-polarity magnets 1860, and non-magnetic magnetically-attractive elements 1870 are positioned in an octagonal configuration in which magnets (1850 and 1860) alternate with the magnetically-attractive non-magnetic elements 1870.

Each detection face of the end cube assembly 1820 also comprises one or more unipolar magnetic detectors, shown at 1880. In the embodiment shown in FIG. 18, the unipolar magnetic detectors 1880 are mounted on the end cube flexible printed circuit board assembly 1520. The unipolar magnetic detectors 1880 could be mounted into the interior of the end cube assembly 1820 and connected to an electronic circuit using any method capable of being understood by anyone skilled in the art. In the end cube assembly shown in FIG. 18, the unipolar magnetic detectors 1880 are located on the interior of the magnetically-attractive non-magnetic elements 1870 when the end cube assembly 1820 is folded up into a cube. By interior (or internally), in this document and the appended claims, we mean further from the face than the associated magnetically-attractive non-magnetic elements. Thus, the unipolar magnetic detectors 1880 are on the opposite side of the magnetically-attractive non-magnetic elements 1870 from the interior wall of the face of the end cube assembly.

It is worth highlighting the difference between an omnipolar and a unipolar magnetic detector. An omnipolar magnetic detector detects the strength of a magnetic flux field and doesn't discriminate the polarity of this magnetic flux field. In this document and the appended claims, a unipolar magnetic detector 1880 is defined as a sensor that responds differently to the north pole of a magnet than to the south pole of a magnet, and therefore can have three states:
 (1) Detection of a north pole of a magnet;
 (2) Detection of a south pole of a magnet; and
 (3) No detection of a magnet.

FIG. 19A and FIG. 19B are section views of pairs of faces that use unipolar magnetic detectors 1880 located behind magnetically-attractive non-magnetic elements 1870 (i.e., on the side opposite from the face) to detect a magnet and its polarity on an opposite face. In FIG. 19A the opposite face comprises an A-polarity magnet 1850. In FIG. 19B the opposite face comprises a B-polarity magnet 1860. Magnetic flux lines and their orientation with arrows pointing from north to south, are shown at 1890 in both illustrations. For completeness, the section views in FIG. 19A and FIG. 19B also show a circuit board to which the detectors are mounted at 1520. This circuit board 1520 could be the end cube flexible circuit board assembly shown at 1520 in FIG. 18 or any similar circuit board assembly capable of being understood by anyone skilled in the art. Also shown in FIG. 19A and FIG. 19B are a section of the housing 420A similar to what was shown at 420 in FIG. 18, and it can be recognized that a non-magnetic magnetically-attractive element 1870 is sitting in a socket in this housing, as was illustrated in the exploded view shown in FIG. 18. The opposite face (in FIG. 19A and FIG. 19B) also comprises a housing 420B similar to what was shown at 420 in FIG. 18. It can be recognized that this an A-polarity magnet 1850 is sitting in a socket in this housing 420B in FIG. 19A. It can be recognized that a B-polarity magnet 1860 is sitting in a socket in this housing 420B in FIG. 19B.

FIG. 19C shows the response to an input for the unipolar magnetic detector 1880 in FIG. 19A that detects the flux lines from the A-polarity magnet 1850. FIG. 19D shows the response for the unipolar magnetic detector 1880 in FIG. 19B that detects the flux lines from the B-polarity magnet 1860. As illustrated in FIGS. 19C and 19D, the unipolar magnetic detector (1880 in FIG. 19A and FIG. 19B) is powered up by an input signal, shown at 1910. This input signal 1910 can be called a detector input signal. It can also be called a microcontroller digital output signal, as will be shown at 1910A, 1910B, and 1910C in FIG. 25. Once powered up, the two output channels 1920 and 1930 of the unipolar magnetic detector can provide one of three state signals:
 (1) Neither detector output (1920 or 1930) goes high, which indicates that no magnet is detected;
 (2) Output 1 (1920) goes high and Output 2 (1930) stays low, which indicates that an A-polarity magnet is detected; or
 (3) Output 2 (1930) goes high and Output 1 (1920) stays low, which indicates that a B-polarity magnet is detected.

Benefits of the configuration shown in FIG. 18, FIG. 19A and FIG. 19B can include:
 (a) Blocks are never repelled;
 (b) The number of unique orientations is determined by the number of magnetically-attractive non-magnetic elements;
 (c) A minimal number of magnets are needed; and
 (d) A minimal number magnetic detectors are needed for determining orientation.

It should be understood that the same principles described with reference to the configuration and operation of the end cube assembly 1820 in FIG. 18 could also be to any other cube described herein, such as an assembly that comprises a hub cube, a linear through cube, and/or a corner cube. It should also be understood that these principles could be applied to more than just square faces. The same concepts can also apply for triangular or pentagonal faces, for example. Referring to FIG. 18, as an example for triangular faces there could be six sockets and for pentagonal faces, there could be ten sockets. The six sockets on a triangular face could be in a hexagonal pattern and used for three magnets and three magnetically-attractive non-magnetic elements. The ten sockets on a pentagonal face could be in a decagonal (10-sided) pattern and used for five magnets and five magnetically-attractive non-magnetic elements.

FIG. 20A, FIG. 21A, FIG. 22A, and FIG. 23A show a face of an L-block 320 attached to a face of a T-block 350 with the L-block 320 in four different 90-degree rotations. The magnetic user detachable interface between these two blocks in these illustrations is in the region shown by the oval dotted lines at 2000. The depiction of the T-block and L-block in FIG. 20A is similar to the block assembly shown at 110 in FIG. 1. The rotations of the L-Block 320 relative to the face of the T-block 350 that are shown in FIG. 21A, FIG. 22A, and FIG. 23A show the different 90-degree rotations from the rotation of FIG. 20A that are supported by the configurations of the A-polarity and B-polarity magnets (1850 and 1860) and magnetically-attractive non-magnetic elements (1870) that were illustrated in FIG. 18, FIG. 19A and FIG. 19B and are also shown in the exploded views shown in FIG. 20B, FIG. 21B, FIG. 22B, and FIG. 23B. These configurations can be read by the unipolar magnetic detectors, shown at 1880A, 1880B, 1880C, and 1880D that are specifically-identified detectors of the type that were shown at 1880 in FIG. 18, FIG. 19A, and FIG. 19B and are also shown in FIG. 20B, FIG. 21B, FIG. 22B, and FIG. 23B. The unipolar magnetic detectors 1880A, 1880B, 1880C, and 1880D are mounted on circuit boards 1520 shown in these same illustrations. Parts of the end cube housing were shown at 420A and 420B in FIG. 19A and FIG. 19B are also illustrated in FIG. 20B, FIG. 21B, FIG. 22B, and FIG. 23B. In these illustrations, the A-polarity magnets 1850 are shown as small black cubes, the B-polarity magnets 1860 are shown as small shaded cubes, and the magnetically-attractive non-magnetic elements are shown as white cubes.

It should be noted that the magnetically-attractive non-magnetic elements 1870 that have been shown in various drawings can be made of any magnetically-attractive non-magnetic material, the most common of which is steel. Thus these, elements 1870 could be steel cubes, or any section of a steel rod capable of being fabricated and capable of being understood by anyone skilled in the art.

FIG. 20C, FIG. 21C, FIG. 22C, and FIG. 23C are simplified diagrams that show only the unipolar magnetic detectors (1880A, 1880B, 1880C, and 1880D), A-polarity magnets 1850, B-polarity magnets 1860, and magnetically-attractive non-magnetic elements 1870 of FIG. 20B, FIG.

21B, FIG. 22B and FIG. 23B to illustrate how the unipolar magnetic detectors (1880A, 1880B, 1880C, and 1880D) read the relative orientations of the adjacent cube faces. The A-polarity magnets are shown as small solid squares at 1850. The B-polarity magnets are shown as small shaded squares at 1860. The magnetically-attractive non-magnetic elements are show as small white squares at 1870. The dotted arrows in these diagrams show which magnet is read by which detector.

FIG. 20D, FIG. 21D, FIG. 22D, and FIG. 23D schematically illustrate the detector readings that are diagramed in FIG. 20C, FIG. 21C, FIG. 22C, and FIG. 23C. Referring to FIG. 20C and FIG. 20D, it should be clear that unipolar magnetic detector 1 (D1, shown at 1880A) is reading the magnetic flux of the B-polarity magnet shown at 1860A that is transmitted through the magnetically-attractive non-magnetic element shown at 1870A. Similarly, unipolar magnetic detector 2 (D2, shown at 1880B) is reading the magnetic flux of the B-polarity magnet shown at 1860B that is transmitted through the magnetically-attractive non-magnetic element shown at 1870B. Also similarly, unipolar magnetic detector 3 (D3, shown at 1880C on the opposing face) is reading the magnetic flux of the B-polarity magnet shown at 1860C that is transmitted through the magnetically-attractive non-magnetic element shown at 1870C. Additionally, unipolar magnetic detector 4 (D4, shown at 1880D) is reading the magnetic flux of the B-polarity magnet shown at 1860D that is transmitted through the magnetically-attractive non-magnetic element shown at 1870D. FIG. 21C and FIG. 21D show this same system for reading the polarity of magnets on opposing faces when the L-cube (shown at 320 in FIG. 21A) is rotated 90 degrees clockwise relative to the T-cube 350, as was shown in FIG. 21A when compared to FIG. 20A. FIG. 22C and FIG. 22D show this same system for reading the polarity of magnets on opposite faces when the L-cube (shown at 320 in FIG. 22A) is rotated 180 degrees clockwise relative to the T-cube 350, as was shown in FIG. 22A when compared to FIG. 20A. FIG. 23C and FIG. 23D show this same system for reading the polarity of magnets on opposite faces when the L-cube (shown at 320 in FIG. 23A) is rotated 90 degrees clockwise relative to the T-cube 350, as was shown in FIG. 23A when compared to FIG. 20A. From these illustrations, it should be clear that the detectors on one face (D1, shown at 1880A, and D2 shown at 1880B) can independently determine the orientation of the adjacent face and that the detectors on the adjacent face (D3, shown at 1880C, and D4, shown at 1880D) can also independently determine the orientation of the face that has D1 and D2 on it. These drawings also illustrate that the two faces can only be magnetically attached and detached from each other in one of four orientations.

It should be noted that a similar methodology using unipolar magnetic detectors, A-polarity magnets, B-polarity magnets, and magnetically-attractive non-magnetic elements could be used for other polygonal faces, such as three-sided polygons (triangles), five-sides polygons (pentagons), etc.

It should also be noted that other communication methods for determining the relative orientations of adjacent faces could also be used, either as a replacement for the unipolar magnetic detectors or as a supplement to these unipolar magnetic detectors. For example, inertial measurement units (IMUs) could be used in each block and the relative orientation of these IMUs could be used to determine the orientation of attached adjacent faces. It is also possible to use fewer magnetic detectors (such as one unipolar detector per face) plus communication between the faces to detect relative orientations. It would be possible to use more detectors and more magnets on each face to detect the orientation of two faces at a higher resolution. The magnets and detectors could have different shapes and different placements. In fact, any of the concepts associated with rotary encoders, including placing the detectors and magnets at different distances from the center of the faces, could be used to in embodiments of the inventions disclosed herein. All of these variations, and others capable of being understood by those skilled in the art can be considered embodiments of the inventions disclosed herein.

FIG. 24A shows the electronics in a block 1500 and its interface to a computer 150 and selection pen 120. The block 1500 shown in FIG. 24A is the same as the block that was shown at 1500 in FIG. 15. FIG. 15 shows a physical implementation of these block electronics 1500 and FIG. 24A shows an electronic functional diagram. Referring to FIG. 24A, the electronic system 1500 comprises a microcontroller 2310, that is typically located in a hub block (i.e., on the hub cube flexible circuit board assembly shown at 1510 in FIG. 15). Also typically located on this hub cube flexible circuit board assembly 1510 and connected to the hub block microcontroller 2310 is a communication module 2320 configured for wireless communication 160 to devices such as the computer 150 and selection pen 120. This wireless communication could use any protocol capable of being understood by anyone skilled in the art, as was described with reference to FIG. 1.

As shown in FIG. 24A, the electronic system 1500 can be powered by a battery 2330 and can comprise one or more light emitting diodes 2340 (LEDs) to provide visual feedback information to a user. The electronic system 1500 can comprise an inertial measurement unit 2350 (IMU) and this IMU can comprise one or more accelerometers, gyroscopes and magnetometers. The IMU can be used to determine the orientation of a block. Independent of the IMU 2350, the electronic system 1500 can comprise one or more accelerometers 2350. The IMU 2360 and/or accelerometer(s) 2360 can communicate with the microcontroller 2310 using an industry-standard serial connection such as the I2C bus. The electronic system 1500 can also comprise a three-dimensional Hall Effect sensor 2370 which can be used to detect a magnet in the selection pen, as will be further described with reference to FIG. 26A, FIG. 26B, and FIG. 26C.

One of the key functions of the electronic system 1500 shown in FIG. 24A is the detection of the faces of adjacent blocks and the orientation in which they are attached. To illustrate how this is done in embodiments of the invention, FIG. 24B shows an exploded view of an L-block 320 attached to a T-block 350, a configuration and orientation that was also illustrated in FIG. 23A, and was illustrated in other relative orientations between these two blocks in FIG. 1, FIG. 20A, FIG. 21A, and FIG. 22A. FIG. 24B also identifies three faces on the T-block 350 that have been labeled as 352 (for face F1), 354 (for face F2), and 356 (for Face Fn). The third labeled face 356 has been called Face Fn to represent the fact that there are many more faces of the T-block 350 that each could be labeled separately and have unipolar magnetic detectors (such as those shown at 1880 in previous figures) to detect the attachment of the faces of other blocks.

FIG. 24C shows what is detected by the unipolar magnetic sensors on the three labeled faces (F1 or 352, F2 or 354, and Fn or 356) of the T-block 350 of FIG. 24C when the L-block 320 is attached as shown in FIG. 24B. Since there is no block attached to face F2 (354) or face Fn (356) in FIG. 24B, the detectors on these faces (D1 for face 2 shown at 1880E, D2 for face F2 shown at 1880F, D1 for Face Fn shown at 1880G, and D2 for face Fn shown at 1880H) produce no output signal. As shown in FIG. 23D, the unipolar magnetic detectors (D1 and D2) for face F1 will produce a B-polarity signal at unipolar magnetic detector D1 (shown at 1880A) and an A-polarity signal at unipolar magnetic detector D2 (shown at 1880B).

Referring back to FIG. 24A, the power-on connections (Vcc) for the same unipolar magnetic detectors 1880A, 1880B, 1880E, 1880F, 1880G, and 1880H of FIG. 24C are shown electrically connected to attached to digital outputs for the microcontroller 2310. Thus, the unipolar magnetic detectors on each face (352, 354, and 356 in FIG. 24B and FIG. 24C) can selectively be powered up to selectively detect whether a face of a block has been attached to another block. The outputs of the unipolar magnetic detectors can then be read on digital input ports of the microcontroller. Thus, the signals from the unipolar magnetic detectors can be multiplexed.

Figure 25:
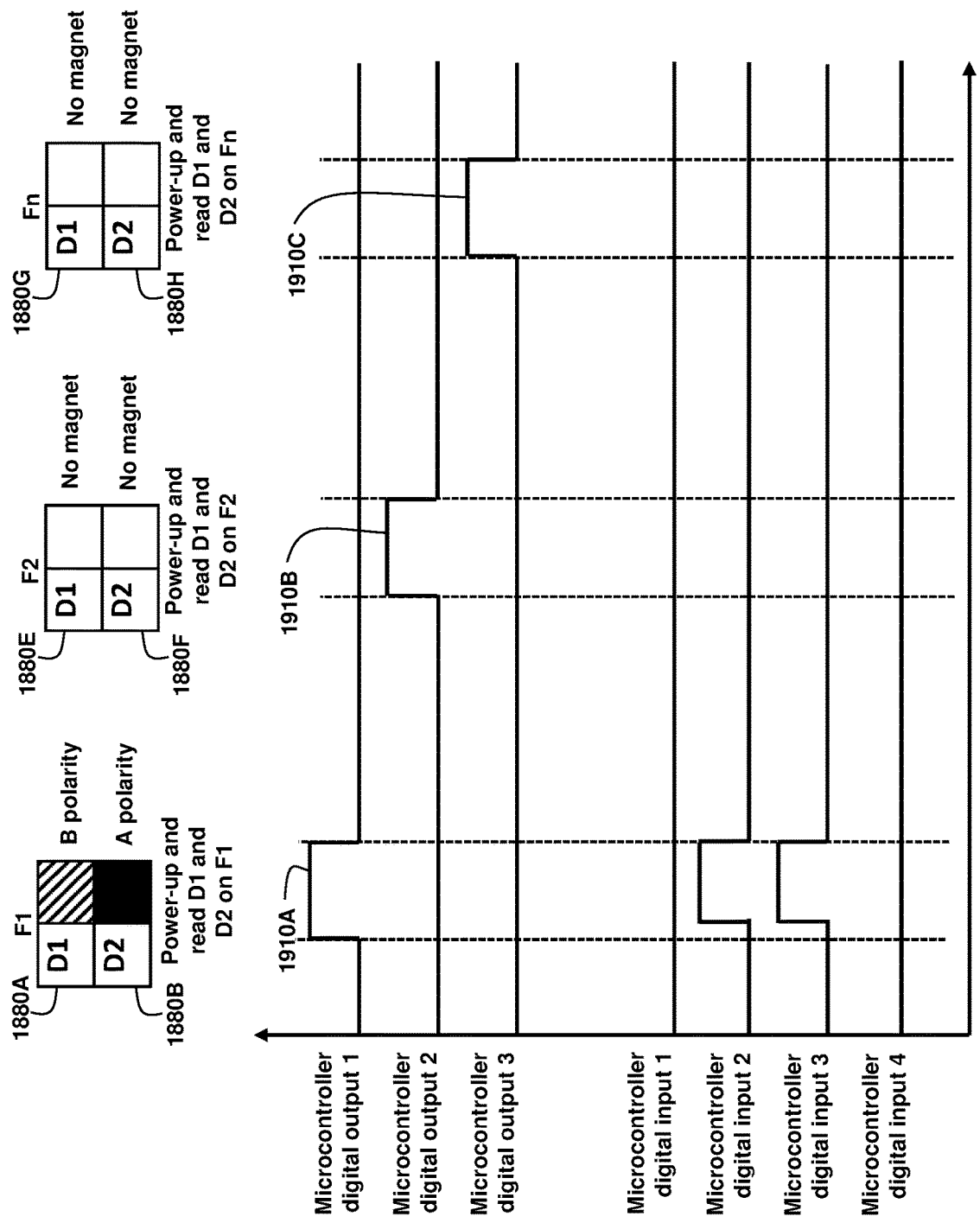
FIG. 25 is a timing diagram for reading multiple detectors in the system of FIG. 24A.

FIG. 25 is a timing diagram for reading multiple detectors in the system of FIG. 24A, FIG. 24B, and FIG. 24C that illustrates the multiplexing of the signals from the unipolar magnetic detectors 1880A, 1880B, 1880E, 1880F, 1880G, and 1880H that were shown in the previous illustrations. Referring to FIG. 25, the digital outputs from the microcontroller operate in two states:

(a) An output pin can be configured as output and asserted as a high voltage as shown at 1910A, 1910B, and 1920C, which activates any unipolar magnetic detectors connected to this pin; or (b) An output pin can be configured as input, without any pull-up feature/High Impedance, which means that any connected unipolar magnetic detectors are not powered and the voltage is floating.

Note that we cannot use these microcontroller digital output pins as being asserted in a low state since this would force the connected Hall Effect Sensor to have the pins tied to the ground while parallel circuits may be asserted high.

Further referring to FIG. 25, here is an example of how the system operates based on the timing diagram provided.

(a) When digital output 1 is acting as output and high while all remaining ones are configured as inputs at a high impedance, the Hall Effect output of the connected unipolar magnetic detectors registers after a small delay, that's on the order of microseconds.

(b) Digital inputs 1, 2, 3, and 4 can be sampled at a high frequency and the resulting values can be stored as data by the microcontroller (2310 in FIG. 24A). These readings represent the two output channels from each unipolar magnetic detector 1880, as was discussed and presented previously.

(c) Digital output 1 can then be configured as "Input" at a high impedance, and the next digital output (digital output 2) input I can be configured can be made active and the same readings on the digital inputs can be made.

(d) The process can then be repeated for all digital outputs and reading made.

Figure 26:
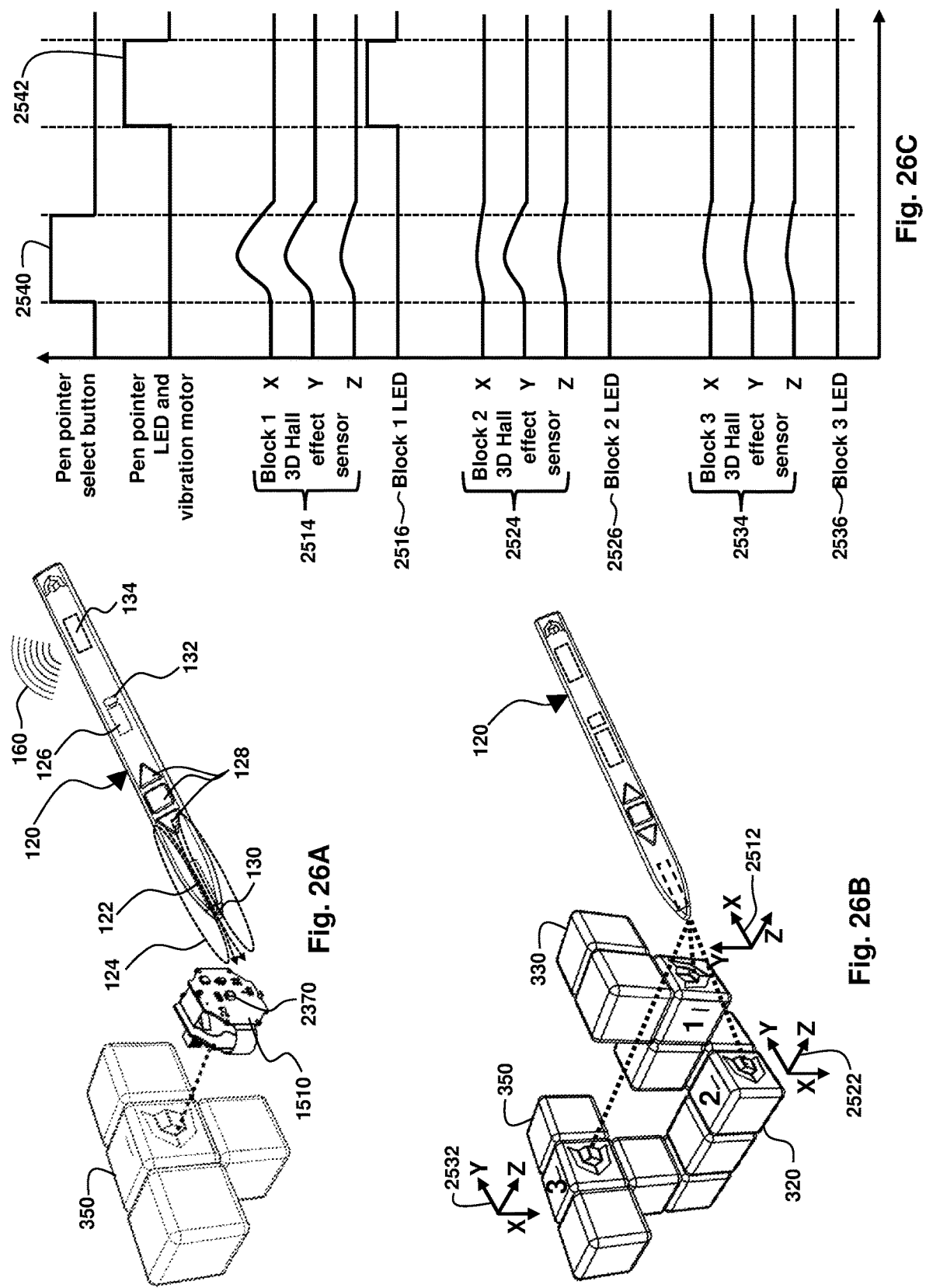
FIG. 26A, FIG. 26B, and FIG. 26C illustrate the operation of the selection pen.

FIG. 26A, FIG. 26B, and FIG. 26C show the interaction between the selection pen 120 and the electronics located in the hub cubes of the blocks, and more specifically with the hub cube electronic printed circuit board assembly 1510 that was shown in FIG. 15 and described in further detail in FIG. 24. The hub cube electronic printed circuit board assembly 1520 is normally located in the hub cube of a block, such as the T-block shown at 350 in FIG. 26A. As indicated in detail in FIG. 26A, the selection pen 120 can comprise a selection pen magnet 122 located inside the selection pen 120 near its tip, a selection pen inertial measurement unit (IMU) 126 located anywhere inside the selection pen 120, one or more selection pen modal buttons 128 located in a place that's easy for a user to access when holding the selection pen 120, a selection pen LED (light emitting diode) 130 located at the tip of the selection pen 120, one or more selection pen actuators 132, and a selection pen controller and wireless communication module 134. In one embodiment, a vibration motor can be used as a selection pen actuator 132 to provide haptic feedback to a user who is holding the selection pen 120. The selection pen magnet 122 can be a permanent magnet that produces a magnetic field 124 aligned with the selection pen. The inertial measurement unit 126 can comprise one or more accelerometers, a magnetometer, and/or one or more gyroscopes. The selection pen controller and wireless communication module 134 can produce a wireless communication signal 160 using any of the features and technologies discussed previously.

FIG. 26A shows that the selection pen magnet 122 generates a magnetic field that is measured by the three-dimensional Hall Effect sensor (or more generically, an analog magnetic field detector) 2370, previously shown in FIG. 24, that could be configured to detect the strength of the selection pen magnetic field 124 in three orthogonal axes. A three-dimensional Hall Effect sensor 2370 can be located in each block underneath the main hub logo. FIG. 26B shows three blocks: a first block that is an R-block 330, labeled with a number 1; a second block that is an L-block 320, labeled with a number 2; and a third block that is a T-block 350, labeled with a number 3. Each of these three blocks (330, 320, and 350) can have a three-dimensional Hall Effect sensor underneath its main hub logo. FIG. 26B also shows the orientation of the three orthogonal axes as XYZ coordinate systems (2512, 2522, and 2532) located proximate to each main logo. An example of the intensity of the selection pen magnetic field on the XYZ axes for three blocks is shown in the selection pen timing diagram presented in FIG. 26C at 2514 for the first block (R-block 330), at 2524 for the second block (L-block 320), and at 2534 for the third block (T-block 350). Once the selection pen 120 is proximate to a set of blocks with three-dimensional Hall Effect sensors, these signals shown in the selection pen timing diagram indicate the projection of the selection pen magnetic field 124 to the corresponding orthogonal axes (2512, 2522, or 2532) for the three-dimensional Hall Effect sensors in each block (330, 320, and 350). The strongest magnetic field will be picked up by the block that is closest to the end of the selection pen magnet 122. This strongest magnetic field would typically be in the Z-axis as that axis is perpendicular to the face of the hub block with closest three-dimensional Hall Effect sensor 2370.

Referring to FIG. 26B and FIG. 26C, the three-dimensional Hall Effect sensors in the hub blocks can be connected to hub block microcontrollers (2310 in FIG. 24) that have firmware that continuously monitors the field strength in three orthogonal axes as shown at 2514, 2525, and 2534. A user can then press one of the modal buttons 128, and this modal button could be configured to be a select button. The pressing of this select button could then generate a select button signal 2540, to be transmitted as a wireless communication signal 160 to one or more blocks (330, 320, and 350) where a hub block wireless communication module (2320 in FIG. 24) could receive this signal and relay the select button signal information to hub block microcontrollers (2310 in FIG. 24) in one or more blocks (330, 320, and 350). The hub block microcontrollers in the blocks can compare the relative magnetic field strength picked up by the three-dimensional Hall Effect sensors (as shown at 2514, 2524, and 2534) to determine which field on which axis is the strongest, and therefore activate a light emitting diode (2516) in the most proximate block, as shown at 2516, while the light emitting diodes (LEDs) 2526 and 2536 in the other blocks are not lit. Real time calculation can be made by calculating the three-dimensional vector amplitude and comparing it to a certain threshold to signal either a detection or not of a nearby selection pen. This confirmation of detection could also cause the selection pen light emitting diode (LED) 130 to light up, and/or cause a selection pen actuator 132 to provide a signal (e.g., haptic vibration), as shown at 2542.

The selection pen 120 can transmit and/or receive wireless messages to/from other wireless devices and/or the mobile computing device, shown at 140 in FIG. 1 (or the system computer shown at 150 in FIG. 1, or both the mobile computing device 140 and the system computer 150), based on any combination of its proximity to another wireless device, and/or the actuation of any one or combination of its modal buttons, and/or its movement. For example, the selection pen 120 could send a message directly to the mobile computing device 140 and the mobile computing device 140 could map the selection pen signal to the block which had three-dimensional Hall Effect sensor 2370 signal in response to the selection pen magnetic field 124 (i.e., the block closest to the tip of the selection pen 120). Messages transmitted from the selection pen 120 to the mobile computing device, 140 in FIG. 1, effect the interactions with a mobile computing device application, 2700 in FIG. 27. The selection pen 120 could be used as a stylus for a computing machine screen.

There can be at least four interaction functions for the selection pen 120:

1. Status uses the selection pen actuators 132 to acknowledge wireless message TX/RX and/or completion of wireless message task. A multicolor light emitting diode (LED) 130 is embedded in the tip of the selection pen 120. A vibration and/or auditory actuator 132 is embedded in the body of the selection pen 120. The colors emitted from the LED and/or the vibrations and/or auditory patterns emitted from the actuators can be mapped to wireless message RX/TX commands to acknowledge the start, transmission, and/or completion of wireless messages.
2. Trigger uses transmission of the magnetic field 124 from the selection pen magnet 122 embedded at the tip of the selection pen 120. The three-dimensional Hall Effect sensor 2370 in another device, such as the R-block shown at 330 in FIG. 26B, the L-block shown at 320 in FIG. 26B, and the T-block shown at 350 in FIG. 26A and FIG. 26B, can detect the proximity of the selection pen magnet 122 in the selection pen 120. These blocks (350, 320, and 330) can transmit wireless messages to the other parts of the system, such as the mobile computing device that was shown at 140 in FIG. 1 and/or the system computer shown at 150 in FIG. 1, the selection pen 120, and/or another wireless device to validate its selection state. Selecting another wireless device actuates the actuators in the selection pen 120 and/or the other selected wireless device.
3. Modality is actualized through multiple modal buttons placed on and within the body of the selection pen that are manipulated by the user. The buttons can be applied separately or in combination with other push buttons to send wireless messages. The push buttons status includes multiple modes including click, double click, and click and hold. The push button status updates are transmitted wirelessly to the software architecture application management modules, components, and services for processing and updating features and functions that affect information, data, and three-dimensional computer models in the front-end applications. The push-button affects include, but are not limited to, three-dimensional computer model transformations, scale changes, selection of one or more wireless block devices, selecting a complete wireless block assembly, and managing software application and/or wireless devices operational functions include, but are not limited to, reset, stop, start, record, playback, open, close, exit, etc.
4. Gesture data can be collected by the selection pen inertial measurement unit 126. This gesture data can be captured and transmitted when the selection pen modal buttons 128 initiate the capture of data the selection pen 120 is moved by the user. Data and information that captures the pitch, roll, and yaw dynamics of the gesture can be transmitted wirelessly to the software architecture device management services and mapped to functions that affect the three-dimensional computer model transformations and scale.

Figure 27:
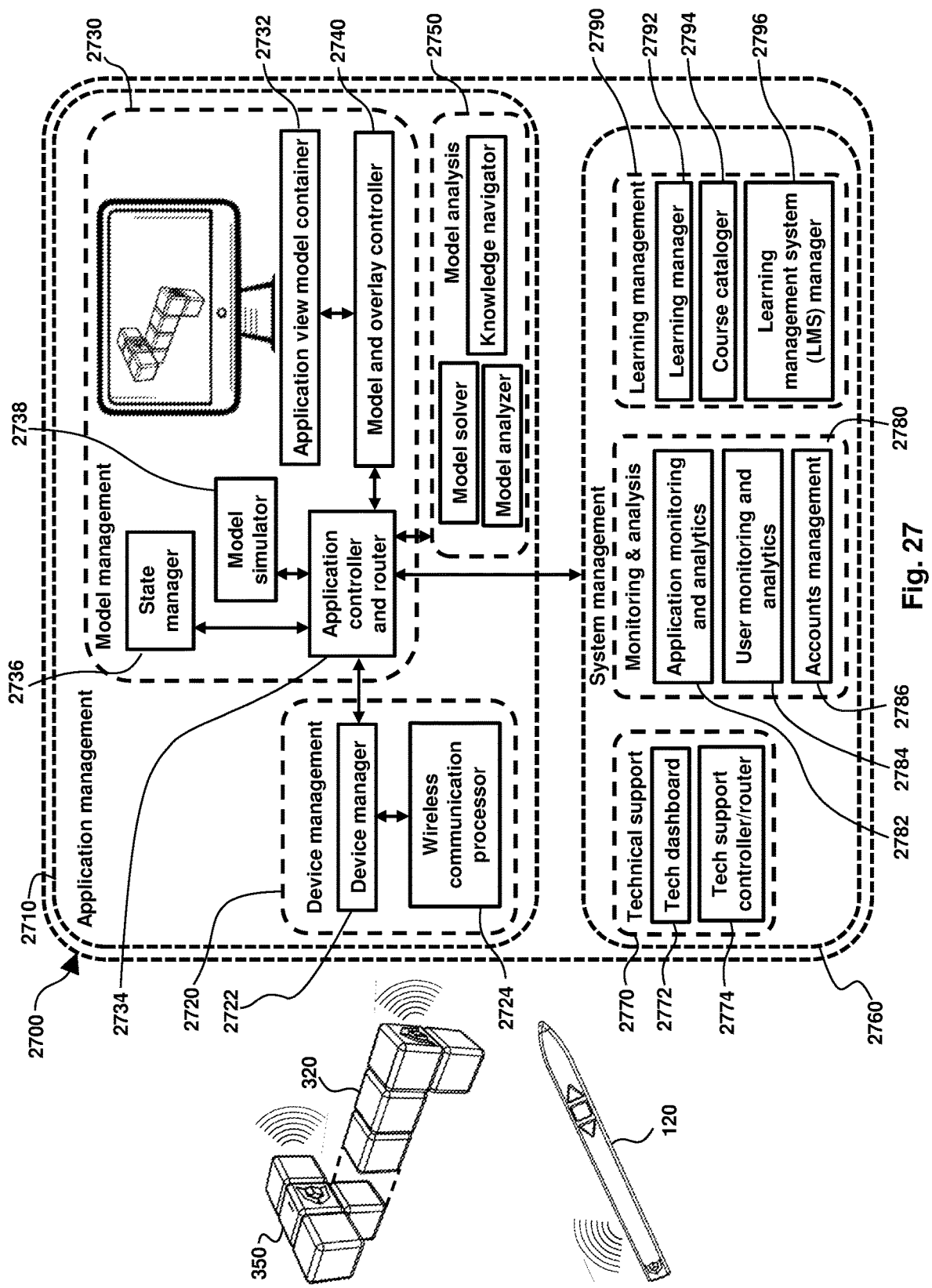
FIG. 27 details the system software for embodiments of the systems described herein.

The following list summarizes examples of some of the gestures that can be captured by the selection pen 120 through the use of the selection pen modal buttons 128 and selection pen inertial measurement unit 126:

(a) Zoom in one increment
(b) Zoom in continuously until button is released
(c) Zoom in at a logarithmic rate
(d) Zoom out one increment
(e) Zoom out continuously until button is released
(f) Zoom out at a logarithmic rate
(g) Log current movement of a block or set of blocks
(h) Monitor gestures made with selection pen in X, Y, and/or Z coordinates
(i) Select a specific block
(j) Select an assembly of blocks
(k) Reset FIG. 27 details the system software for embodiments of the systems described herein, and shows how this system software, shown at 2700, interacts wirelessly with external devices such as the firmware and electronics in one or more blocks, 350 and 320, and the firmware and electronics in a selection pen, 120. This software for application and system management 2700 typically operates in a system computer (150 in FIG. 1) and/or a mobile computing device (140 in FIG. 1). The system software 2700 can comprise an application management subsystem 2710 and a system management subsystem 2760. The application management subsystem 2710 can comprise a device management module 2720, a model management module 2730, and a model analysis module 2750. The system management subsystem 2760 can comprise a technical support module 2770, a monitoring and analysis module 2780, and a learning management module 2790.

Referring to the device management module 2720 in FIG. 27, this module interfaces with the firmware in the various blocks, such as the T-block 350 and the L-block 320, and the selection pen, shown at 120. FIG. 27 shows the combination of a T-block 350 and an L-block 320 in the same configuration as what was shown in FIG. 24A. The device management module 2720 can comprise a device manager service 2722 and a wireless communication service 2724. These services, 2722 and 2724, handle state management and communications between the wireless device hardware, that was shown in FIG. 24A, and application software components. Example of this wireless hardware include the wireless communication interface for the T-block shown at 350, for the L-block shown at 320, and for the selection pen shown at 120. The device manager service 2722 manages wireless device hardware operations through over-the-air wireless messages including by not limited hardware firmware updates, firmware authentication, and network management. The wireless communications processor service 2724 handles receiving, transmitting, and parsing of wireless messages that are received from and pushed to the wireless devices as required by the model management module 2730 and model analysis module 2750. These same functions were shown at a higher level at 240 in FIG. 2.

Referring to the model management module 2730 in FIG. 27, this module combines the information received from multiple external devices (blocks and selection pens) to compile and render a model of the system of blocks, the step that was also shown at 250 in FIG. 2. The model management module 2730 can comprise services that handle the application user interfaces including managing and routing application data and/or information to the appropriate ancillary backend and frontend services. The services in the model management module 2730 can include an application view model container service 2732, an application controller/router service 2734, a state manager service 2736, a model simulator service 2738, and model and overlay controller 2740 service. The application view model container service 2732 is the front-end of the application that is accessible to users and includes the user interface and user interaction components of the application. The application controller/router service 2734 generates and modifies the model that is rendered by the application. Additionally, the application controller/router service 2734 handles all the requests from the application including those created as part of the user interaction with front-end components and wireless devices. The state manager service 2736 manages the states of the wireless devices through in-memory cache and performs CRUD (create, read, update, delete) operations on the state of the wireless devices. The model controller/router service 2738 generates and modifies rendered models by handling all requests from user interactions with models in the frontend applications. The model simulator service 2738 handles and processes the wireless devices model simulation that are based on the wireless device messages data and information status updates. The model simulator service 2738 supports model transforms with and through viewpoint and camera operations that are pushed to the application view model container service 2732.

Models rendered from the configuration of wireless block devices are rendered as a collection of block features that comprise the wireless block device shape. A three-dimensional computer models of the wireless block devices is rendered when such requests are received by the model simulator service. The corresponding features are arranged accordingly in the three-dimensional computer models. Three-dimensional computer models of two or more connected wireless block shapes are rendered by aligning the three-dimensional computer models' block faces that correspond to the connected wireless block device faces in the orientation in which they are connected. The model and overlay controller service 2740 generates and modifies the application overlay on the model simulator and handles all front-end applications requests in the application view model container 2732.

Referring to the model analysis module 2750 in FIG. 27, (previously shown at 260 in FIG. 2), this module includes services that handle query requests about the wireless devices and simulated models. Services in the model analysis module 2750 include a model solver service 2752, model analyzer service 2754, and a knowledge navigator service 2756. The model solver service 2752 handles requests to solve queries about a model that is not already rendered and requires the generation of a new model as the response. For example, the generation of a new model as the result of various operations initiated by the user with the wireless devices and/or application. The model analyzer service 2754 handles front-end application requests for analysis of model features of a rendered model and responds with data and or information that is responsive to the request.

Three-dimensional computer models of connected wireless block devices are represented using mathematical graphs. The graph representation of the model can computationally represent any block assembly combination. The graph representation also deconstructs the model to all geometric and structural features of the model to respond to query, data, and information requests from the front-end applications. The knowledge navigator service 2756 handles various queries that are related to the context of the application. The context can include, but is not limited to, mathematical, scientific, engineering, structural, cultural, historical, and other contextual data, and information about the model. The knowledge navigator service 2756 is comprised with computational functions for querying, analyzing, calculating, and responding to front-end application requests. For example, for geometry related inquires the knowledge navigator service 2756 handles geometric transformations and calculates geometrical properties of three-dimensional computer models such as computing various type of distances, angles between lines, outer edge length, outer face areas, cube volumes, intersection with lines and planes, parallel edges and faces, and transformation between different spatial states of the model.

Referring to the technical management support module 2770 in FIG. 27, this module includes a tech dashboard service 2772 and a tech support controller/router service 2774 to monitor all system functions. The tech dashboard service 2772 provides system management tools for all components of the system architecture in the application management subsystem 2710 and system management subsystem 2760. The tech support controller/router service 2774 generates and modifies all components and data required for specific tech support queries, including but not limited to, 3D models, device messages, state-machine information, wireless network management. The tech support controller/router service 2774 handles all the requests from the support application from monitoring wireless device services to end-user support requests from front-end applications.

Referring to the monitoring and analysis module 2780 in FIG. 27, this module includes services that handle variety of operations in the main/support applications. The services in the monitoring and analysis module 2780 include an application monitoring and analytics service 2782, a user monitoring and analytics service 2784, and an accounts management service 2786. The application monitoring and analytics service 2782 provides tools for gathering all the software statistics across services to monitor and analyze the software/hardware performance, usability, and reliability. The data collected, processed, and analyzed through the application monitoring and analytics service 2782 can be further used to improve the quality of application and system management services. The user monitoring and analytics service 2784 provides tools for gathering all the user-related statistics to monitor and analyze the quality of user interaction with the application software and hardware. The data collected, processed, and analyzed through the user monitoring and analytics service 2784 can be further used to improve the user experience across all the software system components. The accounts management service 2786 manages the creation, modification, and deletion of the application profiles including the device profile, learner profile, advisor profiler, and support profile, and all the users.

Referring to the learning management module 2790 in FIG. 27, this module includes services that manage learning context data and information for application users. It was previously shown at 280 and 290 in FIG. 2. Services in the learning management module 2790 include a learning manager service 2792, a course cataloger service 2794, and a learning management system service 2796. The learning manager service 2792 manages the general learning/teaching experience, including management of course catalogs, management of learning paths, and student/advisor performance tracking. The course cataloger service 2794 handles, creation, storing, modification, and deletion of specific course materials. The learning management system (LMS) service 2796 provides an interface to integrate the application with selected learning management systems used by educational institutions, educators and students.

The following is a description of a typical data flow when a user is working with a block system of the type described herein, using the system shown in FIG. 27.

Step 1: The user logs on to the application and interacts with the wireless devices. User interactions with the wireless devices include, but are not limited to, picking up, rotating, selecting a wireless device block or assembly of blocks with a wireless device selection pen and assembling wireless device blocks by connecting one or more blocks to another one or more blocks.

Step 2: The device manager service 2722 is a prerequisite for the wireless communications processor service 2725 to handle the connection of the wireless devices to the computing device. It manages the RX/TX (receive/transmit) wireless message interval from the wireless devices. The RX/TX interval is set via the application controller/router service 2724.

Step 3: The wireless communication processor service 2724 receives the wireless messages for processing through automatic updates about the wireless device status. The wireless communication processor service 2724 can transmit wireless messages to the wireless devices for functions including status updates and device actuator responses.

Step 4: The wireless communication processor service 2724 pushes wireless device data and/or information to the application controller/router service 2734 to be processed. Examples of data and/or information processed by the application controller/router service 2734 include, but are not limited to, wireless device block connection state, sensor data, position data, battery level, temperature, and high vibration detection.

Step 5: The application controller/router service 2734 requests the state manager service 2736 to store the parsed device data in memory cache as needed.

Step 6: The application controller/router service 2734 requests model simulator service 2738 to render a model that simulates the wireless block devices given updated real-time data push from the wireless block devices including: how the block is manipulated by the user; how the block device is connected to another block device; how user uses the selection pen to select a block device; and how the user uses the selection pen to change the application view of the model.

Step 7: The application controller/router service 2734 requests the state manager service 2736 to store the latest wireless device status data in memory cache as needed.

Step 8: The application controller/router service 2734 pushes any relevant application and/or user interaction data to the user monitoring and analytics service 2784 or application monitoring and analytics service 2782 for application specific processing for user consumption.

Step 9: The application controller/router service 2734 pushes the latest wireless device status data to the model and overlay controller service 2740.

Step 10: The model and overlay controller service 2740 pushes the latest wireless device rendering information to the application view model container service 2732 to render the model simulation of the block device construction.

Step 11: The application view model container service 2732 updates the view for user interactions based on the latest model simulation as formed by the wireless device block status data and/or the wireless device selection pen data.

Figure 28:
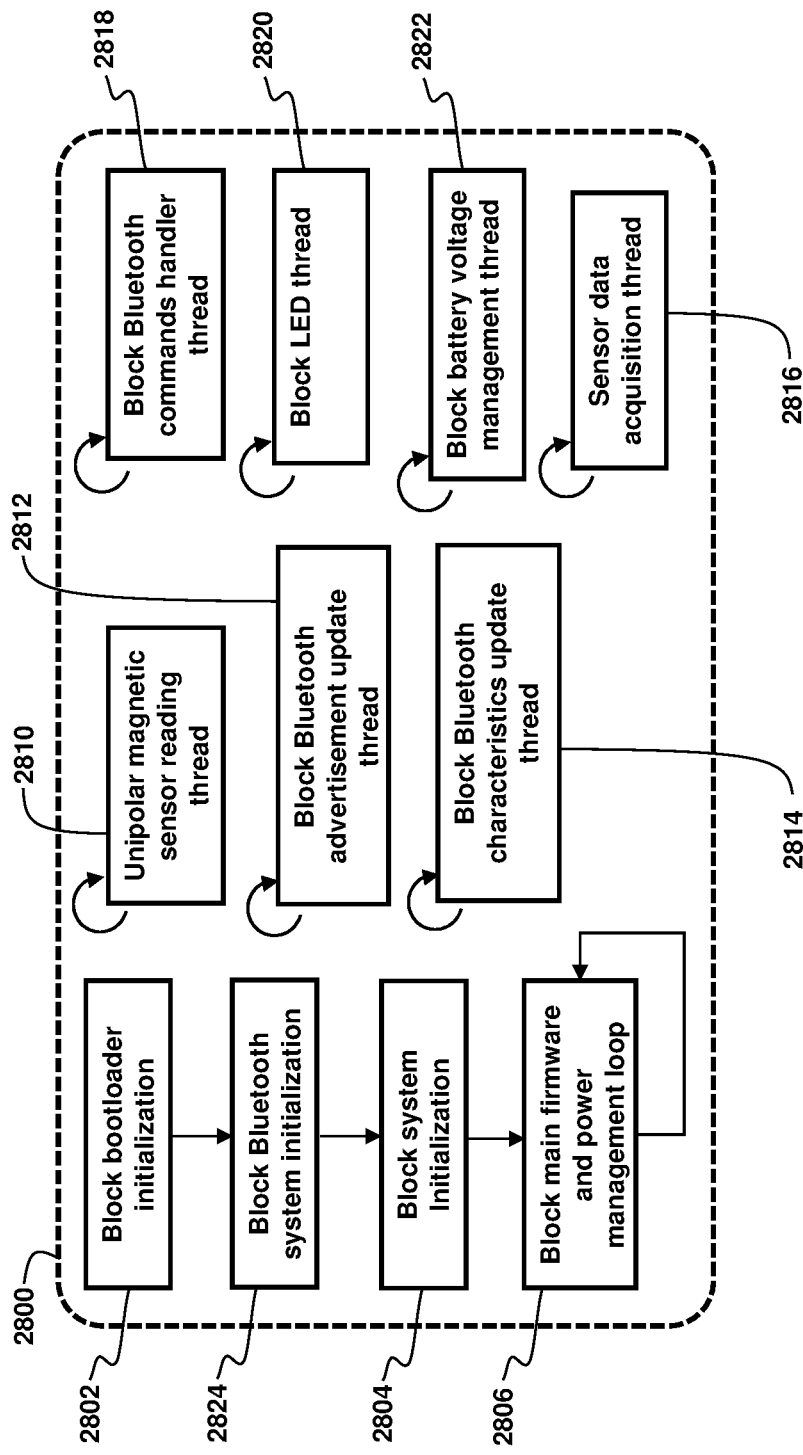
FIG. 28 details the firmware that operates the electronics in a block.

FIG. 28 provides more detail of the firmware 2800 that operates the electronics in a block, shown at 1500 in FIG. 24A. This firmware 2800 for a typical block (such as the T-block 350 and the L-block 320 shown in FIG. 27) operates in the microcontroller that was shown at 2310 in FIG. 24A. Referring to FIG. 28 and FIG. 24A, each block hub microcontroller 2310 is battery powered. Special consideration has been made for power management to enable a long operating lifetime. The block firmware 2800 offers two possible power management schemes:

1. During operation, the hub block microcontroller 2310 (in FIG. 24A) will be in a continuous sleep mode, but threads 2810, 2812, 2814, 2816, 2818, 2820, and 2822 will run intermittently. The hub block microcontroller 2310 will wake at regular intervals to run these threads and then return to sleep mode, a process that is managed by the block main firmware and power management loop 2806 in FIG. 28. Each thread (2810, 2812, 2814, 2816, 2818, 2820, and 2822) has its own interval and execution time. Between the execution of the threads, the hub block microcontroller 2310 goes into sleep mode with its embedded DC/DC (direct current to direct current) converter enabled. This results in a major reduction in electrical power consumption.

2. If a block (such as 310, 320, 330, 340, 350, 360, 370, 380, or 390 in FIG. 3) is fixed in space and not vibrating for a certain time, its hub block microcontroller 2310 will go into a total shutdown mode. This cuts off electrical power to all unipolar magnetic detectors (such as 1880A, 1880B, 1880E, 1880F, 1880G, and 1880H in FIG. 24A) as well as the any other sensors shown attached to the hub block microcontroller 2310. The only peripheral that continues to operate is a very low power accelerometer (2360 in FIG. 24A) that is pre-programmed in the firmware 2800 to detect the minor motion with a firmware settable threshold. Upon detection of such motion, the accelerometer 2360 will trigger an interrupt pin and fast boot the hub block microcontroller 2310, which will power up the related peripherals (2320, 2340, 2350, 2370) and the digital output pins in FIG. 24A).

Further referring to FIG. 28, block system initialization is shown at 2804. Upon the first boot or later after each fast boot, the device will perform the following initialization and driver configuration tasks:

(a) This will start by the initialization of the over-the-air device-firmware-upgrade (OTA DFU) and will check if there is a bootloader available and validate the installed version. This is shown at 2802 in FIG. 28.

(b) After that, the device will configure the digital inputs and outputs as per the circuit mapping and will specifically address the high impedance mode for the sensor's inputs, the push-pull digital outputs.

(c) An analog-to-digital-conversion (ADC) engine is configured to handle the battery voltage continuous measurement.

(d) A device log needed for troubleshooting and reporting will be then configured and imitated.

(e) At this point the multiple threads (2810, 2812, 2814, 2816, 2818, 2820, and 2822) will be initiated with dedicated frequency and priorities. For example, a periodic thread to check with the battery voltage 2822, a periodic thread to scan the sensors faces 2810, and threads to handle the Bluetooth communication, 2812 and 2818.

(f) In step 2824, the Bluetooth Low Energy (BLE) radio frequency engine and stack is configured. This includes configuring the Bluetooth Low Energy stack, the GAP (generic access profile) parameterization, the GATT (generic attribute profile) parameterization, initialization of Bluetooth custom services and related characteristics, advertisement initialization, peer management initialization, and connection parametrization. Also in step 2824, the Bluetooth transmission power is set to meet project requirements and Bluetooth low energy communication is enabled and started.

(g) In step 2804 (block system initialization), the I2C drivers (for synchronous communication using the I2C protocol) are initialized. Accordingly, instances of each sub driver are configured, such as the low power three-dimensional accelerometer (2360 in FIG. 24A), the six degree of freedom inertial measurement unit (2350 in FIG. 24A) and the three-dimensional Hall Effect sensor (2370 in FIG. 24A). Each of these sensor data acquisition threads, shown at 2816 is configured in accordance with application requirements, such as the required acceleration threshold for the motion to wake the device. In step 2804, application variables are also initialized at based on the boot values, the block LED thread 2820 is configured and the related kernels are initialized, the power management kernels 2806 are initialized according to the required mode of operation, and a first instance of the multi threads (2810, 2812, 2814, 2816, 2818, 2820, and 2822) are enabled and started in step 2804.

After block system initialization, the firmware enters the block main firmware and power management loop, shown at 2806, that has been described previously.

Going into further detail, the block firmware 2800 comprises as set of threads that manage various device functions. One of these is a unipolar magnetic sensor reading thread 2810 that reads the unipolar magnetic sensors shown at 1880 in FIG. 18, FIG. 19A, and FIG. 19B, and at 1880A, 1880B, 1880C, and 1880D in FIG. 20B, FIG. 20C, FIG. 20D, FIG. 21B, FIG. 21C, FIG. 22B, FIG. 22C, FIG. 23B, and FIG. 23C, and FIG. 24A, as well as 1880A, 1880B, 1880E, 1880F, 1880G, and 1880H in FIG. 24A. The unipolar magnetic sensor reading thread 2810 is triggered at a periodic high-speed scheme and execute the following tasks:

(a) Power Up Cube 1, Face 1 sensors (b) Put all remaining connected cubes faces into a low impedance mode inside the MCU (c) Read the sensors outputs (d) Store the results in the memory and push a copy into the Bluetooth Characteristics (e) Repeat again with Cube 1, Face 2 . . . repeat . . . to end with the last cube/last face.

The block firmware 2800 also comprises a Bluetooth advertisement update thread 2812. In case when there is no active Bluetooth connection between the server and the block, the Bluetooth advertisement thread is triggered at a periodic interval to execute the following tasks:

(a) Compute and format the advertisement packet.

(b) Update the advertisement packet.

Further referring to FIG. 28, the block firmware 2800 comprises a Bluetooth characteristics update thread 2814. If a Bluetooth connection with the server has previously been established, the Bluetooth characteristics update thread 2814 is triggered at a periodic interval to execute the following tasks:

(a) Compute and format the custom characteristics as per the provided Excel Sheet.

(b) Update the characteristics.

The block firmware 2800 also comprises a sensor data acquisition thread 2816 that acquires data from peripherals when the hub block microcontroller, 2310 in FIG. 24A, is awake. The sensor data acquisition thread 2816 is triggered at a periodic interval and executes the following tasks:

(a) Read the inertial measurement unit (2360 in FIG. 24A);

(b) Read 3d hall effect data (2370 in FIG. 24A);

(c) Put peripherals (2360 and 2370) to sleep again; and (d) Update related characteristics.

Further referring to FIG. 28, the block firmware 2800 comprises a battery voltage measurement thread 2822 that is triggered at a periodic interval to execute the following tasks:

(a) Configure the analog to digital conversion and assign the response into a non-blocking call back;

(b) Initiate the analog to digital conversion;

(c) Get the result in the call back thread;

(d) Update the related memory field and the Bluetooth characteristics variables; and (e) Check the current values with respect to the set limits and trigger the LED notification accordingly.

The block firmware 2800 also comprises an block LED thread 2820 that is triggered at a periodic interval to execute the following tasks:

(a) Check for an application indication scheme event trigger (b) Execute the pre-programmed red, green and blue individual or grouped pattern.

Further referring to FIG. 28, the block firmware 2800 comprises a block Bluetooth commands handler thread 2818. The block Bluetooth command handler 2818 will periodically check with possible received commands over Bluetooth. If the password is validated, the command is authorized and executed such as:

(a) System restart (b) System shutdown (c) LED (light emitting diode) activation in a specific pattern over time as commanded from the server FIG. 29 details the firmware 2900 that operates the electronics in a selection pen, such as the selection pen 120 whose function and magnetic signal interface with the three-dimensional Hall Effect sensors 2370 in one or more blocks was described in detail with reference to FIG. 26A, FIG. 26B, and FIG. 26C. This selection pen firmware 2900 is configured to run in the selection pen controller and wireless communication module, shown at 134 in FIG. 26A. The selection pen controller and wireless communication module, 134 in FIG. 26A, is battery powered and special power management consideration made to enable long lifetime. In a similar fashion to the block firmware, that was shown at 2800 in FIG. 28, the selection pen firmware 2900 in FIG. 29 offers to possible power management schemes:

1. During operation, the selection pen microcontroller and wireless communication module 134 (in FIG. 26A) will be in a continuous sleep mode, but threads 2912, 2914, 2916, 2918, 2920, 2922, and 2926 will run intermittently. The selection pen controller and wireless communication module 134 will wake at regular intervals to run these threads and then return to sleep mode, a process that is managed by the selection pen main firmware and power management loop 2906 in FIG. 29. Each thread (2912, 2914, 2916, 2918, 2920, 2922, and 2926) has its own interval and execution time. Between the execution of the threads, selection pen microcontroller and wireless communication module 134 goes into sleep mode with its embedded DC/DC (direct current to direct current) converter enabled. This results in a major reduction in electrical power consumption.
2. If the selection pen 120 is fixed in space and not vibrating for a certain time, the selection pen microcontroller and wireless communication module 134 will go into a total shutdown mode. This cuts off electrical power to everything in the selection pen 120 except a very low power accelerometer (not shown) that is pre-programmed in the firmware 2900 to detect the minor motion with a firmware settable threshold. Upon detection of such motion, this accelerometer will trigger an interrupt pin and fast boot the selection pen controller and wireless communication module 134, which will power up the inertial measurement unit 126 in FIG. 26A.

Figure 29:
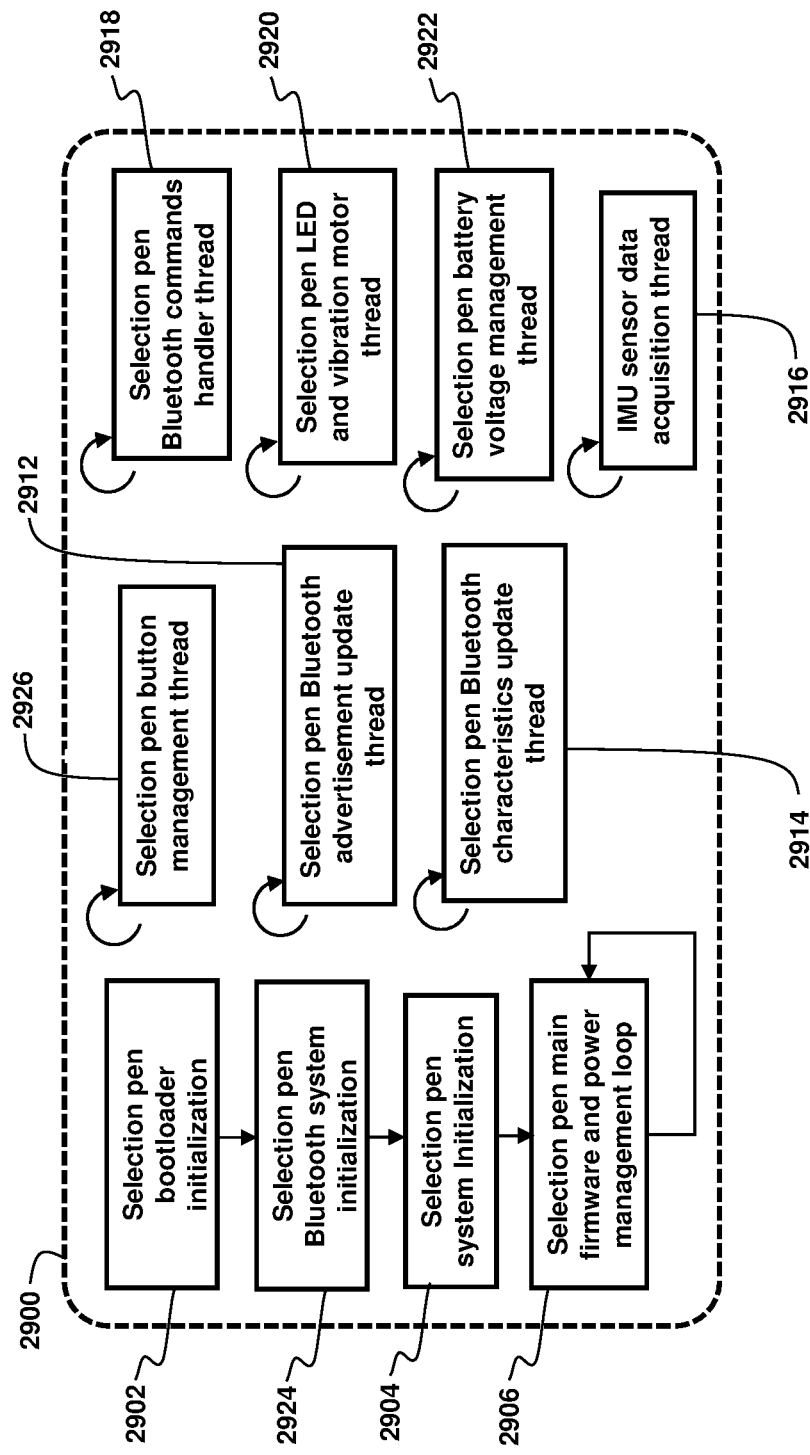
FIG. 29 details the firmware that operates the electronics in a selection pen.

Further referring to FIG. 29, block system initialization is shown at 2904. Upon the first boot or later after each fast boot, the device will perform the following initialization and driver configuration tasks:
 (a) This will start by the initialization of the over-the-air device-firmware-upgrade (OTA DFU) and will check if there is a bootloader available and validate the installed version. This is shown at 2902 in FIG. 29.
 (b) An analog-to-digital-conversion (ADC) engine is configured to handle the battery voltage continuous measurement.
 (c) A device log needed for troubleshooting and reporting will be then configured and imitated.
 (d) At this point the multiple threads (2912, 2914, 2916, 2918, 2920, 2922, and 2926) will be initiated with dedicated frequency and priorities. For example, a periodic thread to check with the battery voltage 2922 and threads to handle the Bluetooth communication, 2912 and 2918.
 (e) In step 2924, the Bluetooth Low Energy (BLE) radio frequency engine and stack is configured. This includes configuring the Bluetooth Low Energy stack, the GAP (generic access profile) parameterization, the GATT (generic attribute profile) parameterization, initialization of Bluetooth custom services and related characteristics, advertisement initialization, peer management initialization, and connection parametrization. Also in step 2924, the Bluetooth transmission power is set to meet project requirements and Bluetooth low energy communication is enabled and started.
 (f) In step 2904 (selection pen system initialization), the I2C drivers (for synchronous communication using the I2C protocol) are initialized. Accordingly, instances of each sub driver are configured, such as the low power three-dimensional accelerometer (not shown) and the six degree of freedom inertial measurement unit (126 in FIG. 26A). The IMU sensor data acquisition thread, shown at 2916, is configured in accordance with application requirements, such as the required acceleration threshold for the motion to wake the device. In step 2904, application variables are also initialized at based on the boot values, the selection pen LED and vibration motor thread 2920 is configured and the related kernels are initialized, the power management kernels 2906 are initialized according to the required mode of operation, and a first instance of the multi threads (2912, 2914, 2916, 2918, 2920, 2922, and 2926) are enabled and started in step 2906.

After block system initialization, the selection pen firmware 2900 enters the selection pen main firmware and block power management loop, shown at 2906, that has been described previously.

Going into further detail, the selection pen firmware 2900 comprises as set of threads that manage various device functions. One of these is a selection pen Bluetooth advertisement update thread 2912. In case when there is no active Bluetooth connection between the server and the block, the Bluetooth advertisement thread is triggered at a periodic interval to execute the following tasks:
 (a) Compute and format the advertisement packet.
 (b) Update the advertisement packet.

Further referring to FIG. 29, the selection pen firmware 2900 comprises a Bluetooth characteristics update thread 2914. If a Bluetooth connection with the server has previously been established, the Bluetooth characteristics update thread 2914 is triggered at a periodic interval to execute the following tasks:
 (a) Compute and format the custom characteristics as per the provided Excel Sheet.
 (b) Update the characteristics.

The selection pen firmware 2900 also comprises an IME (inertial measurement unit) data acquisition thread 2916 that acquires data from the six degree of freedom inertial measurement unit (126 in FIG. 26A) when the selection pen controller and wireless communication module, 134 in FIG. 26A, is awake. Sensor reading thread is triggered at a periodic interval and reads the inertial measurement unit (126 in FIG. 26A).

Further referring to FIG. 29, the selection pen firmware 2800 comprises a selection pen battery voltage measurement thread 2922 that is triggered at a periodic interval to execute the following tasks:
 (a) Configure the analog to digital conversion and assign the response into a non-blocking call back.
 (b) Initiate the analog to digital conversion
 (c) Get the result in the call back thread
 (d) Update the related memory field and the Bluetooth characteristics variables.
 (e) Check the current values with respect to the set limits and trigger the LED notification accordingly.

The selection pen firmware 2900 also comprises a selection pen LED and vibration motor thread 2920 that is triggered at a periodic interval to execute the following tasks:
(a) Check for an application indication scheme event trigger
(b) Execute the pre-programmed red, green and blue individual or grouped pattern.

Further referring to FIG. 29, the selection pen firmware 2900 comprises a selection pen Bluetooth commands handler thread 2918. The selection pen Bluetooth command handler 2918 will periodically check with possible received commands over Bluetooth. If the password is validated, the command is authorized and executed such as:
(a) System Restart
(b) System Shutdown
(c) LEDs (light emitting diode) activation in a specific pattern over time as commanded from the server The selection pen firmware 2900 also comprises a selection pen button management thread, 2926 that is triggered at a periodic interval to execute the following tasks:
(a) Check for buttons specific buttons press scheme event such as single press, double press, long press;
(b) Trigger related event in the application kernels; and
(c) Update related Bluetooth characteristics.

A number of variations and modifications of the disclosed embodiments can also be used. While the principles of the disclosure have been described above in connection with specific apparatuses and methods, it is to be clearly understood that this description is made only by way of example and not as limitation on the scope of the disclosure.

What is claimed is:

1. A three-dimensional magnetic block system wherein:
the three-dimensional magnetic block system comprises at least a first three-dimensional block configured for detachable attachment to a second three-dimensional block;
the first three-dimensional block comprises at least a first block first polyhedron wherein the first block first polyhedron is a convex regular polyhedron selected from the group of:
a tetrahedron;
a cube;
an octahedron;
a dodecahedron; and
an icosahedron;
the first block first polyhedron comprises at least a first block first face wherein the first block first face is a regular convex polygon selected from the group of an equilateral triangle, a square, and a regular pentagon;
the first block first face comprises:
at least a first block first face first magnet; and
a first quantity of first block first face magnetically-attractive non-magnetic elements wherein said first quantity is:
at least three if the first block first face is an equilateral triangle;
at least four if the first block first face is a square; and
at least five if the first block first face is a regular pentagon;
the second three-dimensional block comprises at least a second block first polyhedron wherein the second block first polyhedron is a same size and a same shape as the first block first polyhedron;
the second block first polyhedron comprises at least a second block first face wherein the second block first face is a same size and a same shape as the first block first face;
the second block first face comprises:
at least a second block first face first magnet; and
a second quantity of second block first face magnetically-attractive non-magnetic elements wherein said second quantity is:
at least three if the second block first face is an equilateral triangle;
at least four if the second block first face is a square; and
at least five if the second block first face is a regular pentagon;
the first block first face is configured for user attachment and alignment with the second block first face using:
a magnetic attractive force between the first block first face first magnet and one of the second block first face magnetically-attractive non-magnetic elements; and
a magnetic attractive force between the second block first face first magnet and one of the first block first face magnetically-attractive non-magnetic elements; and
an orientation of the first block first face to the second block first face is determined in response to a detection of at least two of the following:
a detection of the first block first face first magnet by a second block first face first magnetic detector;
a detection of a first block first face second magnet by a second block first face second magnetic detector;
a detection of the second block first face magnet by a first block first face first magnetic detector; and
a detection of a second block first face second magnet by a first block first face second magnetic detector.

2. The three-dimensional magnetic block system of claim 1 wherein:
the first block first polyhedron comprises a first cube;
the first block first face comprises a first block first square face;
the second block first face comprises a second cube; and
the second block first face comprises a second block first square face.

3. The three-dimensional magnetic block system of claim 2 wherein:
the first block first cube comprises exactly two magnets, exactly two magnetic detectors, and exactly four magnetically-attractive non-magnetic elements;
the second block first cube comprises exactly two magnets, exactly two magnetic detectors, and exactly four magnetically-attractive non-magnetic elements;
said magnets, magnetic detectors, and magnetically-attractive non-magnetic elements on the first block first square face and the second block first square face are positioned in an octagonal configuration.

4. The three-dimensional magnetic block system of claim 1 wherein:
the first block first face is configured to be detachably attached and aligned to the second block first face in a limited number of orientations;
the limited number of orientations for detachably attaching and aligning the first block first face to the second block first face is the same as the number of edges of the first block first face.

5. The three-dimensional magnetic block system of claim 1 wherein:

the first three-dimensional block comprises a plurality of polyhedra wherein:
  each polyhedron in the first three-dimensional block is a same shape and a same size as the first block first polyhedron; and
  each polyhedron in the first three-dimensional magnetic block is permanently attached to other polyhedra in the first three-dimensional block; and
the second three-dimensional block comprises a plurality of polyhedra wherein:
  each polyhedron in the second three-dimensional block is a same shape and a same size as the second block first polyhedron; and
  each polyhedron in the second three-dimensional magnetic block is permanently attached to other polyhedra in the second three-dimensional block.

6. The three-dimensional magnetic block system of claim 1 wherein:
the first block first face first magnet is configured to be permanently attached to the first block first face in one of two magnetic orientations;
the second block first face first magnetic detector comprises a unipolar magnetic detector configured to be responsive to the magnetic orientation of the first block first face first magnet;
the second block first face first magnet is configured to be permanently attached to the second block first face in one of two magnetic orientations;
the first block first face first magnetic detector comprises a unipolar magnetic detector configured to be responsive to the magnetic orientation of the second block first face first magnet.

7. The three-dimensional magnetic block system of claim 1 wherein:
the first block first face first magnetic detector sits internally behind one of the first block first face magnetically-attractive non-magnetic elements; and
the second block first face first magnetic detector sits internally behind one of the second block first face magnetically-attractive non-magnetic elements.

8. The three-dimensional magnetic block system of claim 1 wherein:
the first block further comprises a first block second face wherein the first block second face is a same size and a same shape as the first block first face;
the first block second face comprises:
  at least a first block second face first magnet; and
  a third quantity of first block second face magnetically-attractive non-magnetic elements wherein said third quantity is:
    at least three if the first block second face is an equilateral triangle;
    at least four if the first block second face is a square; and
    at least five if the first block second face is a regular pentagon;
the second block further comprises a second block second face wherein the second block second face is a same size and a same shape as the second block first face;
the second block second face comprises
  at least a second block second face first magnet; and
  a fourth quantity of second block second face magnetically-attractive non-magnetic elements wherein said fourth quantity is:
    at least three if the second block second face is an equilateral triangle;
    at least four if the second block second face is a square; and
    at least five if the second block second face is a regular pentagon;
the system is configured to detect:
  whether the first block first face or the first block second face is detachably attached to the second block;
  whether the second block first face or the second block second face is detachably attached to the first block; and
  an orientation of a detachably attached face of the first block to a detachably attached face of the second block.

9. The three-dimensional magnetic block system of claim 1 wherein:
the orientation of the first block first face to the second block first face is determined in response to:
  a detection of the second block first face first magnet by the first block first face first magnetic detector; and
  a detection of a second block first face second magnet by a first block first face second magnetic detector;
the first three-dimensional block further comprises a wireless communication module; and
the wireless communication module is configured for transmitting a face-to-face orientation signal comprising information responsive to the orientation of the first block first face to the second block first face.

10. The three-dimensional magnetic block system of claim 9 wherein:
the first three-dimensional block further comprises a block inertial measurement device;
the wireless communication module is further configured to communicate a block orientation signal in response to the block inertial measurement device;
the three-dimensional magnetic block system further comprises an external processor and an external display;
the external display is responsive to the external processor;
the external processor is configured to receive the face-to-face orientation signal and the block orientation signal; and
the external display is configured to present an image of the first three-dimensional block attached to the second three-dimensional block in response to the face-to-face orientation signal and the block orientation signal.

11. The three-dimensional magnetic block system of claim 10 wherein:
the three-dimensional magnetic block system further comprises a selection pen configured to be held by the hand of human user,
the selection pen comprises a selection pen magnet;
the first three-dimensional block comprises a first block analog magnetic field detector;
the second three-dimensional block comprises a second block analog magnetic field detector;
the system is configured to determine relative proximity of the selection pen magnet to:
  the first block analog magnetic field detector; and
  the second block analog magnetic field detector; and
the external display is responsive to said relative proximity of the selection pen magnet to the first block analog magnetic field detector and the second block analog magnetic field detector.

12. The three-dimensional magnetic block system of claim 1 wherein:

the magnetic detectors and magnetically attractive non-magnetic elements sit in pockets behind the first block first face and the second block first face.

13. The three-dimensional magnetic block system of claim 1 wherein:
three-dimensional magnetic block system is configured for use as an educational learning system.

14. A system comprising a plurality of detachably attached magnetic blocks, wherein:
each magnetic block comprises at least one convex regular polyhedron comprising regular polygonal faces;
all said convex regular polyhedra are a same size and a same shape;
all faces of all said convex regular polyhedra are a same size and a same shape, and have a same quantity of sides;
at least one face of a first magnetic block and at least one face of a second magnetic block each comprise:
a magnet; and
at least the same number of magnetically-attractive non-magnetic elements as said same quantity of sides;
the magnets and magnetically attractive non-magnetic elements on said at least one face of the first magnetic block and said at least one face of the second magnetic block are configured for user attachment to each other and alignment with each other using:
a magnetic attractive force between a magnet on the at least one face of the first magnetic block with one of the magnetically-attractive non-magnetic elements of the at least one face of the second magnetic block; and
a magnetic attractive force between the magnet on the at least one face of the second magnetic block with one of the magnetically-attractive non-magnetic elements of the at least one face of the first magnetic block; and
the orientation of the at least one face of the first block with the at least one face of the second block is determined in response to a detection of at least two of the following:
a detection of a first magnet on the at least one face of the first block by a first magnetic detector on the at least one face of the second block;
a detection of a second magnet on the at least one face of the first block by a second magnetic detector on the at least one face of the second block;
a detection of a first magnet on the at least one face of the second block by a first magnetic detector on the at least one face of the first block; and
a detection of a second magnet on the at least one face of the second block by a second magnetic detector on the at least one face of the first block.

15. The system of claim 14 wherein:
each block comprises cubes;
all faces of each cube in each block comprise same-sized squares comprising four sides;
at least one face of a first magnetic block and one face of a second magnetic block each comprise a magnet and four magnetically-attractive non-magnetic elements; and
the orientation of the at least one face of the first magnetic block with the at least one face of the second magnetic block is determined in response to:
a detection of a first magnet on the at least one face of the first magnetic block by a first magnetic detector on the at least one face of the second magnetic block; and
a detection of a second magnet on the at least one face of the first magnetic block by a second magnetic detector on the at least one face of the second magnetic block.

16. The system of claim 15 wherein:
said at least one face of the first magnetic block and said at least one face of the second magnetic block comprise a first magnet and a second magnet; and
the orientation of the at least one face of the first block with the at least one face of the second block is determined in response to:
a detection of a first magnet on the at least one face of the first block by a first magnetic detector on the at least one face of the second block; and
a detection of a second magnet on the at least one face of the first block by a second magnetic detector on the at least one face of the second block.

17. The system of claim 14 wherein:
the system further comprises system software;
the system software is configured to operate on a computing device that is external to the plurality of detachably attached magnetic blocks; and
the system software is configured to render an image of the plurality of detachably attached magnetic blocks on a computer display.

18. The system of claim 14 wherein:
the system further comprises a selection pen configured to be held by the hand of a human user;
the first magnetic block and the second magnetic block are configured to detect the selection pen.

19. A system of three-dimensional magnetic blocks, wherein:
the three-dimensional magnetic blocks comprise at least a first block and a second block;
the first block and the second block are the same size and same shape with faces comprising the same quantity of sides;
the first block comprises a first face;
the second block comprises a second face;
the first block is configured for detachable attachment to the second block using;
magnetic attraction of a first magnet on the first face to a magnetically-attractive non-magnetic element on the second face; and
magnetic attraction of a first magnet on the second face to a magnetically-attractive non-magnetic element on the first face; and
the system is configured for determining an orientation of the first face to the second face in response to at least two of the following:
a first magnetic detector on the second face that detects the first magnet on the first face;
a second magnetic detector on the second face that detects a second magnet on the first face;
a first magnetic detector on the first face that detects the first magnet on the second face; and
a second magnetic detector on the first face that detects a second magnet on the second face.

20. The system of claim 19, wherein:
the first block and the second block comprise regular convex polyhedra;
the first face and the second face comprise at least three magnetically-attractive non-magnetic elements;

said magnetic detectors are located internally, on the opposite side of said faces, and directly behind said magnetically attractive non-magnetic elements.

* * * * *